(12) United States Patent
Sakamoto et al.

(10) Patent No.: US 7,977,243 B2
(45) Date of Patent: Jul. 12, 2011

(54) BARRIER METAL FILM PRODUCTION APPARATUS, BARRIER METAL FILM PRODUCTION METHOD, METAL FILM PRODUCTION METHOD, AND METAL FILM PRODUCTION APPARATUS

(75) Inventors: Hitoshi Sakamoto, Yokohama (JP); Naoki Yahata, Takasago (JP); Ryuichi Matsuda, Takasago (JP); Yoshiyuki Ooba, Yokohama (JP); Toshihiko Nishimori, Takasago (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/693,589

(22) Filed: Jan. 26, 2010

(65) Prior Publication Data
US 2010/0124825 A1      May 20, 2010

Related U.S. Application Data

(62) Division of application No. 11/638,511, filed on Dec. 14, 2006, now abandoned, which is a division of application No. 10/277,733, filed on Oct. 23, 2002, now abandoned.

(30) Foreign Application Priority Data

| Nov. 14, 2001 | (JP) | 2001-348325 |
| Feb. 5, 2002 | (JP) | 2002-027738 |
| Feb. 21, 2002 | (JP) | 2002-044289 |
| Feb. 21, 2002 | (JP) | 2002-044296 |

(51) Int. Cl.
*H01L 21/311* (2006.01)

(52) U.S. Cl. .................................. 438/694; 216/75
(58) Field of Classification Search .................. 438/694, 438/680; 216/75; 427/248.1
See application file for complete search history.

(56) References Cited

U.S. PATENT DOCUMENTS

| 3,979,271 A | 9/1976 | Noreika et al. ............... 204/192 |
| 5,228,052 A | 7/1993 | Kikuchi et al. ................. 373/18 |

(Continued)

FOREIGN PATENT DOCUMENTS
EP            0477990           4/1992

(Continued)

OTHER PUBLICATIONS

Kim et al.,"Mechanical Properties and Oxidation Behavior of Ti—Si—N Films Prepared by Plasma-Assisted CVD," Chemical Vapor Deposition, vol. 5, No. 6, pp. 275-279 (1999).

(Continued)

*Primary Examiner* — Roberts Culbert
(74) *Attorney, Agent, or Firm* — Fitzpatrick, Cella, Harper & Scinto

(57) ABSTRACT

A $Cl_2$ gas plasma is generated at a site within a chamber between a substrate and a metal member. The metal member is etched with the $Cl_2$ gas plasma to form a precursor. A nitrogen gas is excited in a manner isolated from the chamber accommodating the substrate. A metal nitride is formed upon reaction between excited nitrogen and the precursor, and formed as a film on the substrate. After film formation of the metal nitride, a metal component of the precursor is formed as a film on the metal nitride on the substrate. In this manner, a barrier metal film with excellent burial properties and a very small thickness is produced at a high speed, with diffusion of metal being suppressed and adhesion to the metal being improved.

7 Claims, 43 Drawing Sheets

U.S. PATENT DOCUMENTS

| | | | |
|---|---|---|---|
| 5,522,343 A | 6/1996 | Kodama et al. | 118/723 MP |
| 5,614,070 A | 3/1997 | Moon | 204/298.07 |
| 5,685,942 A | 11/1997 | Ishii | 156/345 |
| 5,686,355 A | 11/1997 | Sumi et al. | 437/192 |
| 5,736,196 A | 4/1998 | Decker et al. | 427/341 |
| 5,753,320 A | 5/1998 | Mikoshiba et al. | 427/572 |
| 5,795,831 A | 8/1998 | Nakayama et al. | 438/714 |
| 5,855,745 A | 1/1999 | Manley | 204/192.17 |
| 5,972,179 A | 10/1999 | Chittipeddi et al. | 204/192.17 |
| 5,976,986 A | 11/1999 | Naeem et al. | 438/714 |
| 6,008,136 A | 12/1999 | Wada | 438/723 |
| 6,040,012 A | 3/2000 | Anderbouhr et al. | 427/255.391 |
| 6,045,666 A | 4/2000 | Satitpunwaycha et al. | 204/192.17 |
| 6,071,572 A | 6/2000 | Mosley et al. | 427/570 |
| 6,090,702 A | 7/2000 | Okamoto | 438/637 |
| 6,136,095 A | 10/2000 | Xu et al. | 118/719 |
| 6,153,519 A | 11/2000 | Jain et al. | 438/681 |
| 6,162,323 A | 12/2000 | Koshimizu | 156/345.26 |
| 6,162,715 A | 12/2000 | Mak et al. | 438/592 |
| 6,171,661 B1 | 1/2001 | Zheng et al. | 438/535 |
| 6,238,739 B1 | 5/2001 | Madar et al. | 427/255.39 |
| 6,265,311 B1 | 7/2001 | Hautala et al. | 438/680 |
| 6,271,121 B1 | 8/2001 | Webb | 438/627 |
| 6,271,136 B1 | 8/2001 | Shue et al. | 438/687 |
| 6,294,469 B1 | 9/2001 | Kulkarni et al. | 438/689 |
| 6,352,049 B1 | 3/2002 | Yin et al. | 118/723 |
| 6,410,432 B1 * | 6/2002 | Hautala et al. | 438/680 |
| 6,413,860 B1 * | 7/2002 | Hautala et al. | 438/680 |
| 6,440,494 B1 | 8/2002 | Arena-Foster | 427/250 |
| 6,455,414 B1 | 9/2002 | Hillman et al. | 438/628 |
| 6,472,318 B2 | 10/2002 | Ueno | 438/653 |
| 6,634,313 B2 | 10/2003 | Hanawa et al. | 118/723 IR |
| 6,641,698 B2 | 11/2003 | Kabansky | 156/345.35 |
| 6,749,717 B1 | 6/2004 | Sandhu et al. | 156/345.35 |
| 6,893,953 B2 | 5/2005 | Hoshino et al. | 438/618 |
| 2002/0009872 A1 | 1/2002 | Hoshino et al. | 438/618 |
| 2002/0106846 A1 | 8/2002 | Seutter et al. | 438/200 |
| 2003/0199152 A1 | 10/2003 | Derraa | 438/471 |

FOREIGN PATENT DOCUMENTS

| | | |
|---|---|---|
| EP | 0482265 | 4/1992 |
| EP | 0573348 | 12/1993 |
| EP | 0 658 926 A1 | 6/1995 |
| EP | 0818559 | 1/1998 |
| EP | 0837155 | 4/1998 |
| EP | 0861921 | 9/1998 |
| EP | 1120474 | 8/2001 |
| EP | 1199378 | 4/2002 |
| EP | 1313127 | 5/2003 |
| EP | 1338674 | 8/2003 |
| EP | 1344842 | 9/2003 |
| FR | 2784694 A1 | 4/2000 |
| GB | 2111534 | 7/1983 |
| JP | 7-142389 | 6/1995 |
| JP | 7-193025 | 7/1995 |
| JP | 8-124876 | 5/1996 |
| JP | 9-232313 | 9/1997 |
| JP | 10-209073 | 8/1998 |
| JP | 10-209280 | 8/1998 |
| JP | 2000-195948 | 7/2000 |
| JP | 2001-41802 | 2/2001 |
| JP | 2001-53077 | 2/2001 |
| JP | 2001-118804 | 4/2001 |
| JP | 2001-284285 | 10/2001 |
| JP | 2001-298028 | 10/2001 |

OTHER PUBLICATIONS

Reidel et al.,"MicroElectric Engineering", vol. 5, No. 1-4, pp. 213-218 (2001).

Shew et al.,"Thin Solid Films", vol. 293, No. 1-2, pp. 212-219 (1997).

Widmann et al., "Technologies Hochintegrierter Schaltungen", pp. 181-222 (1996).

Yamada et al., Journal of the Electrochemical Society, vol. 138, No. 2, pp. 496-499 (1991).

Yanagisawa et al., "Damage-free Flattening Technology of Large Diameter Si Wafer Employing Numerically controlled Local SF6/H2 Downstream Plasma", Microprocesses and Nanotechnology conference, 2000 International, pp. 274-275 (Jul. 11-13, 2000).

* cited by examiner

F I G. 31
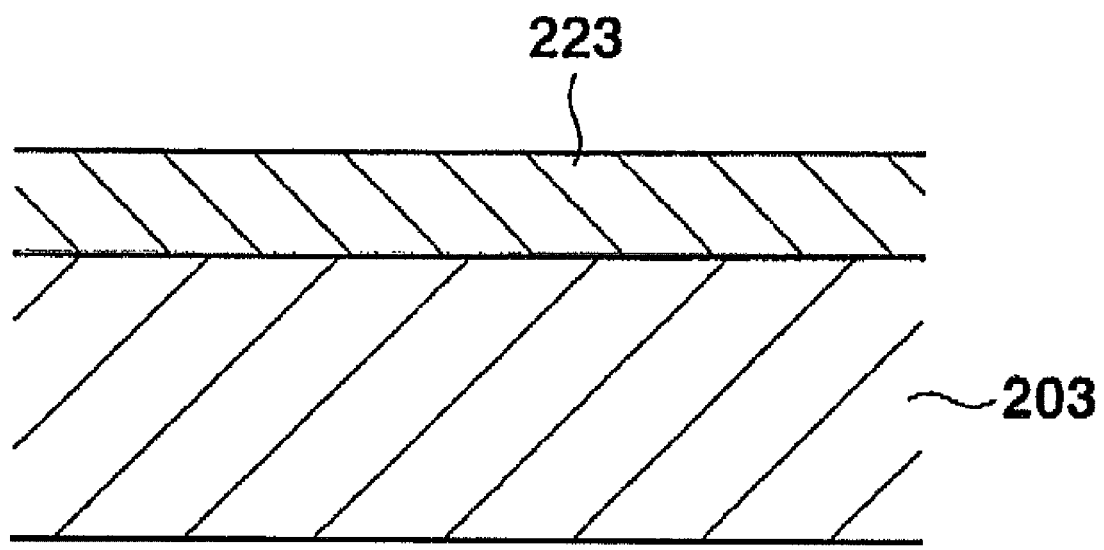

BARRIER METAL FILM PRODUCTION APPARATUS, BARRIER METAL FILM PRODUCTION METHOD, METAL FILM PRODUCTION METHOD, AND METAL FILM PRODUCTION APPARATUS

This application is a Divisional application of co-pending U.S. application Ser. No. 11/638,511, filed Dec. 14, 2006, which is a Divisional application of U.S. application Ser. No. 10/277,733, filed Oct. 23, 2002, which is now abandoned, and for which priority is claimed under 35 U.S.C. §120; and this application claims priority of Japanese Patent Application Nos. 2001-348325, 2002-27738, 2002-44289, and 2002-44296, filed on Nov. 14, 2001, Feb. 5, 2002, Feb. 21, 2002 and Feb. 21, 2002, respectively, under 35 U.S.C. §119. The contents of all of the aforementioned applications are hereby incorporated by reference herein in their entireties.

BACKGROUND OF THE INVENTION

1. Field of the Invention

This invention relates to a production apparatus and a production method for a barrier metal film to be formed on the surface of a substrate for eliminating the diffusion of a metal into the substrate and retaining the adhesion of the metal, when a metal film is formed on the surface of the substrate.

The present invention also relates to a metal film production method and a metal film production apparatus which can form a film of a metal, with the diffusion of the metal being eliminated and the adhesion of the metal being retained, by treating the surface of a barrier metal film produced on a substrate.

2. Description of Related Art

Semiconductors with electrical wiring have increasingly used copper as a material for the wiring in order to increase the speed of switching, decrease transmission loss, and achieve a high density. In applying the copper wiring, it has been common practice to perform the vapor phase growth method or plating on a substrate having a depression for wiring on its surface, thereby forming a copper film on the surface including the depression.

In forming the copper film on the surface of the substrate, a barrier metal film (for example, a nitride of tantalum, tungsten, titanium or silicon) is prepared beforehand on the surface of the substrate in order to eliminate the diffusion of copper into the substrate, and retain the adhesion of copper. When plating is employed, a copper shielding layer is formed on the barrier metal film by physical or chemical vapor deposition, and used also as an electrode. The barrier metal film has been formed by physical vapor deposition such as sputtering.

The depression for wiring, formed on the surface of the substrate, tends to be decreased in size, and a demand is expressed for a further reduction in the thickness of the barrier metal film. However, the barrier metal film has been produced by use of sputtering, and its directionality is not uniform. With a tiny depression on the surface of the substrate, therefore, the film is formed at the entrance of the depression before being formed in the interior of the depression, resulting in insufficient burial of the depression. Also, the substrate has been badly damaged.

Additionally, the barrier metal film is prepared for the purposes of preventing the diffusion of copper into the substrate and retaining the adhesion of copper. Hence, a nitride of tantalum, tungsten or titanium is formed as a first layer for prevention of copper diffusion, and an active metal, such as tantalum, tungsten or titanium, is formed as a second layer for retention of adhesion to copper. However, the barrier metal film is so thin that it poses difficulty at the present time in performing both functions, the prevention of copper diffusion into the substrate and the retention of copper adhesion. A demand is growing for the advent of a barrier metal film which accomplishes these two functions.

In particular, the wiring depression formed on the surface of the substrate is showing a tendency toward compactness, and further thinning of the barrier metal film is demanded. However, the necessary minimum film thickness has increased, if the barrier metal film is constructed in a two-layer structure by forming a nitride of tantalum, tungsten or titanium as a first layer for prevention of copper diffusion, and forming an active metal, such as tantalum, tungsten or titanium, as a second layer for retention of adhesion to copper.

SUMMARY OF THE INVENTION

The present invention has been accomplished in light of the circumstances described above. An object of the invention is to provide a barrier metal film production apparatus and a barrier metal film production method which can form a barrier metal film with excellent burial properties and a very small thickness at a high speed. Another object of the invention is to provide a barrier metal film production apparatus and a barrier metal film production method which can form a barrier metal film with excellent adhesion to a metal formed as a film on the surface of the substrate. Still another object of the invention is to provide a metal film production method and a metal film production apparatus capable of forming a barrier metal film which, although very thin, prevents diffusion of a metal and retains adhesion to the metal.

According to the present invention, there is provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

plasma generation means which converts an atmosphere within the chamber into a plasma to generate a source gas plasma so that the etched member is etched with the source gas plasma to form a precursor from a metal component contained in the etched member and the source gas;

excitation means for exciting a nitrogen-containing gas in a manner isolated from the chamber;

formation means for forming a metal nitride upon reaction between nitrogen excited by the excitation means and the precursor; and control means which makes a temperature of the substrate lower than a temperature of the formation means to form the metal nitride as a film on the substrate.

Thus, a barrier metal film comprising a film of a metal nitride and suppressing diffusion can be prepared by forming a metal with the use of a plasma. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

plasma generation means which converts an atmosphere within the chamber into a plasma to generate a source gas plasma so that the etched member is etched with the source gas plasma to form a precursor from a metal component contained in the etched member and the source gas;

excitation means for exciting a nitrogen-containing gas in a manner isolated from the chamber;

formation means for forming a metal nitride upon reaction between nitrogen excited by the excitation means and the precursor; and control means which makes a temperature of the substrate lower than a temperature of the formation means to form the metal nitride as a film on the substrate, and after film formation of the metal nitride, stops supply of the nitrogen-containing gas, and makes the temperature of the substrate lower than a temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

nitrogen-containing gas supply means for supplying a nitrogen-containing gas to an interior of the chamber between the substrate and the etched member;

plasma generation means which converts an atmosphere within the chamber into a plasma to generate a source gas plasma and a nitrogen-containing gas plasma so that the etched member is etched with the source gas plasma to form a precursor from a metal component contained in the etched member and the source gas, and that a metal nitride is formed upon reaction between nitrogen and the precursor; and control means which makes a temperature of the substrate lower than a temperature of the etched member to form the metal nitride as a film on the substrate.

Thus, a barrier metal film comprising a film of a metal nitride and a metal film and with diffusion suppressed can be prepared by forming a metal by plasmas. The barrier metal film can be formed uniformly to a small thickness. Also, the supply lines for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen to an interior of the chamber between the substrate and the etched member;

nitrogen-containing gas supply means for supplying a nitrogen-containing gas to an interior of the chamber between the substrate and the etched member;

plasma generation means which converts an atmosphere within the chamber into a plasma to generate a source gas plasma and a nitrogen-containing gas plasma so that the etched member is etched with the source gas plasma to form a precursor from a metal component contained in the etched member and the source gas, and that a metal nitride is formed upon reaction between nitrogen and the precursor; and control means which makes a temperature of the substrate lower than a temperature of the etched member to form the metal nitride as a film on the substrate, then stops supply of the nitrogen-containing gas, and makes the temperature of the substrate lower than the temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Also, the supply lines for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas;

exciting a nitrogen-containing gas in a manner isolated from the chamber accommodating the substrate;

forming a metal nitride upon reaction between excited nitrogen and the precursor; and making a temperature of the substrate lower than a temperature of means for formation of the metal nitride to form the metal nitride as a film on the substrate.

Thus, a barrier metal film comprising a film of a metal nitride and suppressing diffusion can be prepared by forming a metal by plasma. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas;

exciting a nitrogen-containing gas in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate; and after film formation of the metal nitride, stopping supply of the nitrogen-containing gas, and making the temperature of the substrate lower than a temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Consequently, the barrier metal film can be formed highly accurately at a high speed with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma and a nitrogen-containing gas plasma so that the etched member is etched with the source gas plasma to form a precursor from a metal component contained in the etched member and the source gas, and that a metal nitride is formed upon reaction between nitrogen and the precursor; and making a temperature of the substrate lower than a temperature of the etched member to form the metal nitride as a film on the substrate.

Thus, a barrier metal film comprising a film of a metal nitride and with diffusion suppressed can be prepared by forming a metal by plasmas. The barrier metal film can be formed uniformly to a small thickness. Also, the supply line for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma and a nitrogen-containing gas plasma so that the etched member is etched with the source gas plasma to form a precursor from a metal component contained in the etched member and the source gas, and that a metal nitride is formed upon reaction between nitrogen and the precursor;

making a temperature of the substrate lower than a temperature of the etched member to form the metal nitride as a film on the substrate; and after film formation of the metal nitride, stopping supply of the nitrogen-containing gas, and making the temperature of the substrate lower than the temperature of the etched member to form the metal component of the precursor as a film on the metal nitride on the substrate.

Thus, a barrier metal film comprising a film of a metal nitride and a metal film and with diffusion suppressed and adhesion improved can be prepared by forming a metal by plasmas. The barrier metal film can be formed uniformly to a small thickness. Also, the supply line for gases can be simplified, and the number of plasma sources can be decreased, so that the product cost can be reduced. Consequently, the barrier metal film can be formed highly accurately at a high speed and at a low cost with excellent burial properties in a very small thickness even to the interior of a tiny depression, for example several hundred nanometers wide, which has been provided in the substrate.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen into the chamber;

nitrogen-containing gas supply means for supplying a gas containing nitrogen into the chamber;

plasma generation means which converts an atmosphere within the chamber into a plasma to generate a source gas plasma so that the etched member is etched with the source gas plasma to form a precursor from a metal component contained in the etched member and the source gas, and which converts the atmosphere within the chamber into a plasma to generate a nitrogen-containing gas plasma so that a metal nitride is formed upon reaction between nitrogen and the precursor;

control means which makes a temperature of the substrate lower than a temperature of the plasma generation means to form the metal nitride as a barrier metal film on a surface of the substrate;

diluent gas supply means for supplying a diluent gas to a site above the surface of the substrate; and surface treatment plasma generation means for performing a surface treatment which converts the atmosphere within the chamber into a plasma to generate a diluent gas plasma so that nitrogen atoms in a superficial layer of the barrier metal film are removed by the diluent gas plasma to decrease a nitrogen content of the superficial layer relative to an interior of a matrix of the barrier metal film.

Thus, a barrier metal film comprising a metal nitride layer and a metal layer can be prepared without the increase of the film thickness. Consequently, a barrier metal film production apparatus can be achieved which is capable of forming a barrier metal film at a high speed with excellent burial properties in a very small thickness, and also forming a barrier metal film with excellent adhesion to a metal formed as a film on the surface of the barrier metal film.

The barrier metal film production apparatus may further comprise oxygen gas supply means for supplying an oxygen gas into the chamber immediately before formation of the most superficial layer of the barrier metal film is completed; and oxygen plasma generation means which converts the atmosphere within the chamber into a plasma to generate an oxygen gas plasma so that an oxide layer is formed on the most superficial layer of the barrier metal film.

Thus, because of an oxide layer, if a metal is deposited on the surface of the barrier metal film, wettability by the metal can be rendered satisfactory, thus increasing adhesion.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen into the chamber;

nitrogen-containing gas supply means for supplying a gas containing nitrogen into the chamber;

plasma generation means which converts an atmosphere within the chamber into a plasma to generate a source gas plasma so that the etched member is etched with the source gas plasma to form a precursor from a metal component contained in the etched member and the source gas, and which converts the atmosphere within the chamber into a plasma to generate a nitrogen-containing gas plasma so that a metal nitride is formed upon reaction between nitrogen and the precursor;

control means which makes a temperature of the substrate lower than a temperature of the plasma generation means to form the metal nitride as a barrier metal film on a surface of the substrate;

oxygen gas supply means for supplying an oxygen gas to a site above the surface of the substrate; and oxygen plasma generation means for performing a surface treatment which converts the atmosphere within the chamber into a plasma to generate an oxygen gas plasma so that nitrogen atoms in a superficial layer of the barrier metal film are removed by the oxygen gas plasma to decrease a nitrogen content of the superficial layer relative to an interior of a matrix of the barrier metal film, and at the same time, forming an oxide layer on the most superficial layer of the barrier metal film.

Thus, a barrier metal film comprising a metal nitride layer and a metal layer can be prepared with a minimum nozzle construction without the increase of the film thickness, and an oxide layer gives satisfactory wettability by a metal deposited on the surface of the barrier metal film. Consequently, a barrier metal film production apparatus can be achieved which is capable of forming a barrier metal film at a high speed with excellent burial properties in a very small thickness, and also forming a barrier metal film with excellent adhesion to a metal formed as a film on the surface of the barrier metal film.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen into the chamber;

nitrogen-containing gas supply means for supplying a gas containing nitrogen into the chamber;

plasma generation means which converts an atmosphere within the chamber into a plasma to generate a source gas plasma so that the etched member is etched with the source gas plasma to form a precursor from a metal component contained in the etched member and the source gas, and which converts the atmosphere within the chamber into a plasma to generate a nitrogen-containing gas plasma so that a metal nitride is formed upon reaction between nitrogen and the precursor;

control means which makes a temperature of the substrate lower than a temperature of the plasma generation means to form the metal nitride as a film, for use as a barrier metal film, on a surface of the substrate;

oxygen gas supply means for supplying an oxygen gas into the chamber immediately before formation of the most superficial layer of the barrier metal film is completed; and oxygen plasma generation means which converts the atmosphere within the chamber into a plasma to generate an oxygen gas plasma so that an oxide layer is formed on the most superficial layer of the barrier metal film.

Thus, a barrier metal film comprising a metal nitride layer can be prepared without the increase of the film thickness, and an oxide layer gives satisfactory wettability by a metal deposited on the surface of the barrier metal film. Consequently, a barrier metal film production apparatus can be achieved which is capable of forming a barrier metal film at a high speed with excellent burial properties in a very small thickness, and also forming a barrier metal film with excellent adhesion to a metal formed as a film on the surface of the barrier metal film.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen into the chamber;

nitrogen-containing gas supply means for supplying a gas containing nitrogen into the chamber;

plasma generation means which converts an atmosphere within the chamber into a plasma to generate a source gas plasma so that the etched member is etched with the source gas plasma to form a precursor from a metal component contained in the etched member and the source gas, and which converts the atmosphere within the chamber into a plasma to generate a nitrogen-containing gas plasma so that a metal nitride is formed upon reaction between nitrogen and the precursor;

control means which makes a temperature of the substrate lower than a temperature of the plasma generation means to form the metal nitride as a film on a surface of the substrate, then makes the temperature of the substrate lower than the temperature of the plasma generation means and stops supply of the gas containing nitrogen from the nitrogen-containing gas supply means, thereby forming the metal component of the precursor as a film on the metal nitride for use as a barrier metal film;

oxygen gas supply means for supplying an oxygen gas into the chamber immediately before formation of the most superficial layer of the barrier metal film is completed; and oxygen plasma generation means which converts the atmosphere within the chamber into a plasma to generate an oxygen gas plasma so that an oxide layer is formed on the most superficial layer of the barrier metal film.

Thus, a barrier metal film comprising a metal nitride layer and a metal layer can be prepared without the increase of the film thickness, and an oxide layer gives satisfactory wettability by a metal deposited on the surface of the barrier metal film. Consequently, a barrier metal film production apparatus can be achieved which is capable of forming a barrier metal film at a high speed with excellent burial properties, and also forming a barrier metal film with excellent adhesion to a metal formed as a film on the surface of the barrier metal film.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen into the chamber;

plasma generation means which converts an atmosphere within the chamber into a plasma to generate a source gas plasma so that the etched member is etched with the source gas plasma to form a precursor from a metal component contained in the etched member and the source gas;

excitation means for exciting a gas containing nitrogen in a manner isolated from the chamber;

formation means for forming a metal nitride upon reaction between nitrogen excited by the excitation means and the precursor;

control means which makes a temperature of the substrate lower than a temperature of the formation means to form the metal nitride as a film on the substrate for use as a barrier metal film;

oxygen gas supply means for supplying an oxygen gas into the chamber immediately before formation of the most superficial layer of the barrier metal film is completed; and oxygen plasma generation means which converts, the atmosphere within the chamber into a plasma to generate an oxygen gas plasma so that an oxide layer is formed on the most superficial layer of the barrier metal film.

Thus, a barrier metal film comprising a metal nitride layer can be prepared without the increase of the film thickness, an oxide layer gives satisfactory wettability by a metal deposited on the surface of the barrier metal film, and the substrate can be free from exposure to a nitrogen-containing gas plasma. Consequently, a barrier metal film production apparatus can be achieved which is capable of forming a barrier metal film at a high speed with excellent burial properties in a very small thickness without exerting the influence of the nitrogen-containing gas plasma upon the substrate, and also forming a barrier metal film with excellent adhesion to a metal formed as a film on the surface of the barrier metal film.

According to the present invention, there is also provided a barrier metal film production apparatus, comprising:

a chamber accommodating a substrate;

a metallic etched member provided in the chamber at a position opposed to the substrate;

source gas supply means for supplying a source gas containing a halogen into the chamber;

plasma generation means which converts an atmosphere within the chamber into a plasma to generate a source gas plasma so that the etched member is etched with the source gas plasma to form a precursor from a metal component contained in the etched member and the source gas;

excitation means for exciting a gas containing nitrogen in a manner isolated from the chamber;

formation means for forming a metal nitride upon reaction between nitrogen excited by the excitation means and the precursor;

control means which makes a temperature of the substrate lower than a temperature of the formation means to form the metal nitride as a film on the substrate, and after film formation of the metal nitride, stops supply of the nitrogen-containing gas and makes the temperature of the substrate lower than a temperature of the etched member, thereby forming the metal component of the precursor as a film on the metal nitride on the substrate for use as a barrier metal film;

oxygen gas supply means for supplying an oxygen gas into the chamber immediately before formation of the most superficial layer of the barrier metal film is completed; and oxygen plasma generation means which converts the atmosphere within the chamber into a plasma to generate an oxygen gas plasma so that an oxide layer is formed on the most superficial layer of the barrier metal film.

Thus, a barrier metal film comprising a metal nitride layer can be prepared without the increase of the film thickness, an oxide layer gives satisfactory wettability by a metal deposited on the surface of the barrier metal film, and the substrate can be free from exposure to a nitrogen-containing gas plasma.

Consequently, a barrier metal film production apparatus can be achieved which is capable of forming a barrier metal film at a high speed with excellent burial properties without exerting the influence of the nitrogen-containing gas plasma upon the substrate, and also forming a barrier metal film with excellent adhesion to a metal formed as a film on the surface of the barrier metal film.

The barrier metal film production apparatus may further comprise hydrogen gas supply means for supplying a hydrogen gas into the chamber; and hydroxyl group plasma generation means which converts the atmosphere within the chamber into a plasma to generate a hydrogen gas plasma so that hydroxyl groups are formed on the oxide layer.

Thus, hydroxyl groups are formed, so that hydrophilicity can be increased, and adhesion of a metal deposited on the surface can be further increased.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also converting the atmosphere within the chamber into a plasma to generate a nitrogen-containing gas plasma so that a metal nitride is formed upon reaction between nitrogen and the precursor;

making a temperature of the substrate lower than a temperature of plasma generation means to form the metal nitride as a barrier metal film on a surface of the substrate;

supplying a diluent gas to a site within the chamber above the surface of the substrate; and performing a surface treatment which converts the atmosphere within the chamber into a plasma to generate a diluent gas plasma so that nitrogen atoms in a superficial layer of the barrier metal film are removed by the diluent gas plasma to decrease a nitrogen content of the superficial layer relative to an interior of a matrix of the barrier metal film.

Thus, a barrier metal film comprising a metal nitride layer and a metal layer can be prepared without the increase of the film thickness. Consequently, a barrier metal film production method can be achieved which is capable of forming a barrier metal film at a high speed with excellent burial properties in a very small thickness, and also forming a barrier metal film with excellent adhesion to a metal formed as a film on the surface of the barrier metal film.

The barrier metal film production method may further comprise supplying an oxygen gas into the chamber immediately before formation of the most superficial layer of the barrier metal film is completed; and converting the atmosphere within the chamber into a plasma to generate an oxygen gas plasma so that an oxide layer is formed on the most superficial layer of the barrier metal film.

Thus, the oxide layer gives satisfactory wettability by a metal deposited on the surface of the barrier metal film, thereby increasing adhesion to the metal.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also converting the atmosphere within the chamber into a plasma to generate a nitrogen-containing gas plasma so that a metal nitride is formed upon reaction between nitrogen and the precursor;

making a temperature of the substrate lower than a temperature of plasma generation means to form the metal nitride as a barrier metal film on a surface of the substrate;

supplying an oxygen gas to a site above the surface of the substrate; and performing a surface treatment which converts the atmosphere within the chamber into a plasma to generate an oxygen gas plasma so that nitrogen atoms in a superficial layer of the barrier metal film are removed by the oxygen gas plasma to decrease a nitrogen content of the superficial layer relative to an interior of a matrix of the barrier metal film, while forming an oxide layer on the most superficial layer of the barrier metal film.

Thus, a barrier metal film comprising a metal nitride layer and a metal layer can be prepared with a minimum nozzle construction without the increase of the film thickness, and an oxide layer gives satisfactory wettability by a metal deposited on the surface of the barrier metal film. Consequently, a barrier metal film production method can be achieved which is capable of forming a barrier metal film at a high speed with excellent burial properties in a very small thickness, and also forming a barrier metal film with excellent adhesion to a metal formed as a film on the surface of the barrier metal film.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also converting the atmosphere within the chamber into a plasma to generate a nitrogen-containing gas plasma so that a metal nitride is formed upon reaction between nitrogen and the precursor;

making a temperature of the substrate lower than a temperature of plasma generation means to form the metal nitride as a film on a surface of the substrate for use as a barrier metal film;

supplying an oxygen gas into the chamber immediately before formation of the most superficial layer of the barrier metal film is completed; and converting the atmosphere within the chamber into a plasma to generate an oxygen gas plasma so that an oxide layer is formed on the most superficial layer of the barrier metal film.

Thus, a barrier metal film comprising a metal nitride layer can be prepared without the increase of the film thickness, and an oxide layer gives satisfactory wettability by a metal deposited on the surface of the barrier metal film. Consequently, a barrier metal film production method can be achieved which is capable of forming a barrier metal film at a high speed with excellent burial properties in a very small thickness, and also forming a barrier metal film with excellent adhesion to a metal formed as a film on the surface of the barrier metal film.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also converting the atmosphere within the chamber into a plasma to generate a nitrogen-containing gas plasma so that a metal nitride is formed upon reaction between nitrogen and the precursor;

making a temperature of the substrate lower than a temperature of plasma generation means to form the metal nitride as a film on a surface of the substrate, then making the temperature of the substrate lower than the temperature of the plasma generation means and stopping supply of the gas containing nitrogen, thereby forming the metal component of the precursor as a film on the metal nitride for use as a barrier metal film;

supplying an oxygen gas into the chamber immediately before formation of the most superficial layer of the barrier metal film is completed; and converting the atmosphere within the chamber into a plasma to generate an oxygen gas plasma so that an oxide layer is formed on the most superficial layer of the barrier metal film.

Thus, a barrier metal film comprising a metal nitride layer and a metal layer can be prepared without the increase of the film thickness, and an oxide layer gives satisfactory wettability by a metal deposited on the surface of the barrier metal film. Consequently, a barrier metal film production method can be achieved which is capable of forming a barrier metal film at a high speed with excellent burial properties, and also forming a barrier metal film with excellent adhesion to a metal formed as a film on the surface of the barrier metal film.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also exciting the gas containing nitrogen in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate for use as a barrier metal film;

supplying an oxygen gas at a site above a surface of the substrate immediately before formation of the most superficial layer of the barrier metal film is completed; and converting the atmosphere within the chamber into a plasma to generate an oxygen gas plasma so that an oxide layer is formed on the most superficial layer of the barrier metal film.

Thus, a barrier metal film comprising a metal nitride layer can be prepared without the increase of the film thickness, an oxide layer gives satisfactory wettability by a metal deposited on the surface of the barrier metal film, and the substrate can be free from exposure to a nitrogen-containing gas plasma. Consequently, a barrier metal film production method can be achieved which is capable of forming a barrier metal film at a high speed with excellent burial properties in a very small thickness without exerting the influence of the nitrogen-containing gas plasma upon the substrate, and also forming a barrier metal film with excellent adhesion to a metal formed as a film on the surface of the barrier metal film.

According to the present invention, there is also provided a barrier metal film production method comprising:

supplying a source gas containing a halogen and a nitrogen-containing gas to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also exciting the gas containing nitrogen in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate, and after film formation of the metal nitride, stopping supply of the nitrogen-containing gas and making the temperature of the substrate lower than a temperature of the etched member, thereby forming the metal component of the precursor as a film on the metal nitride on the substrate for use as a barrier metal film;

supplying an oxygen gas at a site above a surface of the substrate immediately before formation of the most superficial layer of the barrier metal film is completed; and converting the atmosphere within the chamber into a plasma to generate an oxygen gas plasma so that an oxide layer is formed on the most superficial layer of the barrier metal film.

Thus, a barrier metal film comprising a metal nitride layer can be prepared without the increase of the film thickness, an oxide layer gives satisfactory wettability by a metal deposited on the surface of the barrier metal film, and the substrate can be free from exposure to a nitrogen-containing gas plasma. Consequently, a barrier metal film production method can be achieved which is capable of forming a barrier metal film at a high speed with excellent burial properties without exerting the influence of the nitrogen-containing gas plasma upon the substrate, and also forming a barrier metal film with excellent adhesion to a metal formed as a film on the surface of the barrier metal film.

The barrier metal film production method may further comprise supplying a hydrogen gas into the chamber; and converting the atmosphere within the chamber into a plasma to generate a hydrogen gas plasma so that hydroxyl groups are formed on the oxide layer.

Thus, hydrophilicity can be increased, so that adhesion of a metal deposited on the surface can be further increased.

According to the present invention, there is also provided a barrier metal film production method involving treatment of a surface of a substrate having a barrier metal film of a metal nitride formed thereon, comprising:

performing a surface treatment which removes nitrogen atoms in a superficial layer of the barrier metal film to decrease a nitrogen content of the superficial layer relative to an interior of a matrix of the barrier metal film, thereby substantially forming a metal layer on the superficial layer.

Thus, the substantial metal layer and the metal nitride layer can be formed with a single-layer thickness, and a barrier metal film with a very small thickness can be produced, with diffusion of metal being prevented and adhesion to the metal being retained. Consequently, a metal wiring process can be stabilized.

According to the present invention, there is also provided a metal film comprising a metal layer substantially formed on a superficial layer of a barrier metal film of a metal nitride formed on a surface of a substrate, said metal layer being formed by performing a surface treatment which removes nitrogen atoms in the superficial layer of the barrier metal film to decrease a nitrogen content of the superficial layer relative to an interior of a matrix of the barrier metal film.

Thus, there is obtained a metal film which has a barrier metal film comprising the substantial metal layer and the metal nitride layer formed with a single-layer thickness, and produced with a very small thickness, with diffusion of metal being prevented and adhesion to the metal being retained, and which can stabilize a metal wiring process.

According to the present invention, there is also provided a barrier metal film production method involving treatment of a surface of a substrate having a barrier metal film of a metal nitride formed thereon, comprising:

performing a surface treatment which etches the barrier metal film on the surface of the substrate with a diluent gas plasma to flatten the barrier metal film.

Thus, a barrier metal film can be produced, with diffusion of metal being prevented and adhesion to the metal being retained. Consequently, a metal wiring process can be stabilized.

According to the present invention, there is also provided a barrier metal film production method involving treatment of a surface of a substrate having a barrier metal film of a metal nitride formed thereon, comprising:

performing a surface treatment which etches the barrier metal film on the surface of the substrate with a diluent gas plasma to flatten the barrier metal film, and removes nitrogen atoms in a superficial layer of the barrier metal film by the diluent gas plasma to decrease a nitrogen content of the superficial layer relative to an interior of a matrix of the barrier metal film.

Thus, the substantial metal layer and the metal nitride layer can be formed with a single-layer thickness, and a barrier metal film with a very small thickness can be produced, with diffusion of metal being prevented and adhesion to the metal being retained. Consequently, a metal wiring process can be stabilized.

According to the present invention, there is also provided a metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also exciting a gas containing nitrogen in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate for use as a barrier metal film; and performing a surface treatment which etches the barrier metal film on a surface of the substrate with a diluent gas plasma to flatten the barrier metal film.

Thus, a barrier metal film can be produced such that the barrier metal film is prepared, and then subjected to a treatment for preventing diffusion of metal and retaining adhesion to the metal. Consequently, a metal wiring process can be stabilized.

According to the present invention, there is also provided a metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also exciting a gas containing nitrogen in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate for use as a barrier metal film; and performing a surface treatment which etches the barrier metal film on a surface of the substrate with a diluent gas plasma to flatten the barrier metal film, and removes nitrogen atoms in a superficial layer of the barrier metal film by the diluent gas plasma to decrease a nitrogen content of the superficial layer relative to an interior of a matrix of the barrier metal film.

Thus, after a barrier metal film is prepared, the substantial metal layer and the metal nitride layer can be formed with a single-layer thickness. Hence, a barrier metal film having a very small thickness can be produced, with diffusion of metal being prevented and adhesion to the metal being retained. Consequently, a metal wiring process can be stabilized.

According to the present invention, there is also provided a metal film production method comprising:

performing a surface treatment which generates a diluent gas plasma within a chamber accommodating a substrate having a barrier metal film of a metal nitride formed thereon, to etch the barrier metal film on a surface of the substrate with the diluent gas plasma, thereby flattening the barrier metal film;

then supplying a source gas containing a halogen into the chamber;

converting an atmosphere within the chamber into a plasma to generate a source gas plasma so that an etched member made of a metal is etched with the source gas plasma to form a precursor within the chamber from a metal component contained in the etched member and the source gas; and making a temperature of the substrate lower than a temperature of the etched member to form the metal component of the precursor as a film on the substrate having the barrier metal film flattened.

Thus, a metal can be formed as a film through the production of a barrier metal film subjected to a treatment for preventing diffusion of metal and retaining adhesion to the metal. Consequently, a metal wiring process can be stabilized.

According to the present invention, there is also provided a metal film production method comprising:

performing a surface treatment which generates a diluent gas plasma within a chamber accommodating a substrate having a barrier metal film of a metal nitride formed thereon, to etch the barrier metal film on a surface of the substrate with the diluent gas plasma, thereby flattening the barrier metal film, and removes nitrogen atoms in a superficial layer of the barrier metal film by the diluent gas plasma to decrease a nitrogen content of the superficial layer relative to an interior of a matrix of the barrier metal film;

then supplying a source gas containing a halogen into the chamber;

converting an atmosphere within the chamber into a plasma to generate a source gas plasma so that an etched member made of a metal is etched with the source gas plasma to form a precursor within the chamber from a metal component contained in the etched member and the source gas; and making a temperature of the substrate lower than a temperature of the etched member to form the metal component of the precursor as a film on the substrate having the barrier metal film flattened and having the nitrogen content of the superficial layer relatively decreased.

Thus, the substantial metal layer and the metal nitride layer can be formed with a single-layer thickness. Hence, a metal can be formed as a film through the production of a barrier metal film having a very small thickness while preventing diffusion of metal and retaining adhesion to the metal. Consequently, a metal wiring process can be stabilized.

The metal film production method may further comprise applying a densification treatment for densifying metal atoms in a superficial layer of the barrier metal film after flattening the barrier metal film and also relatively decreasing the nitrogen content of the superficial layer.

Thus, diffusion of the component of the metal film can be prevented reliably.

In the metal film production method, the diluent gas plasma may be an argon gas plasma. Thus, the treatment can be performed reliably with the use of an inexpensive gas.

According to the present invention, there is also provided a metal film production apparatus, comprising:

a chamber accommodating a substrate;

a metallic etched member provided in the chamber at a position opposed to the substrate;

halogen gas supply means for supplying a source gas containing a halogen to an interior of the chamber between the substrate and the etched member;

barrier plasma generation means which converts an atmosphere within the chamber into a plasma to generate a source gas plasma so that the etched member is etched with the source gas plasma to form a precursor from a metal component contained in the etched member and the source gas;

excitation means for exciting a gas containing nitrogen in a manner isolated from the chamber;

formation means for forming a metal nitride upon reaction between nitrogen excited by the excitation means and the precursor;

control means which makes a temperature of the substrate lower than a temperature of the formation means to form the metal nitride as a film on the substrate for use as a barrier metal film;

diluent gas supply means for supplying a diluent gas to a site above a surface of the substrate; and surface treatment plasma generation means which converts the atmosphere within the chamber into a plasma to generate a diluent gas plasma so that the barrier metal film on the surface of the substrate is etched with the diluent gas plasma to flatten the barrier metal film.

Thus, there can be produced a barrier metal film subjected to treatment for preventing diffusion of metal and retaining adhesion to the metal. Consequently, a metal wiring process can be stabilized.

According to the present invention, there is also provided a metal film production apparatus, comprising:

a chamber accommodating a substrate;

a metallic etched member provided in the chamber at a position opposed to the substrate;

halogen gas supply means for supplying a source gas containing a halogen to an interior of the chamber between the substrate and the etched member;

barrier plasma generation means which converts an atmosphere within the chamber into a plasma to generate a source gas plasma so that the etched member is etched with the source gas plasma to form a precursor from a metal component contained in the etched member and the source gas;

excitation means for exciting a gas containing nitrogen in a manner isolated from the chamber;

formation means for forming a metal nitride upon reaction between nitrogen excited by the excitation means and the precursor;

control means which makes a temperature of the substrate lower than a temperature of the formation means to form the metal nitride as a film on the substrate for use as a barrier metal film;

diluent gas supply means for supplying a diluent gas to a site above a surface of the substrate; and surface treatment plasma generation means for performing a surface treatment which converts the atmosphere within the chamber into a plasma to generate a diluent gas plasma so that the barrier metal film on the surface of the substrate is etched with the diluent gas plasma to flatten the barrier metal film, and removes nitrogen atoms in a superficial layer of the barrier metal film to decrease a nitrogen content of the superficial layer relative to an interior of a matrix of the barrier metal film.

Thus, the substantial metal layer and the metal nitride layer can be formed with a single-layer thickness. Hence, a barrier metal film having a very small thickness can be produced, with diffusion of metal being prevented and adhesion to the metal being retained. Consequently, a metal wiring process can be stabilized.

According to the present invention, there is also provided a metal film production apparatus, comprising:

a chamber accommodating a substrate having a barrier metal film of a metal nitride formed thereon;

diluent gas supply means for supplying a diluent gas to an interior of the chamber above a surface of the substrate;

surface treatment plasma generation means which converts an atmosphere within the chamber into a plasma to generate a diluent gas plasma so that the barrier metal film on the surface of the substrate is etched with the diluent gas plasma to flatten the barrier metal film;

a metallic etched member provided in the chamber;

source gas supply means for supplying a source gas containing a halogen to an interior of the chamber between the substrate and the etched member;

plasma generation means which converts the source gas containing the halogen into a plasma to generate a source gas plasma so that the etched member is etched with the source gas plasma to form a precursor from a metal component contained in the etched member and the source gas; and control means which makes a temperature of the substrate lower than a temperature of the etched member to form the metal component of the precursor as a film on the flattened barrier metal film.

Thus, a metal film can be formed through the production of a barrier metal film subjected to a treatment for preventing diffusion of metal and retaining adhesion to the metal. Consequently, a metal wiring process can be stabilized.

According to the present invention, there is also provided a metal film production apparatus, comprising:

a chamber accommodating a substrate having a barrier metal film of a metal nitride formed thereon;

diluent gas supply means for supplying a diluent gas to an interior of the chamber above a surface of the substrate;

surface treatment plasma generation means which converts an atmosphere within the chamber into a plasma to generate a diluent gas plasma so that the barrier metal film on the surface of the substrate is etched with the diluent gas plasma to flatten the barrier metal film, and also removes nitrogen atoms in a superficial layer of the barrier metal film by the diluent gas plasma to decrease a nitrogen content of the superficial layer relative to an interior of a matrix of the barrier metal film;

a metallic etched member provided in the chamber;

source gas supply means for supplying a source gas containing a halogen to an interior of the chamber between the substrate and the etched member;

plasma generation means which converts the source gas containing the halogen into a plasma to generate a source gas plasma so that the etched member is etched with the source gas plasma to form a precursor from a metal component contained in the etched member and the source gas; and control means which makes a temperature of the substrate lower than a temperature of the etched member to form the metal component of the precursor as a film on the barrier metal film flattened and having the nitrogen content of the superficial layer relatively decreased.

Thus, the substantial metal layer and the metal nitride layer can be formed with a single-layer thickness. Hence, a metal film can be formed through the production of a barrier metal film having a very small thickness while preventing diffusion of metal and retaining adhesion to the metal. Consequently, a metal wiring process can be stabilized.

The metal film production apparatus may further comprise densification treatment means for densifying metal atoms in the superficial layer after flattening the barrier metal film and also relatively decreasing the nitrogen content of the superficial layer. Thus, diffusion of the component of the metal film can be prevented reliably.

In the metal film production apparatus, the diluent gas plasma may be an argon gas plasma. Thus, the treatment can be performed reliably with the use of an inexpensive gas.

According to the present invention, there is also provided a metal film formed by flattening a barrier metal film of a metal nitride on a surface of a substrate by etching with a diluent gas plasma.

Thus, the resulting metal film has a barrier metal film retaining adhesion, and can stabilize a metal wiring process.

According to the present invention, there is also provided a metal film formed by a surface treatment which flattens a barrier metal film of a metal nitride on a surface of a substrate by etching with a diluent gas plasma, and removes nitrogen atoms in a superficial layer of the barrier metal film by the diluent gas plasma to decrease a nitrogen content of the superficial layer relative to an interior of a matrix of the barrier metal film.

Thus, there is obtained a metal film which has a barrier metal film comprising the substantial metal layer and the metal nitride layer formed with a single-layer thickness, and produced with a very small thickness, with diffusion of metal being prevented and adhesion to the metal being retained, and which can stabilize a metal wiring process.

According to the present invention, there is also provided a metal film production method involving treatment of a surface of a substrate having a barrier metal film of a metal nitride formed thereon, comprising:

performing a surface treatment which reacts the barrier metal film on the surface of the substrate in a reducing gas atmosphere to remove nitrogen atoms in a superficial layer of the barrier metal film, thereby decreasing a nitrogen content of the superficial layer relative to an interior of a matrix of the barrier metal film.

Thus, a barrier metal film with a very small thickness and comprising the substantial metal layer and the metal nitride layer formed with a single-layer thickness can be produced, with diffusion of metal being prevented and adhesion to the metal being retained. Consequently, a metal wiring process can be stabilized.

According to the present invention, there is also provided a metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also exciting a gas containing nitrogen in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate for use as a barrier metal film; and performing a surface treatment which reacts the barrier metal film on a surface of the substrate in a reducing gas atmosphere to remove nitrogen atoms in a superficial layer of the barrier metal film, thereby decreasing a nitrogen content of the superficial layer relative to an interior of a matrix of the barrier metal film.

Thus, a barrier metal film with a very small thickness and comprising the substantial metal layer and the metal nitride layer formed with a single-layer thickness can be produced, with diffusion of metal being prevented and adhesion to the metal being retained. Consequently, a metal wiring process can be stabilized.

According to the present invention, there is also provided a metal film production method comprising:

performing a surface treatment in a chamber accommodating a substrate having a barrier metal film of a metal nitride formed thereon, said surface treatment comprising reacting the barrier metal film on a surface of the substrate in a reducing gas atmosphere to remove nitrogen atoms in a superficial layer of the barrier metal film, thereby decreasing a nitrogen content of the superficial layer relative to an interior of a matrix of the barrier metal film;

then supplying a source gas containing a halogen into the chamber;

converting an atmosphere within the chamber into a plasma to generate a source gas plasma so that a metallic etched member is etched with the source gas plasma to form a precursor within the chamber from a metal component contained in the etched member and the source gas; and making a temperature of the substrate lower than a temperature of the etched member to form the metal component of the precursor as a film on the substrate having the barrier metal film flattened thereon.

Thus, a metal film can be formed through the production of a barrier metal film having a very small thickness and comprising the substantial metal layer and the metal nitride layer formed with a single-layer thickness, while preventing diffusion of metal and retaining adhesion to the metal. Consequently, a metal wiring process can be stabilized.

According to the present invention, there is also provided a metal film production apparatus, comprising:

a chamber accommodating a substrate;

a metallic etched member provided in the chamber at a position opposed to the substrate;

halogen gas supply means for supplying a source gas containing a halogen to an interior of the chamber between the substrate and the etched member;

barrier plasma generation means which converts an atmosphere within the chamber into a plasma to generate a source gas plasma so that the etched member is etched with the source gas plasma to form a precursor from a metal component contained in the etched member and the source gas;

excitation means for exciting a gas containing nitrogen in a manner isolated from the chamber;

formation means for forming a metal nitride upon reaction between nitrogen excited by the excitation means and the precursor;

control means which makes a temperature of the substrate lower than a temperature of the formation means to form the metal nitride as a film on the substrate for use as a barrier metal film;

reducing gas supply means for supplying a reducing gas to a site above a surface of the substrate; and surface treatment means which reacts the barrier metal film on the surface of the substrate in a reducing gas atmosphere to remove nitrogen atoms in a superficial layer of the barrier metal film, thereby decreasing a nitrogen content of the superficial layer relative to an interior of a matrix of the barrier metal film.

Thus, a barrier metal film with a very small thickness and comprising the substantial metal layer and the metal nitride layer formed with a single-layer thickness can be produced, with diffusion of metal being prevented and adhesion to the metal being retained. Consequently, a metal wiring process can be stabilized.

According to the present invention, there is also provided a metal film production apparatus, comprising:

a chamber accommodating a substrate having a barrier metal film of a metal nitride formed thereon;

reducing gas supply means for supplying a reducing gas to a site above a surface of the substrate;

surface treatment means which reacts the barrier metal film on the surface of the substrate in a reducing gas atmosphere to remove nitrogen atoms in a superficial layer of the barrier metal film, thereby decreasing a nitrogen content of the superficial layer relative to an interior of a matrix of the barrier metal film;

a metallic etched member provided in the chamber;

source gas supply means for supplying a source gas containing a halogen to an interior of the chamber between the substrate and the etched member;

plasma generation means which converts the source gas containing the halogen into a plasma to generate a source gas plasma so that the etched member is etched with the source gas plasma to form a precursor from a metal component contained in the etched member and the source gas; and control means which makes a temperature of the substrate lower than a temperature of the etched member to form the metal component of the precursor as a film on the barrier metal film having the nitrogen content of the superficial layer relatively decreased.

Thus, a metal film can be formed through the production of a barrier metal film having a very small thickness and comprising the substantial metal layer and the metal nitride layer formed with a single-layer thickness, while preventing diffusion of metal and retaining adhesion to the metal. Consequently, a metal wiring process can be stabilized.

According to the present invention, there is also provided a metal film formed by a surface treatment which reacts a barrier metal film of a metal nitride on a surface of a substrate in a reducing gas atmosphere to remove nitrogen atoms in a superficial layer of the barrier metal film, thereby decreasing a nitrogen content of the superficial layer relative to an interior of a matrix of the barrier metal film.

Thus, there is obtained a metal film which has a barrier metal film comprising the substantial metal layer and the metal nitride layer formed with a single-layer thickness, and produced with a very small thickness, with diffusion of metal being prevented and adhesion to the metal being retained, and which can stabilize a metal wiring process.

According to the present invention, there is also provided a metal film production method involving treatment of a surface of a substrate having a barrier metal film of a metal nitride formed thereon, comprising:

performing a surface treatment which forms nuclei of silicon atoms on a surface of the barrier metal film on the surface of the substrate by a gas plasma containing silicon.

Thus, a barrier metal film with a very small thickness can be produced, with adhesion to metal being retained. Consequently, a metal wiring process can be stabilized.

According to the present invention, there is also provided a metal film production method comprising:

supplying a source gas containing a halogen to an interior of a chamber between a substrate and a metallic etched member;

converting an atmosphere within the chamber into a plasma to generate a source gas plasma so that the etched member is etched with the source gas plasma to form a precursor from a metal component contained in the etched member and the source gas, and also exciting a gas containing nitrogen in a manner isolated from the chamber accommodating the substrate;

forming a metal nitride upon reaction between excited nitrogen and the precursor;

making a temperature of the substrate lower than a temperature of means for formation of the metal nitride to form the metal nitride as a film on the substrate for use as a barrier metal film; and performing a surface treatment which forms nuclei of silicon atoms on a surface of the barrier metal film on a surface of the substrate by a gas plasma containing silicon.

Thus, a barrier metal film with a very small thickness can be produced, with adhesion to metal being retained. Consequently, a metal wiring process can be stabilized.

According to the present invention, there is also provided a metal film production method comprising:

performing a surface treatment in a chamber accommodating a substrate having a barrier metal film of a metal nitride formed thereon, said surface treatment comprising forming nuclei of silicon atoms on a surface of the barrier metal film on a surface of the substrate by a gas plasma containing silicon;

then supplying a source gas containing a halogen into the chamber;

converting an atmosphere within the chamber into a plasma to generate a source gas plasma so that a metallic etched member is etched with the source gas plasma to form a precursor within the chamber from a metal component contained in the etched member and the source gas; and making a temperature of the substrate lower than a temperature of the etched member to form the metal component of the precursor as a film on the substrate having the nuclei of silicon atoms formed on the surface of the barrier metal film.

Thus, a metal film can be formed through the production of a barrier metal film having a very small thickness and retaining adhesion to metal. Consequently, a metal wiring process can be stabilized.

According to the present invention, there is also provided a metal film production apparatus, comprising:

a chamber accommodating a substrate;

a metallic etched member provided in the chamber at a position opposed to the substrate;

halogen gas supply means for supplying a source gas containing a halogen to an interior of the chamber between the substrate and the etched member;

barrier plasma generation means which converts an atmosphere within the chamber into a plasma to generate a source gas plasma so that the etched member is etched with the source gas plasma to form a precursor from a metal component contained in the etched member and the source gas;

excitation means for exciting a gas containing nitrogen in a manner isolated from the chamber;

formation means for forming a metal nitride upon reaction between nitrogen excited by the excitation means and the precursor;

control means which makes a temperature of the substrate lower than a temperature of the formation means to form the metal nitride as a film on the substrate for use as a barrier metal film;

silicon-containing gas supply means for supplying a gas containing silicon to a site above a surface of the substrate; and surface treatment plasma generation means which generates a gas plasma containing silicon to form nuclei of silicon atoms on a surface of the barrier metal film on the surface of the substrate.

Thus, a barrier metal film with a very small thickness can be produced, with adhesion to metal being retained. Consequently, a metal wiring process can be stabilized.

According to the present invention, there is also provided a metal film production apparatus, comprising:

a chamber accommodating a substrate having a barrier metal film of a metal nitride formed thereon;

silicon-containing gas supply means for supplying a gas containing silicon to a site above a surface of the substrate;

surface treatment plasma generation means which generates a as plasma containing silicon to form nuclei of silicon atoms on a surface of the barrier metal film on the surface of the substrate;

a metallic etched member provided in the chamber;

source gas supply means for supplying a source gas containing a halogen to an interior of the chamber between the substrate and the etched member;

plasma generation means which converts the source gas containing the halogen into a plasma to generate a source gas plasma so that the etched member is etched with the source gas plasma to form a precursor from a metal component contained in the etched member and the source gas; and control means which makes a temperature of the substrate lower than a temperature of the etched member to form the metal component of the precursor as a film on the barrier metal film having the nuclei of silicon atoms formed on the surface thereof.

Thus, a metal film can be formed through the production of a barrier metal film having a very small thickness and retaining adhesion to metal. Consequently, a metal wiring process can be stabilized.

According to the present invention, there is also provided a metal film formed by applying a surface treatment to a barrier metal film of a metal nitride on a surface of a substrate such that nuclei of silicon atoms are formed on a surface of the barrier metal film on the surface of the substrate by a gas plasma containing silicon.

Thus, there is obtained a metal film which has a barrier metal film having a very small thickness and retaining adhesion to metal, and which can stabilize a metal wiring process.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 31 is a sectional view of a substrate illustrating a barrier metal film;

DESCRIPTION OF THE PREFERRED EMBODIMENTS

Figure 1:
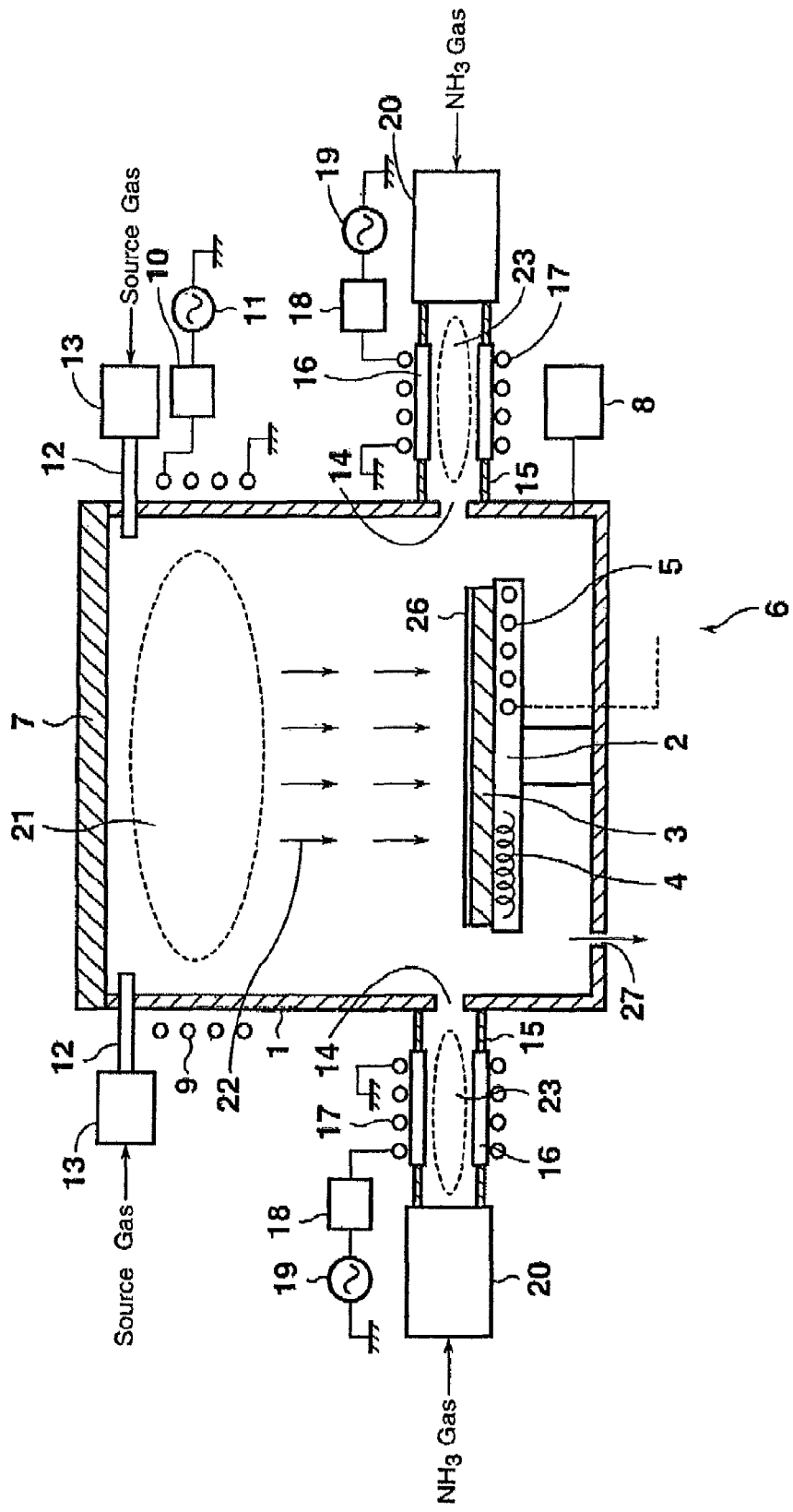
FIG. 1 is a schematic side view of a barrier metal film production apparatus according to a first embodiment of the present invention.
Figure 2:
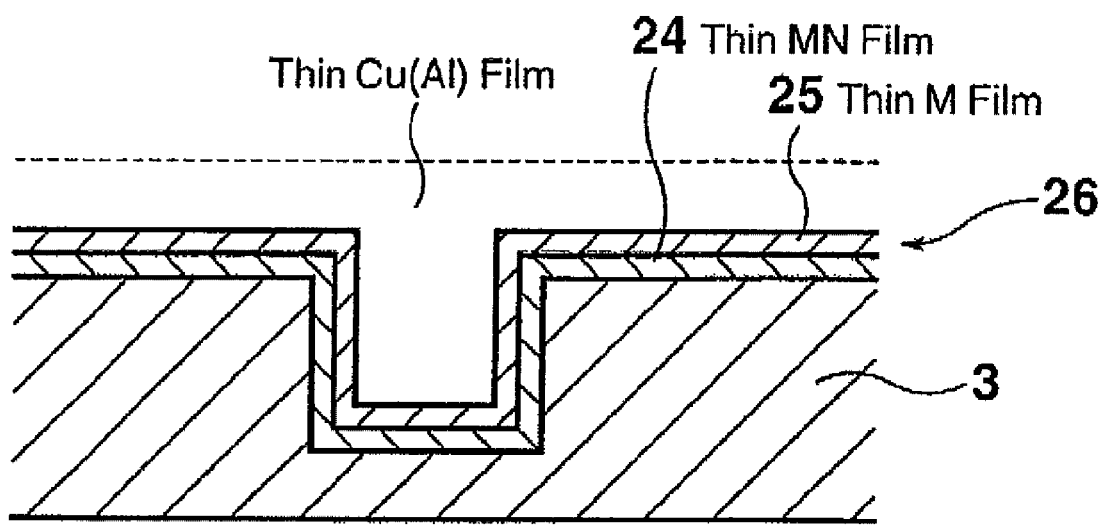
FIG. 2 is a detail view of a substrate on which a barrier metal film has been produced.

The first embodiment of the barrier metal film production apparatus and barrier metal film production method of the present invention will be described with reference to FIGS. 1 and 2. FIG. 1 is a schematic side view of the barrier metal film production apparatus according to the first embodiment of the present invention. FIG. 2 shows details of a substrate on which a barrier metal film has been prepared.

As shown in the drawings, a support platform 2 is provided near the bottom of a cylindrical chamber 1 made of, say, a ceramic (an insulating material), and a substrate 3 is placed on the support platform 2. Temperature control means 6 equipped with a heater 4 and refrigerant flow-through means 5 is provided in the support platform 2 so that the support platform 2 is controlled to a predetermined temperature (for example, a temperature at which the substrate 3 is maintained at 100 to 200° C.) by the temperature control means 6.

An upper surface of the chamber 1 is an opening, which is closed with a metal member 7, as an etched member, made of a metal (e.g., W, Ti, Ta, or TiSi). The interior of the chamber 1 closed with the metal member 7 is maintained at a predetermined pressure by a vacuum device 8. A plasma antenna 9, as a coiled winding antenna 9 of plasma generation means, is provided around a cylindrical portion of the chamber 1. A matching instrument 10 and a power source 11 are connected to the plasma antenna 9 to supply power.

Nozzles 12 for supplying a source gas (a $Cl_2$ gas diluted with He or Ar to a chlorine concentration of $\leq 50\%$, preferably about 10%), containing chlorine as a halogen, to the interior of the chamber 1 are connected to the cylindrical portion of the chamber 1 below the metal member 7. The nozzle 12 is open toward the horizontal, and is fed with the source gas via a flow controller 13. Fluorine (F), bromine (Br) or iodine (I) can also be applied as the halogen to be incorporated into the source gas.

Slit-shaped opening portions 14 are formed at a plurality of locations (for example, four locations) in the periphery of a lower part of the cylindrical portion of the chamber 1, and one end of a tubular passage 15 is fixed to each of the opening portions 14. A tubular excitation chamber 16 made of an insulator is provided halfway through the passage 15, and a coiled plasma antenna 17 is provided around the excitation chamber 16. The plasma antenna 17 is connected to a matching instrument 18 and a power source 19 to receive power. The plasma antenna 17, the matching instrument 18 and the power source 19 constitute excitation means. A flow controller 20 is connected to the other end of the passage 15, and an ammonia gas ($NH_3$ gas) as a nitrogen-containing gas is supplied into the passage 15 via the flow controller 20.

With the above-described barrier metal film production apparatus, the source gas is supplied through the nozzles 12 to the interior of the chamber 1, and electromagnetic waves are shot from the plasma antenna 9 into the chamber 1. As a result, the $Cl_2$ gas is ionized to generate a $Cl_2$ gas plasma (source gas plasma) 21. The $Cl_2$ gas plasma 21 causes an etching reaction to the metal member 7, forming a precursor ($M_xCl_y$: M is a metal such as W, Ti, Ta or TiSi) 22.

Separately, the $NH_3$ gas is supplied into the passage 15 via the flow controller 20 and fed into the excitation chamber 16. By shooting electromagnetic waves from the plasma antenna 17 into the excitation chamber 16, the $NH_3$ gas is ionized to generate an $NH_3$ gas plasma 23. Since a predetermined differential pressure has been established between the pressure inside the chamber 1 and the pressure inside the excitation chamber 16 by the vacuum device 8, the excited ammonia of the $NH_3$ gas plasma 23 in the excitation chamber 16 is fed to the precursor ($M_xCl_y$) 22 inside the chamber 1 through the opening portion 14.

That is, excitation means for exciting the nitrogen-containing gas in the excitation chamber 16 isolated from the chamber 1 is constructed. Because of this construction, the metal component of the precursor ($M_xCl_y$) 22 and ammonia react to form a metal nitride (MN) (i.e., formation means). At this time, the metal member 7 and the excitation chamber 16 are maintained by the plasmas at predetermined temperatures (e.g., 200 to 400° C.) which are higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The reaction for formation of the thin MN film 24 can be expressed by:

The reaction for formation of the thin M film 25 can be expressed by:

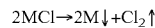

The gases and the etching products that have not been involved in the reactions are exhausted through an exhaust port 27.

The source gas has been described, with the $Cl_2$ gas diluted with, say, He or Ar taken as an example. However, the $Cl_2$ gas can be used alone, or an HCl gas can also be applied. If the HCl gas is applied, an HCl gas plasma is generated as the source gas plasma. Thus, the source gas may be any gas containing chlorine, and a gas mixture of an HCl gas and a $Cl_2$ gas is also usable. As the material for the metal member 7, it is possible to use an industrially applicable metal such as Ag, Au, Pt or Si.

The substrate 3, on which the barrier metal film 26 has been formed, is subjected to a film forming device, which forms a thin copper (Cu) film or a thin aluminum (Al) film on the barrier metal film 26. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26. Furthermore, the reduction reaction is caused by the temperature difference. However, a reducing gas plasma can be generated separately to produce a reduction reaction.

With the above-described barrier metal film production apparatus, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

Figure 3:
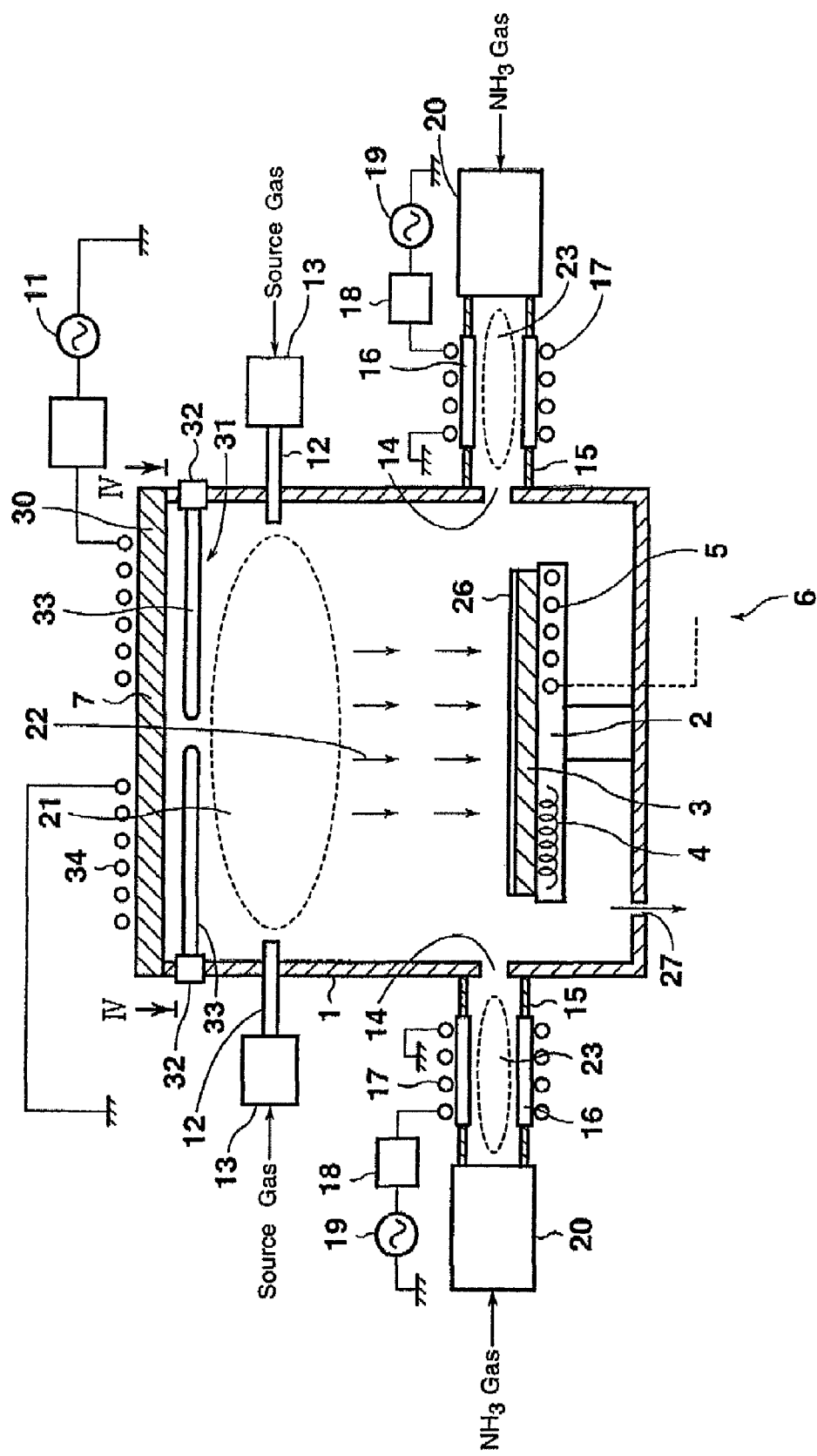
FIG. 3 is a schematic side view of a barrier metal film production apparatus according to a second embodiment of the present invention.
Figure 4:
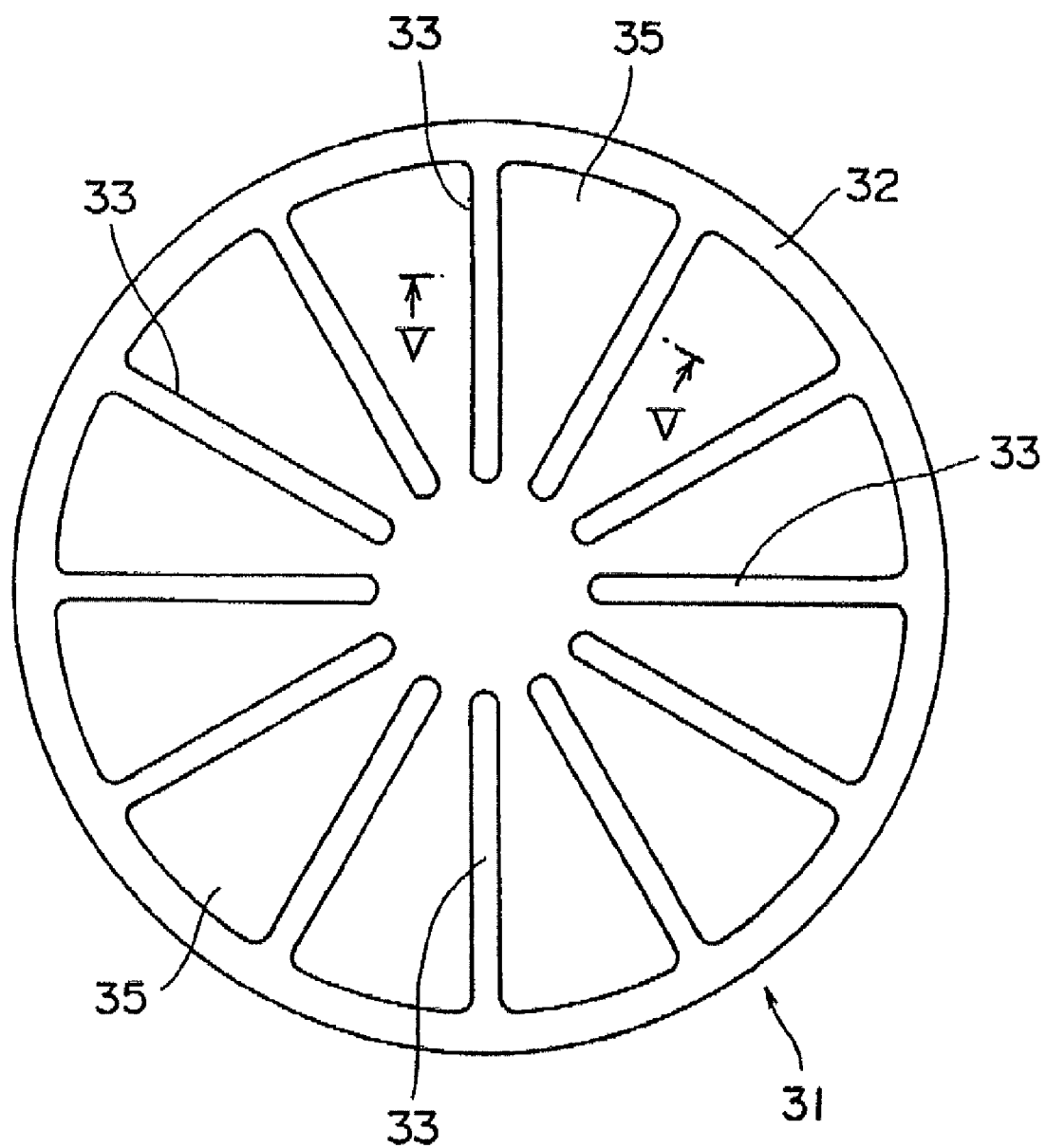
FIG. 4 is a view taken along the arrowed line IV-IV of FIG. 3.
Figure 5:
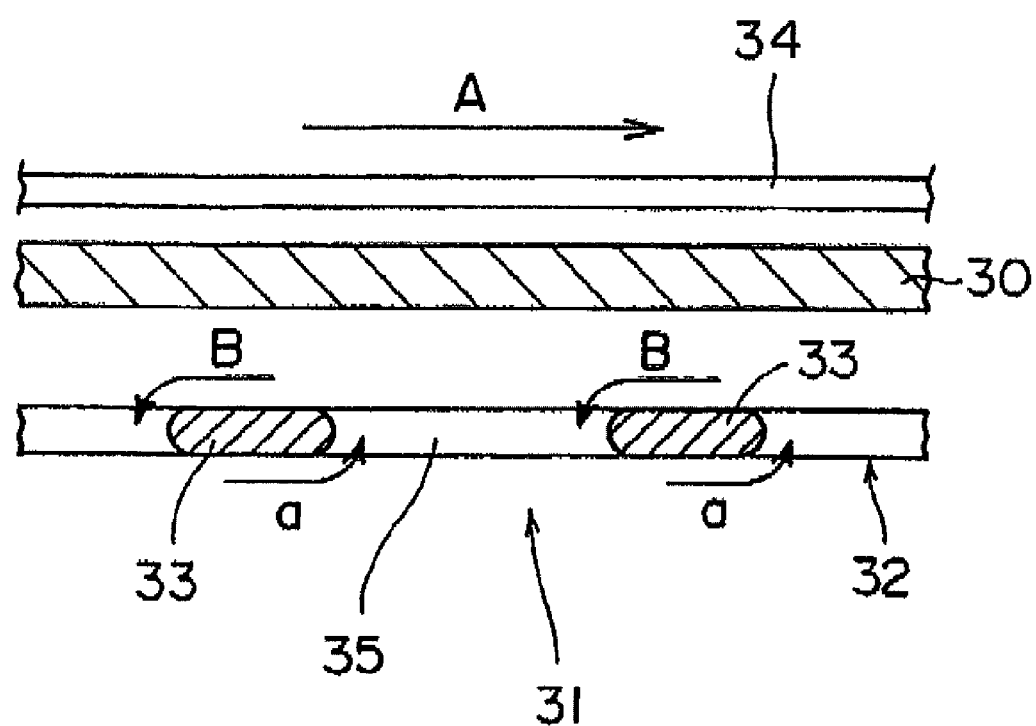
FIG. 5 is a view taken along the arrowed line V-V of FIG. 4.

A barrier metal film production apparatus and a barrier metal film production method according to the second embodiment of the present invention will be described with reference to FIGS. 3 to 5. FIG. 3 is a schematic side view of the barrier metal film production apparatus according to the second embodiment of the present invention. FIG. 4 is a view taken along the arrowed line IV-IV of FIG. 3. FIG. 5 is a view taken along the arrowed line V-V of FIG. 4. The same members as the members illustrated in FIG. 1 are assigned the same numerals, and duplicate explanations are omitted.

An upper surface of the chamber 1 is an opening, which is closed with a disk-shaped ceiling board 30 made of an insulating material (for example, a ceramic). An etched member 31 made of a metal (e.g., W, Ti, Ta or TiSi) is interposed between the opening at the upper surface of the chamber 1 and the ceiling board 30. The etched member 31 is provided with a ring portion 32 fitted into the opening at the upper surface of the chamber 1. A plurality of (12 in the illustrated embodiment) protrusions 33, which extend close to the center in the diametrical direction of the chamber 1 and have the same width, are provided in the circumferential direction on the inner periphery of the ring portion 32.

The protrusions 33 are integrally or removably attached to the ring portion 32. Notches (spaces) 35 formed between the protrusions 33 are present between the ceiling board 30 and the interior of the chamber 1. The ring portion 32 is earthed, and the plural protrusions 33 are electrically connected together and maintained at the same potential. Temperature control means (not shown), such as a heater, is provided in the etched member 31 to control the temperature of the etched member 31 to 200 to 400° C., for example.

Second protrusions shorter in the diametrical direction than the protrusions 33 can be arranged between the protrusions 33. Moreover, short protrusions can be arranged between the protrusion 33 and the second protrusion. By so doing, the area of copper, an object to be etched, can be secured, with an induced current being suppressed.

A planar winding-shaped plasma antenna 34, for converting the atmosphere inside the chamber 1 into a plasma, is provided above the ceiling board 30. The plasma antenna 34 is formed in a planar ring shape parallel to the surface of the ceiling board 30. A matching instrument 10 and a power source 11 are connected to the plasma antenna 34 to supply power. The etched member 31 has the plurality of protrusions 33 provided in the circumferential direction on the inner periphery of the ring portion 32, and includes the notches (spaces) 35 formed between the protrusions 33. Thus, the protrusions 33 are arranged between the substrate 3 and the ceiling board 30 in a discontinuous state relative to the flowing direction of electricity in the plasma antenna 34.

With the above-described barrier metal film production apparatus, the source gas is supplied through the nozzles 12 to the interior of the chamber 1, and electromagnetic waves are shot from the plasma antenna 34 into the chamber 1. As a result, the $Cl_2$ gas is ionized to generate a $Cl_2$ gas plasma (source gas plasma) 21. The etched member 31, an electric conductor, is present below the plasma antenna 34. However, the $Cl_2$ gas plasma 21 occurs stably between the etched member 31 and the substrate 3, namely, below the etched member 31, under the following action:

The action by which the $Cl_2$ gas plasma 21 is generated below the etched member 31 will be described. As shown in FIG. 5, a flow A of electricity in the plasma antenna 34 of the planar ring shape crosses the protrusions 33. At this time, an induced current B occurs on the surface of the protrusion 33 opposed to the plasma antenna 34. Since the notches (spaces) 35 are present in the etched member 31, the induced current B flows onto the lower surface of each protrusion 33, forming a flow a in the same direction as the flow A of electricity in the plasma antenna 34 (Faraday shield).

When the etched member 31 is viewed from the substrate 3, therefore, there is no flow in a direction in which the flow A of electricity in the plasma antenna 34 is canceled out. Furthermore, the ring portion 32 is earthed, and the protrusions 33 are maintained at the same potential. Thus, even though the etched member 31, an electric conductor, exists, the electromagnetic wave is reliably thrown from the plasma antenna 34 into the chamber 1. Consequently, the $Cl_2$ gas plasma 21 is stably generated below the etched member 31.

Furthermore, plasma generation means composed of a passage 15, an excitation chamber 16 and a plasma antenna 17 is provided above the support platform 2.

The $Cl_2$ gas plasma 21 causes an etching reaction to the etched member 31, forming a precursor ($M_xCl_y$: M is a metal such as W, Ti, Ta or TiSi) 22. In the excitation chamber 16, the $NH_3$ gas is ionized to generate an $NH_3$ gas plasma 23. The excited ammonia of the $NH_3$ gas plasma 23 in the excitation chamber 16 is fed to the precursor ($M_xCl_y$) 22 inside the chamber 1 through the opening portion 14. Because of this construction, the metal component of the precursor ($M_xCl_y$) 22 and ammonia react to form a metal nitride (MN) (formation means). At this time, the etched member 31 and the excitation chamber 16 are maintained by the plasmas at predetermined temperatures (e.g., 200 to 400° C.) which are higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the etched member 31. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2). The gases and the etching products, which have not been involved in the reactions, are exhausted through an exhaust port 27.

With the above-described barrier metal film production apparatus, similar to the first embodiment, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

In addition, the etched member 31 has the plurality of protrusions 33 provided in the circumferential direction on the inner periphery of the ring portion 32, and includes the notches (spaces) 35 formed between the protrusions 33. Thus, the induced currents generated in the etched member 31 flow in the same direction as the flowing direction of electricity in the plasma antenna 34, when viewed from the substrate 3. Therefore, even though the etched member 31, an electric conductor, exists below the plasma antenna 34, the electromagnetic waves are reliably thrown from the plasma antenna 34 into the chamber 1. Consequently, the $Cl_2$ gas plasma 21 can be stably generated below the etched member 31.

Figure 6:
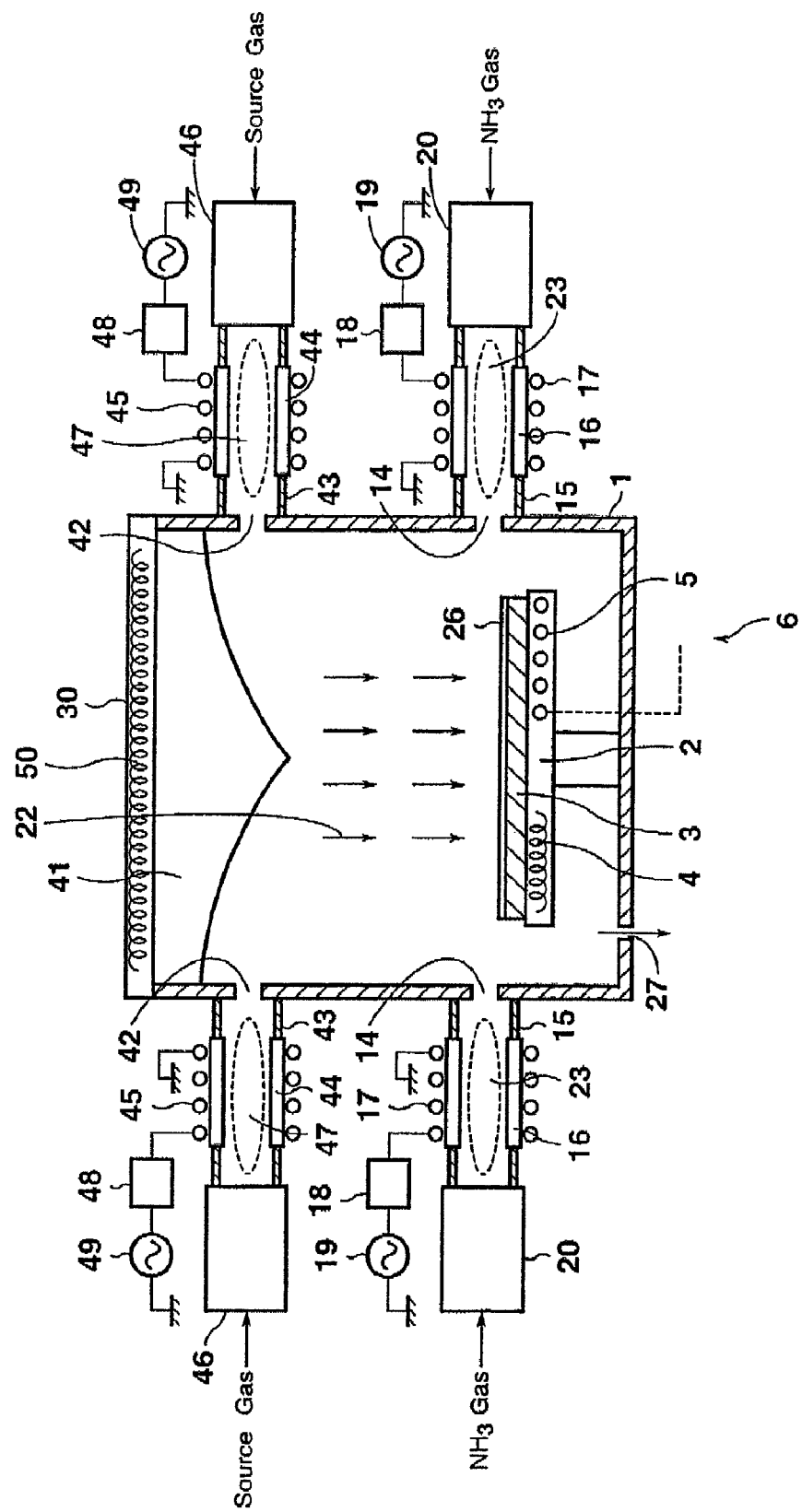
FIG. 6 is a schematic side view of a barrier metal film production apparatus according to a third embodiment of the present invention.

A barrier metal film production apparatus and a barrier metal film production method according to the third embodiment of the present invention will be described with reference to FIG. 6. FIG. 6 is a schematic side view of the barrier metal film production apparatus according to the third embodiment of the present invention. The same members as the members illustrated in FIGS. 1 and 3 are assigned the same numerals, and duplicate explanations are omitted.

The opening of an upper portion of the chamber 1 is closed with a ceiling board 30, for example, made of a ceramic (an insulating material). An etched member 41 made of a metal (e.g., W, Ti, Ta or TiSi) is provided on a lower surface of the ceiling board 30, and the etched member 41 is of a quadrangular pyramidal shape. Slit-shaped second opening portions 42 are formed at a plurality of locations (for example, four locations) in the periphery of an upper part of the cylindrical portion of the chamber 1, and one end of a tubular second passage 43 is fixed to the second opening portion 42.

A tubular second excitation chamber 44 made of an insulator is provided halfway through the second passage 43, and a coiled second plasma antenna 45 is provided around the second excitation chamber 44. The plasma antenna 45 is connected to a matching instrument 48 and a power source 49 to receive power. The second plasma antenna 45, the matching instrument 48 and the power source 49 constitute plasma generation means.

A flow controller 46 is connected to the other end of the second passage 43, and a chlorine-containing source gas (a $Cl_2$ gas diluted with He or Ar to a chlorine concentration of $\leqq 50\%$, preferably about 10%) is supplied into the passage 43 via the flow controller 46. By shooting electromagnetic waves from the second plasma antenna 45 into the second excitation chamber 44, the $Cl_2$ gas is ionized to generate a $Cl_2$ gas plasma (source gas plasma) 47 Because of the generation of the $Cl_2$ gas plasma 47, excited chlorine is fed into the chamber 1 through the second opening portion 42, whereupon the etched member 41 is etched with excited chlorine.

With the above-described barrier metal film production apparatus, the source gas is supplied into the second passage 43 via the flow controller 46 and fed into the second excitation chamber 44. By shooting electromagnetic waves from the second plasma antenna 45 into the second excitation chamber 44, the $Cl_2$ gas is ionized to generate a $Cl_2$ gas plasma (source gas plasma) 47. Since a predetermined differential pressure has been established between the pressure inside the chamber 1 and the pressure inside the second excitation chamber 44 by the vacuum device 8, the excited chlorine of the $Cl_2$ gas plasma 47 in the second excitation chamber 44 is fed to the etched member 41 inside the chamber 1 through the second opening portion 42. The excited chlorine causes an etching reaction to the etched member 41, forming a precursor ($M_xCl_y$) 22 inside the chamber 1. At this time, the etched member 41 is maintained at a predetermined temperature (e.g., 200 to 400° C.), which is higher than the temperature of the substrate 3, by a heater 50 provided in the ceiling board 30.

In the excitation chamber 16, the $NH_3$ gas is ionized to generate an $NH_3$ gas plasma 23. The excited ammonia of the $NH_3$ gas plasma 23 in the excitation chamber 16 is fed to the precursor ($M_xCl_y$) 22 inside the chamber 1 through the opening portion 14. As a result, the metal component of the precursor ($M_xCl_y$) 22 and ammonia react to form a metal nitride (MN). At this time, the excitation chamber 16 is maintained by the plasma at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the etched member 41. The precursor ($M_xCl_y$) 22 transported toward the substrate 3 is converted into only metal (M) ions by a reduction reaction, and directed at the substrate 3 to form a thin M film 25 on the thin MN film 24 placed on the substrate 3. A barrier metal film 26 is composed of the thin MN film 24 and the thin M film 25 (see FIG. 2). The gases and the etching products that have not been involved in the reactions are exhausted through an exhaust port 27.

With the above-described barrier metal film production apparatus, similar to the first embodiment and the second embodiment, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

Furthermore, the $Cl_2$ gas plasma 47 is generated in the second excitation chamber 44 isolated from the chamber 1. Thus, the substrate 3 is not exposed to the plasma any more, and the substrate 3 becomes free from damage from the plasma.

As the means for generating the $Cl_2$ gas plasma 47 in the second excitation chamber 44, namely, the means for exciting the source gas to convert it into an excited source gas, it is possible to use microwaves, laser, electron rays, or synchrotron radiation. It is also permissible to form the precursor by heating the metal filament to a high temperature. The construction for isolating the $Cl_2$ gas plasma 47 from the substrate 3 may be the provision of the second excitation chamber 44 in the passage 43, as stated above, or may be other construction, for example, the isolation of the chamber 1.

Figure 7:
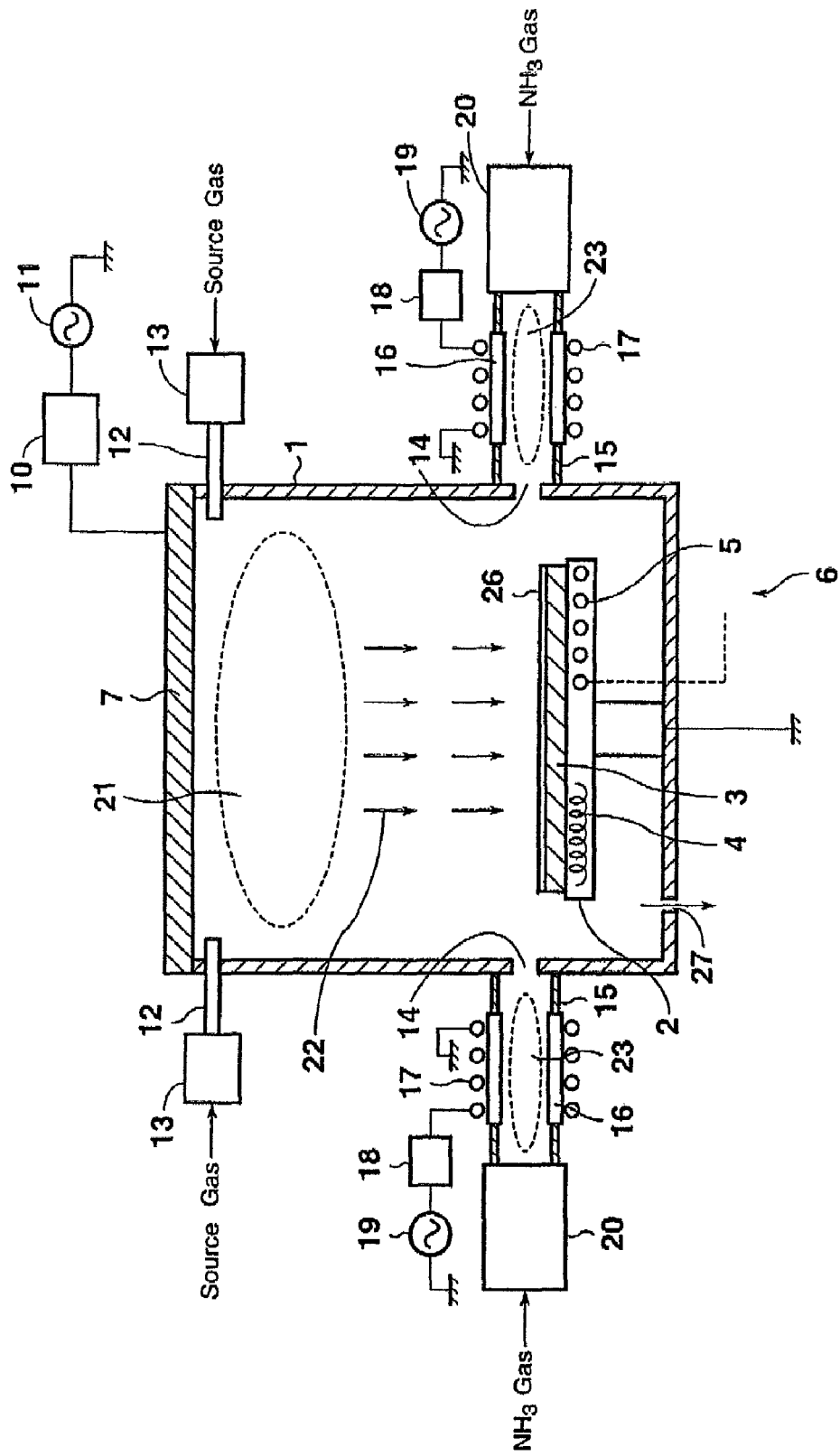
FIG. 7 is a schematic side view of a barrier metal film production apparatus according to a fourth embodiment of the present invention.

A barrier metal film production apparatus and a barrier metal film production method according to the fourth embodiment of the present invention will be described with reference to FIG. 7. FIG. 7 is a schematic side view of a barrier metal film production apparatus according to the fourth embodiment of the present invention. The same members as the members illustrated in FIG. 1 are assigned the same numerals, and duplicate explanations are omitted.

Compared with the barrier metal film production apparatus of the first embodiment shown in FIG. 1, the plasma antenna 9 is not provided around the cylindrical portion of the chamber 1, and the matching instrument 10 and power source 11 are connected to the metal member 7 for supply of power to the metal member 7.

With the above-described barrier metal film production apparatus, the source gas is supplied from the nozzle 12 into the chamber 1, and electromagnetic waves are shot from the metal member 7 into the chamber 1, whereby the $Cl_2$ gas is ionized to generate a $Cl_2$ gas plasma (source gas plasma) 21. The $Cl_2$ gas plasma 21 causes an etching reaction to the metal member 7, forming a precursor ($M_xCl_y$) 22. At this time, the metal member 7 is maintained at a temperature (e.g., 200 to 400° C.), which is higher than the temperature of the substrate 3, by temperature control means (not shown).

In the excitation chamber 16, the $NH_3$ gas is ionized to generate an $NH_3$ gas plasma 23. The excited ammonia of the $NH_3$ gas plasma 23 in the excitation chamber 16 is fed to the precursor ($M_xCl_y$) 22 inside the chamber 1 through the opening portion 14. As a result, the metal component of the precursor ($M_xCl_y$) 22 and ammonia react to form a metal nitride (MN). At this time, the excitation chamber 16 is maintained by the plasma at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $NH_3$ gas and the supply of power to the power source 19 are cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the thin MN film 24 placed on the substrate 3. A barrier metal film 26 is composed of the thin MN film 24 and the thin M film 25 (see FIG. 2). The gases and the etching products that have not been involved in the reactions are exhausted through an exhaust port 27.

With the above-described barrier metal film production apparatus, similar to the first embodiment to the third embodiment, the metal is formed by plasmas to produce the barrier metal film 26. Thus, the barrier metal film 26 can be formed uniformly to a small thickness. Consequently, the barrier metal film 26 can be formed highly accurately at a high speed with excellent burial properties in a very small thickness even to the interior of a tiny depression, for example several hundred nanometers wide, which has been provided in the substrate 3.

Furthermore, the metal member 7 itself is applied as an electrode for plasma generation. Thus, the plasma antenna 9 need not be provided around the cylindrical portion of the chamber 1, and the degree of freedom of the construction in the surroundings can be increased.

Figure 8:
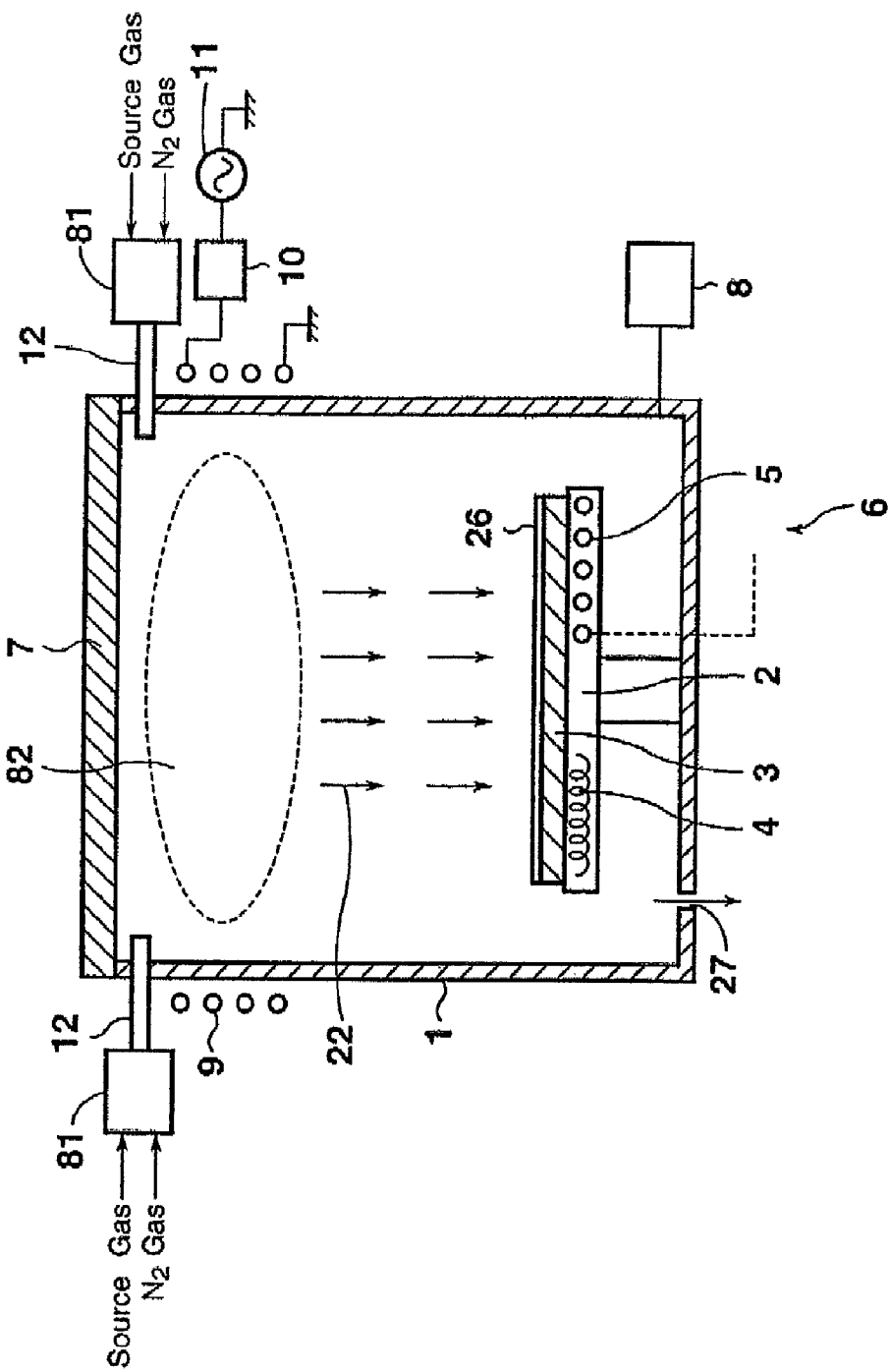
FIG. 8 is a schematic side view of a barrier metal film production apparatus according to a fifth embodiment of the present invention.

A barrier metal film production apparatus and a barrier metal film production method according to the fifth embodiment of the present invention will be described with reference to FIG. 8. FIG. 8 is a schematic side view of the barrier metal film production apparatus according to the fifth embodiment of the present invention. The same members as the members illustrated in FIG. 1 are assigned the same numerals, and duplicate explanations are omitted.

Compared with the first embodiment shown in FIG. 1, the barrier metal film production apparatus shown in FIG. 8 lacks the opening portion 14, passage 15, excitation chamber 16, plasma antenna 17, matching instrument 18, power source 19 and flow controller 20. Nozzles 12 for supplying a gas mixture of a source gas ($Cl_2$ gas) and a nitrogen gas ($N_2$ gas) as a nitrogen-containing gas to the interior of the chamber 1 are connected to the cylindrical portion of the chamber 1. The $Cl_2$ gas and the $N_2$ gas are mixed in a mixed gas flow controller 81, and the gas mixture of the $Cl_2$ gas and the $N_2$ gas is supplied to the nozzle 12 via the mixed gas flow controller 81. Other constructions are the same as in the first embodiment.

With the above-described barrier metal film production apparatus, the mixed gas comprising the $Cl_2$ gas and the $N_2$ gas is supplied through the nozzles 12 to the interior of the chamber 1, and electromagnetic waves are shot from the plasma antenna 9 into the chamber 1. As a result, the $Cl_2$ gas and the $N_2$ gas are ionized to generate a $Cl_2$ gas/$N_2$ gas plasma 82. The $Cl_2$ gas/$N_2$ gas plasma 82 causes an etching reaction to the metal member 7, forming a precursor ($M_xCl_y$: M is a metal such as W, Ti, Ta or TiSi) 22. Also, the precursor 22 and $N_2$ react to form a metal nitride (MN). At this time, the metal member 7 is maintained by the plasma (or temperature control means (not shown)) at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the surface of the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the first embodiment are obtained. In addition, the supply line for the gases can be simplified, and the number of the plasma sources can be decreased. Thus, the cost of the product can be reduced.

Figure 9:
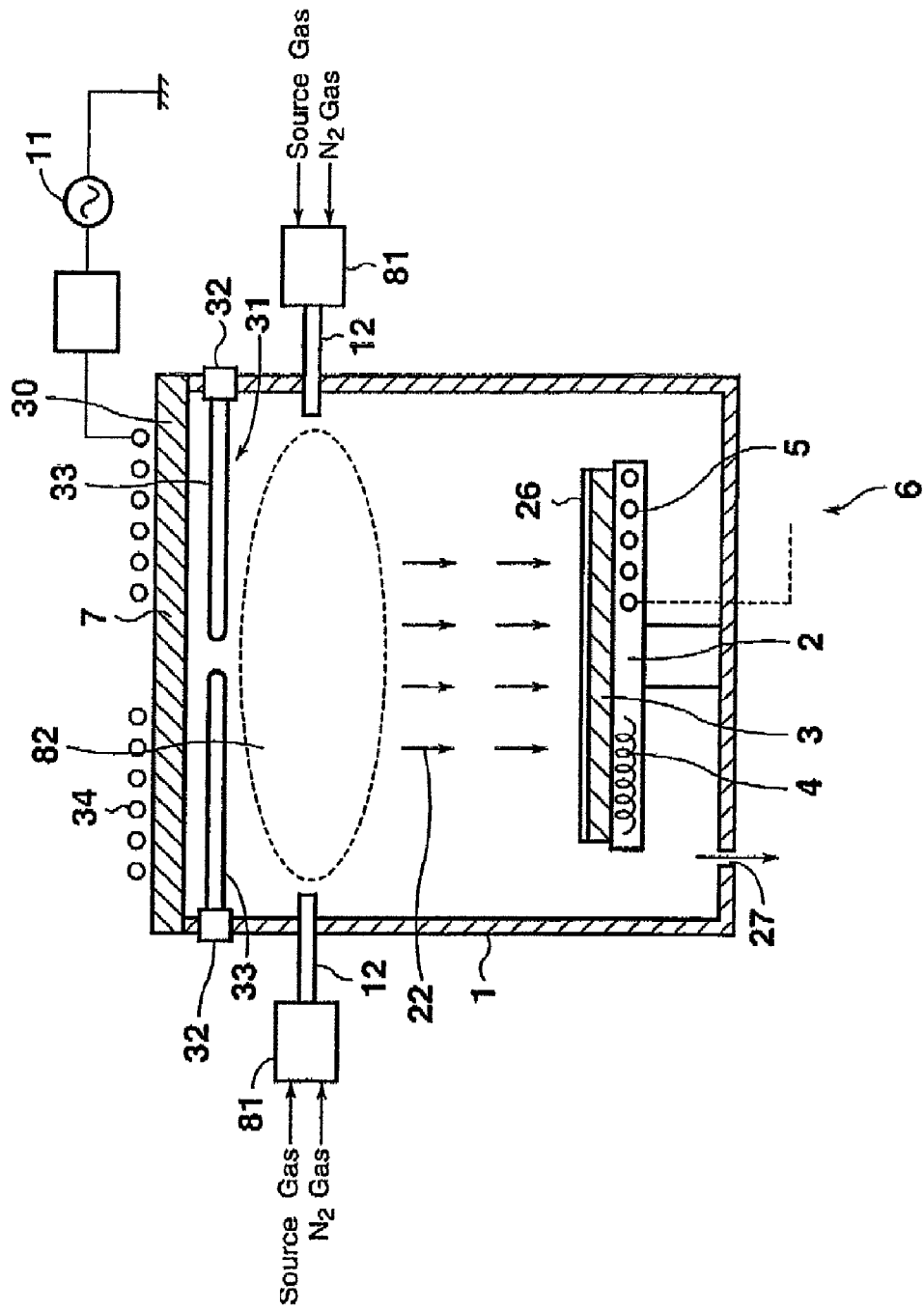
FIG. 9 is a schematic side view of a barrier metal film production apparatus according to a sixth embodiment of the present invention.

The sixth embodiment of a barrier metal film production apparatus and a barrier metal film production method according to the present invention will be described with reference to FIG. 9. FIG. 9 is a schematic side view of the barrier metal film production apparatus according to the sixth embodiment of the present invention. The same members as in the second and fifth embodiments illustrated in FIGS. 3 to 5 and 8 are assigned the same numerals, and duplicate explanations are omitted.

Compared with the second embodiment shown in FIG. 3, the barrier metal film production apparatus shown in FIG. 9 lacks the opening portion 14, passage 15, excitation chamber 16, plasma antenna 17, matching instrument 18, power source 19 and flow controller 20. Nozzles 12 for supplying a gas mixture of a source gas ($Cl_2$ gas) and a nitrogen gas ($N_2$ gas) as a nitrogen-containing gas to the interior of the chamber 1 are connected to the cylindrical portion of the chamber 1. The $Cl_2$ gas and the $N_2$ gas are mixed in a mixed gas flow controller 81, and the gas mixture of the $Cl_2$ gas and the $N_2$ gas is supplied to the nozzle 12 via the mixed gas flow controller 81. Other constructions are the same as in the second embodiment.

With the above-described barrier metal film production apparatus, the mixed gas comprising the $Cl_2$ gas and the $N_2$ gas is supplied through the nozzles 12 to the interior of the chamber 1, and electromagnetic waves are shot from the plasma antenna 34 into the chamber 1. As a result, the $Cl_2$ gas and the $N_2$ gas are ionized to generate a $Cl_2$ gas/$N_2$ as plasma 82. The etched member 31, an electric conductor, is present below the plasma antenna 34. As stated earlier, however, the $Cl_2$ gas/$N_2$ gas plasma 82 occurs stably between the etched member 31 and the substrate 3, namely, below the etched member 31.

The $Cl_2$ gas/$N_2$ gas plasma 82 causes an etching reaction to the etched member 31, forming a precursor ($M_xCl_y$: M is a metal such as W, Ti, Ta or TiSi) 22. Also, the precursor 22 and $N_2$ react to form a metal nitride (MN). At this time, the etched member 31 is maintained by the plasma (or temperature control means (not shown)) at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the etched member 31. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the second embodiment are obtained. In addition, the supply line for the gases can be simplified, and the number of the plasma sources can be decreased. Thus, the cost of the product can be reduced.

Figure 10:
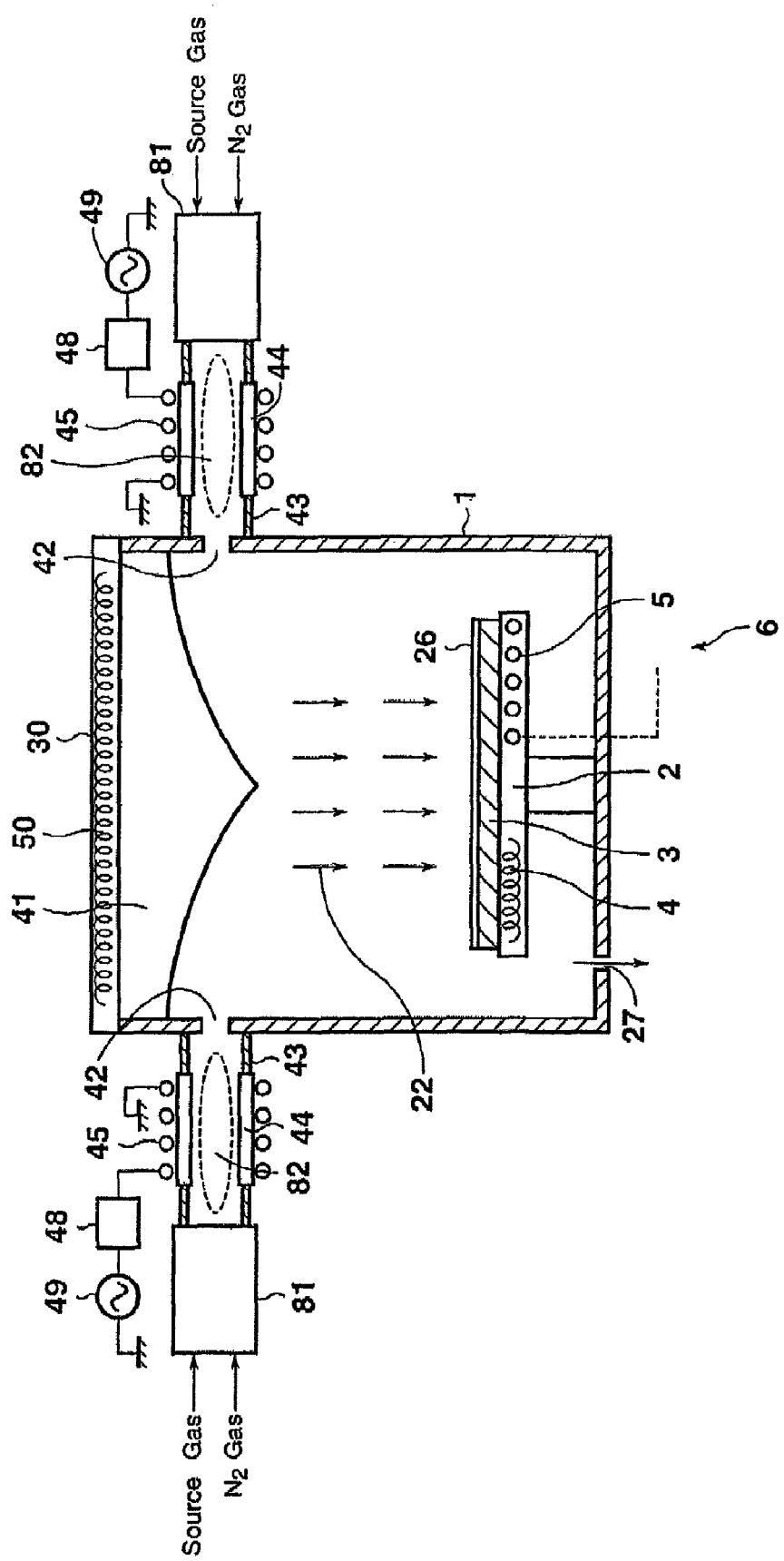
FIG. 10 is a schematic side view of a barrier metal film production apparatus according to a seventh embodiment of the present invention.

The seventh embodiment of a barrier metal film production apparatus and a barrier metal film production method according to the present invention will be described with reference to FIG. 10. FIG. 10 is a schematic side view of the barrier metal film production apparatus according to the seventh embodiment of the present invention. The same members as in the third and fifth embodiments illustrated in FIGS. 6 and 8 are assigned the same numerals, and duplicate explanations are omitted.

Compared with the third embodiment shown in FIG. 6, the barrier metal film production apparatus shown in FIG. 10 lacks the opening portion 14, passage 15, excitation chamber 16, plasma antenna 17, matching instrument 18, power source 19 and flow controller 20. A gas mixture of a source gas ($Cl_2$ gas) and a nitrogen gas ($N_2$ gas) as a nitrogen-containing gas is supplied from a mixed gas flow controller 81 to a second excitation chamber 44. Other constructions are the same as in the third embodiment.

With the above-described barrier metal film production apparatus, the mixed gas comprising the $Cl_2$ gas and the $N_2$ gas is supplied into a second passage 43 via the mixed gas flow controller 81, and fed into the second excitation chamber 44. Electromagnetic waves are shot from a second plasma antenna 45 into the second excitation chamber 44. As a result, the $Cl_2$ gas and the $N_2$ gas are ionized to generate a $Cl_2$ gas/$N_2$ gas plasma 82. Since a predetermined differential pressure has been established between the pressure inside the chamber 1 and the pressure inside the second excitation chamber 44 by the vacuum device 8, the excited chlorine and excited nitrogen of the $Cl_2$ gas/$N_2$ gas plasma 82 in the second excitation chamber 44 are fed to the etched member 41 inside the chamber 1 through the second opening portion 42. The excited chlorine causes an etching reaction to the etched member 41, forming a precursor ($M_xCl_y$) 22 inside the chamber 1. Also, the precursor 22 and the excited nitrogen react to form a metal nitride (MN). At this time, the etched member 41 is maintained at a predetermined temperature (e.g., 200 to 400° C.), which is higher than the temperature of the substrate 3, by a heater 50 provided in a ceiling board 30.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the etched member 41. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the third embodiment are obtained. In addition, the supply line for the gases can be simplified, and the number of the plasma sources can be decreased. Thus, the cost of the product can be reduced.

Figure 11:
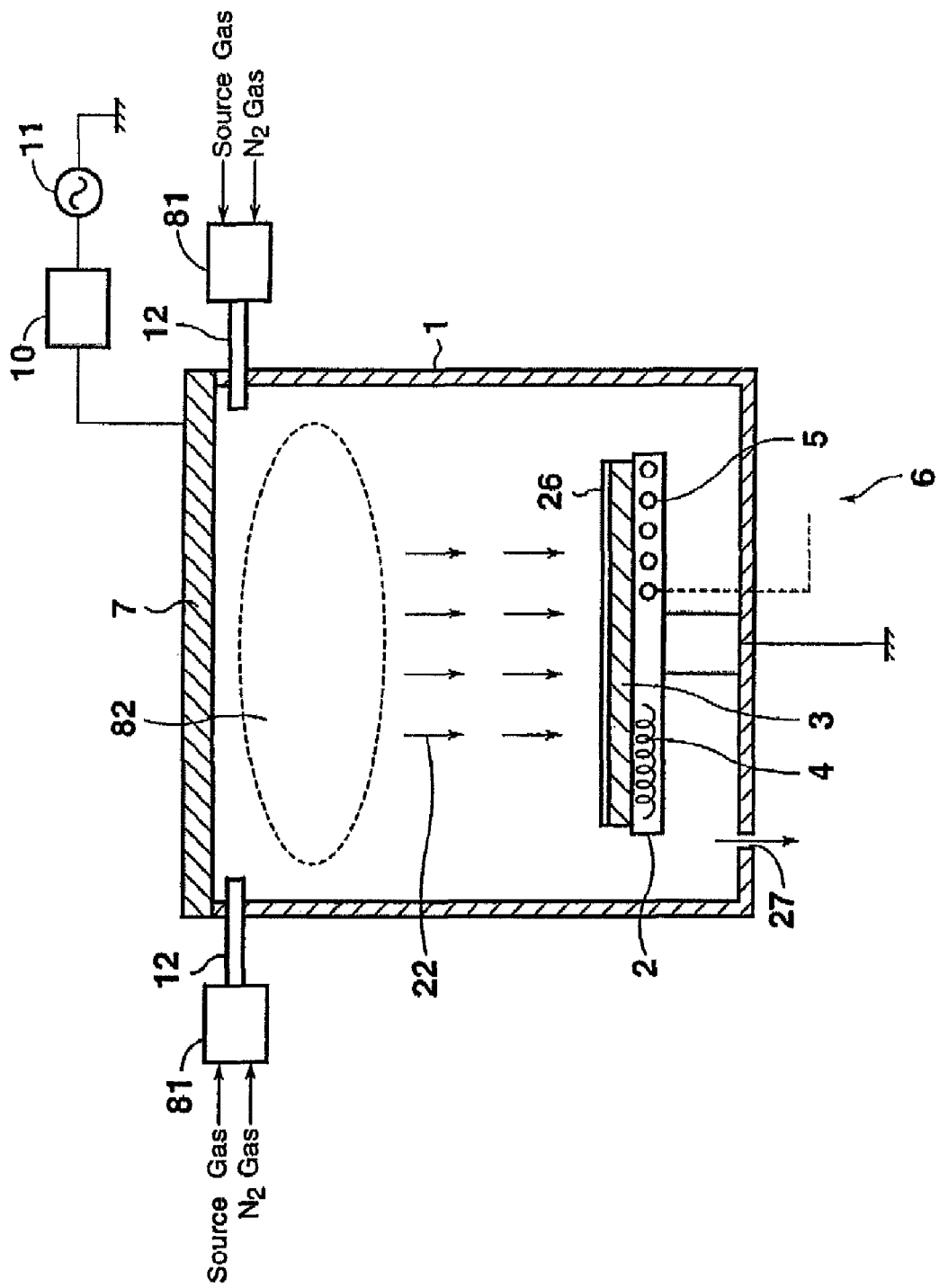
FIG. 11 is a schematic side view of a barrier metal film production apparatus according to an eighth embodiment of the present invention.

The eighth embodiment of a barrier metal film production apparatus and a barrier metal film production method according to the present invention will be described with reference to FIG. 11. FIG. 11 is a schematic side view of the barrier metal film production apparatus according to the eighth embodiment of the present invention. The same members as in the fourth embodiment and the fifth embodiment illustrated in FIGS. 7 and 8 are assigned the same numerals, and duplicate explanations are omitted.

Compared with the fourth embodiment shown in FIG. 7, the barrier metal film production apparatus shown in FIG. 11 lacks the opening portion 14, passage 15, excitation chamber 16, plasma antenna 17, matching instrument 18, power source 19 and flow controller 20. Nozzles 12 for supplying a gas mixture of a source gas ($Cl_2$ gas) and a nitrogen gas ($N_2$ gas) as a nitrogen-containing gas to the interior of the chamber 1 are connected to the cylindrical portion of the chamber 1. The $Cl_2$ gas and the $N_2$ gas are mixed in a mixed gas flow controller 81, and the gas mixture of the $Cl_2$ gas and the $N_2$ gas is supplied to the nozzle 12 via the mixed gas flow controller 81. Other constructions are the same as in the fourth embodiment.

With the above-described barrier metal film production apparatus, the mixed gas comprising the $Cl_2$ gas and the $N_2$ gas is supplied through the nozzles 12 to the interior of the chamber 1, and electromagnetic waves are shot from the metal member 7 into the chamber 1. As a result, the $Cl_2$ gas and the $N_2$ gas are ionized to generate a $Cl_2$ gas/$N_2$ gas plasma 82. The $Cl_2$ gas/$N_2$ gas plasma 82 causes an etching reaction to the metal member 7, forming a precursor ($M_xCl_y$: M is a metal such as W, Ti, Ta or TiSi) 22. Also, the precursor 22 and $N_2$ react to form a metal nitride (MN). At this time, the metal member 7 is maintained by the plasma (or temperature control means (not shown)) at a predetermined temperature (e.g., 200 to 400° C.) which is higher than the temperature of the substrate 3.

The metal nitride (MN) formed within the chamber 1 is transported toward the substrate 3 controlled to a low temperature, whereby a thin MN film 24 is formed on the surface of the substrate 3. After the thin MN film 24 is formed, the supply of the $N_2$ gas to the mixed gas flow controller 81 is cut off. Thus, the precursor ($M_xCl_y$) 22 is transported toward the substrate 3 controlled to a lower temperature than the temperature of the metal member 7. The precursor ($M_xCl_y$) 22 transported toward the substrate 3 is converted into only metal (M) ions by a reduction reaction, and directed at the substrate 3 to form a thin M film 25 on the thin MN film 24 on the substrate 3. A barrier metal film 26 is composed of the thin MN film 24 and the thin M film 25 (see FIG. 2).

The substrate 3, on which the barrier metal film 26 has been formed, is to have a thin copper (Cu) film or a thin aluminum (Al) film formed on the barrier metal film 26 by a film forming device. Because of the presence of the barrier metal film 26, there arise advantages, for example, such that the thin MN film 24 eliminates diffusion of Cu into the substrate 3, and the thin M film 25 ensures adhesion of Cu.

If the material to be formed as a film is a material unproblematic in terms of adhesion (e.g., Al), or if it is a metal to which the nitride can retain adhesion, the thin M film 25 can be omitted from the barrier metal film 26.

With the above-described barrier metal film production apparatus, the same effects as in the fourth embodiment are obtained. In addition, the supply line for the gases can be simplified, and the number of the plasma sources can be decreased. Thus, the cost of the product can be reduced.

In the foregoing fifth to eighth embodiments, the $N_2$ gas is mixed with the $Cl_2$ gas in the mixed gas flow controller 81, and the gas mixture is supplied into the chamber 1. However, the $N_2$ gas and the $Cl_2$ gas can be supplied through separate nozzles. Also, ammonia can be applied as the nitrogen-containing gas.

Figure 12:
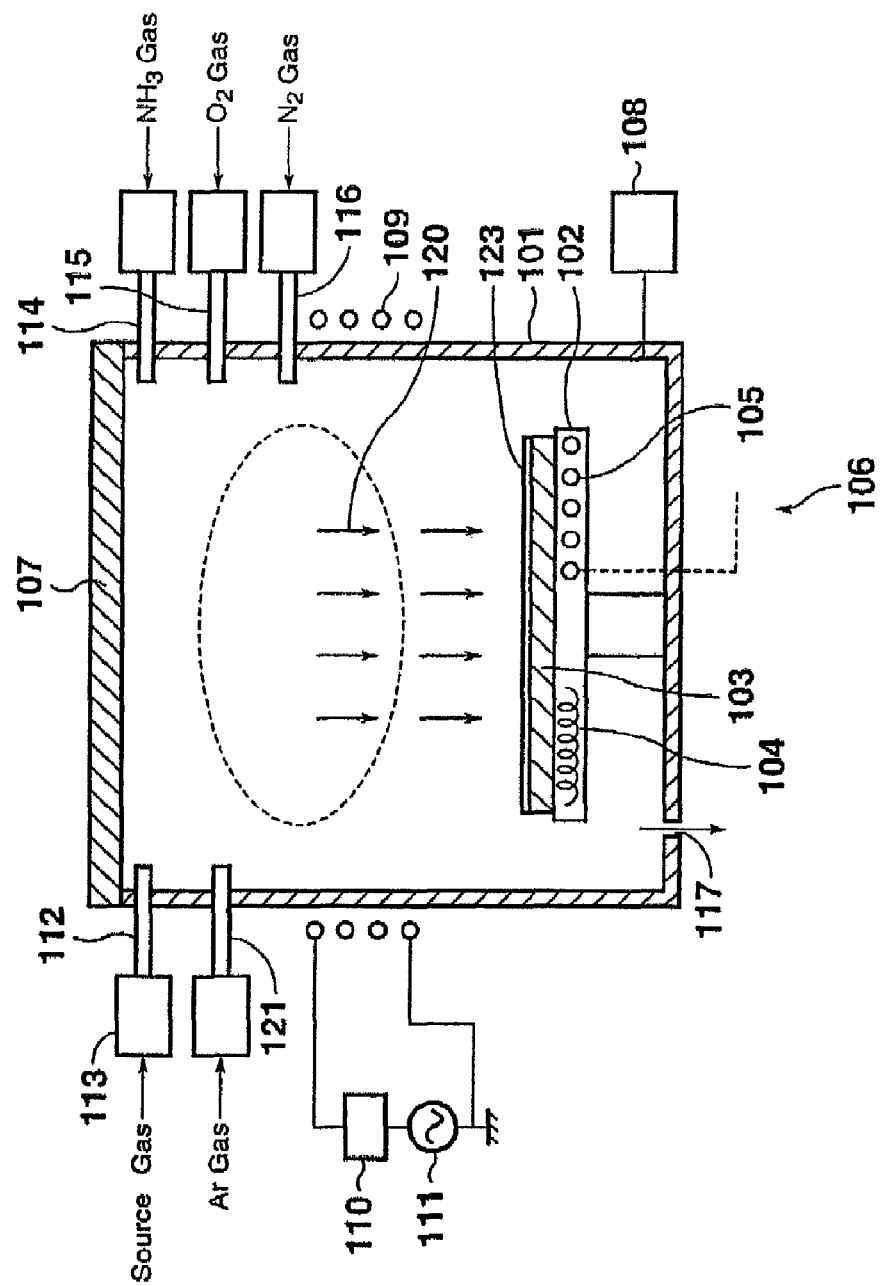
FIG. 12 is a schematic side view of a barrier metal film production apparatus according to a ninth embodiment of the present invention.
Figure 13:
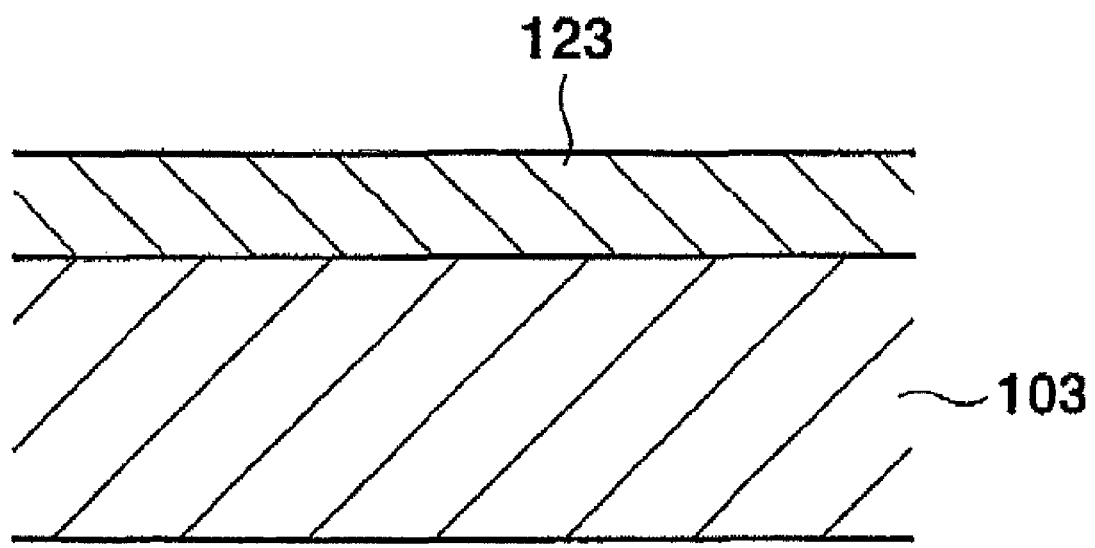
FIG. 13 is a sectional view of a substrate illustrating a barrier metal film.
Figure 14:
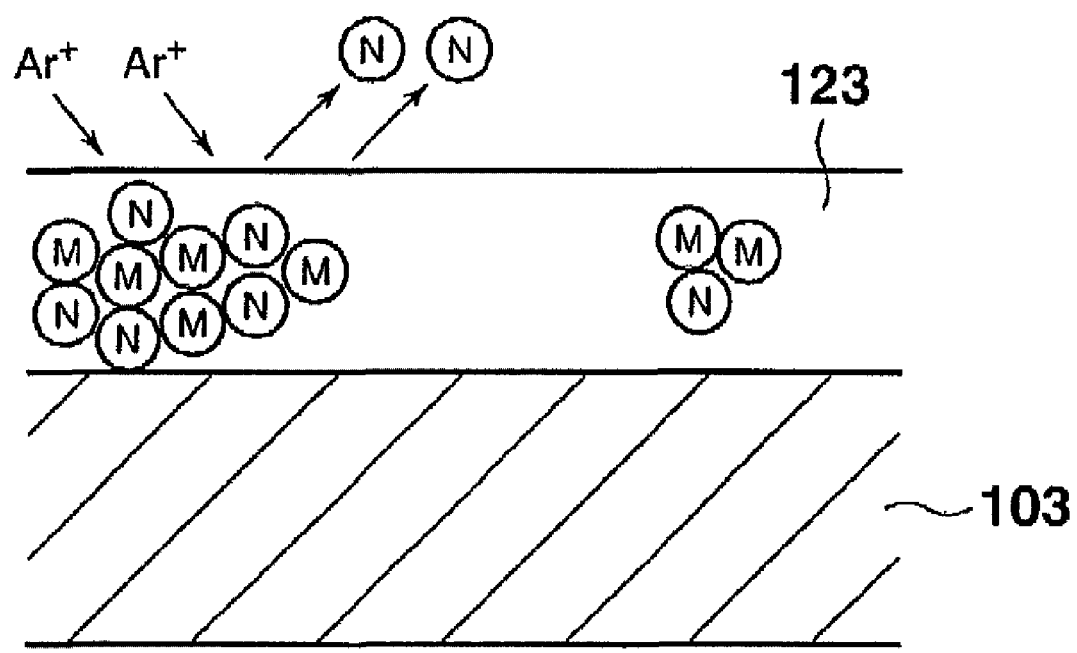
FIG. 14 is a concept view of a barrier metal film in a treatment for denitrification.
Figure 15:
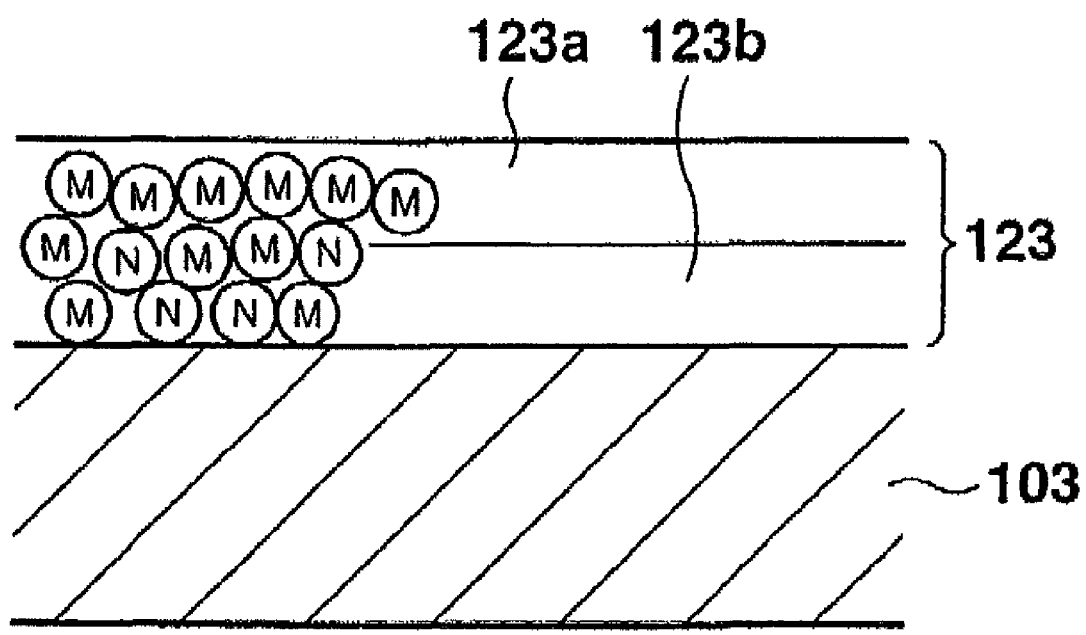
FIG. 15 is a concept view of the barrier metal film in the treatment for denitrification.
Figure 16:
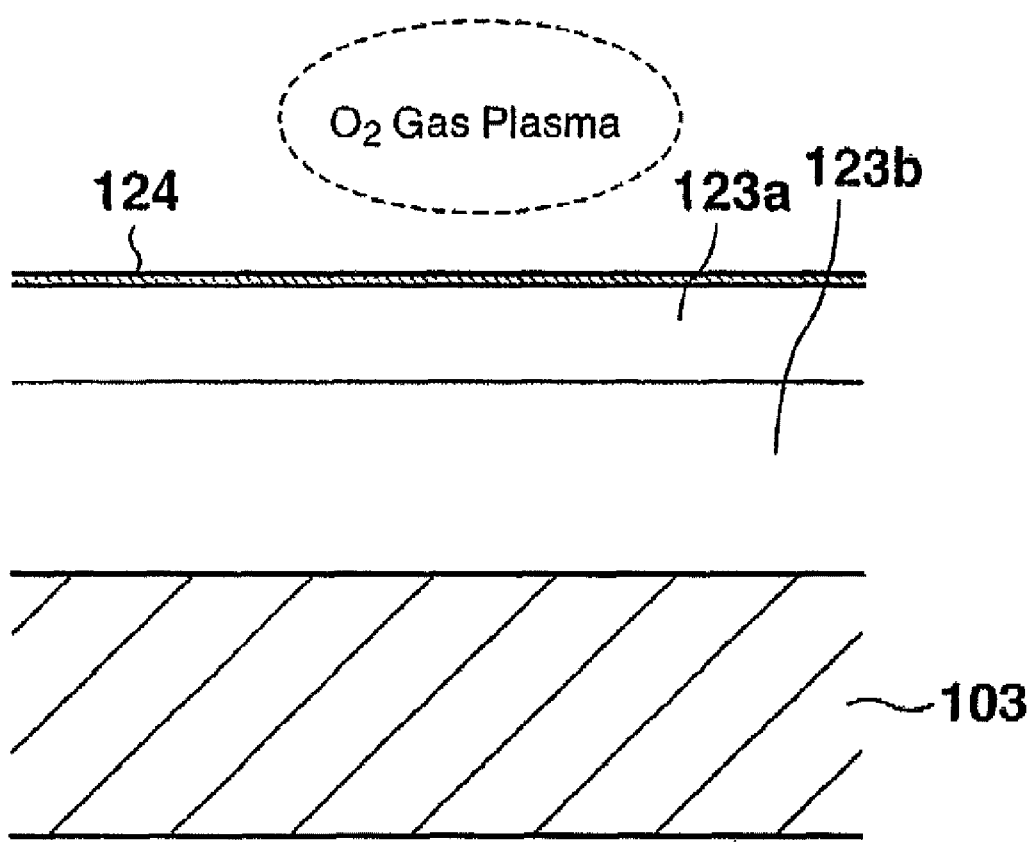
FIG. 16 is a concept view of a barrier metal film in a treatment for oxide layer formation.
Figure 17:
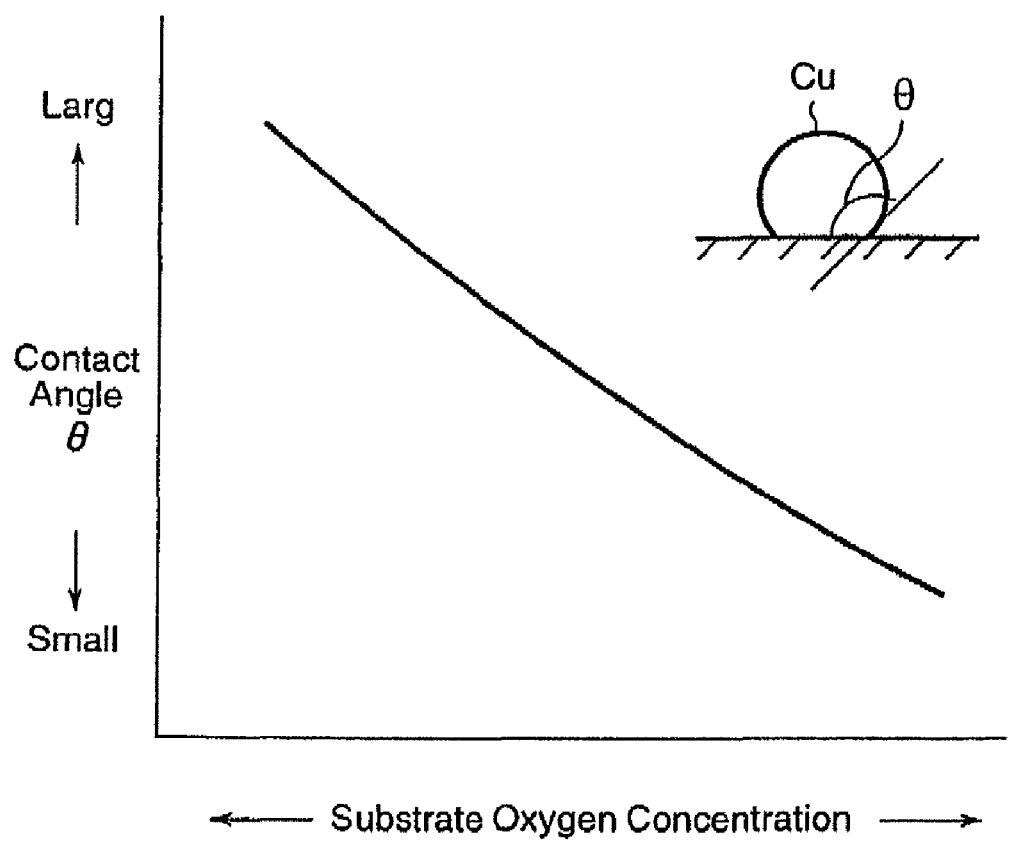
FIG. 17 is a graph representing the relationship between the contact angle of copper particles and the oxygen concentration of the substrate.
Figure 18:
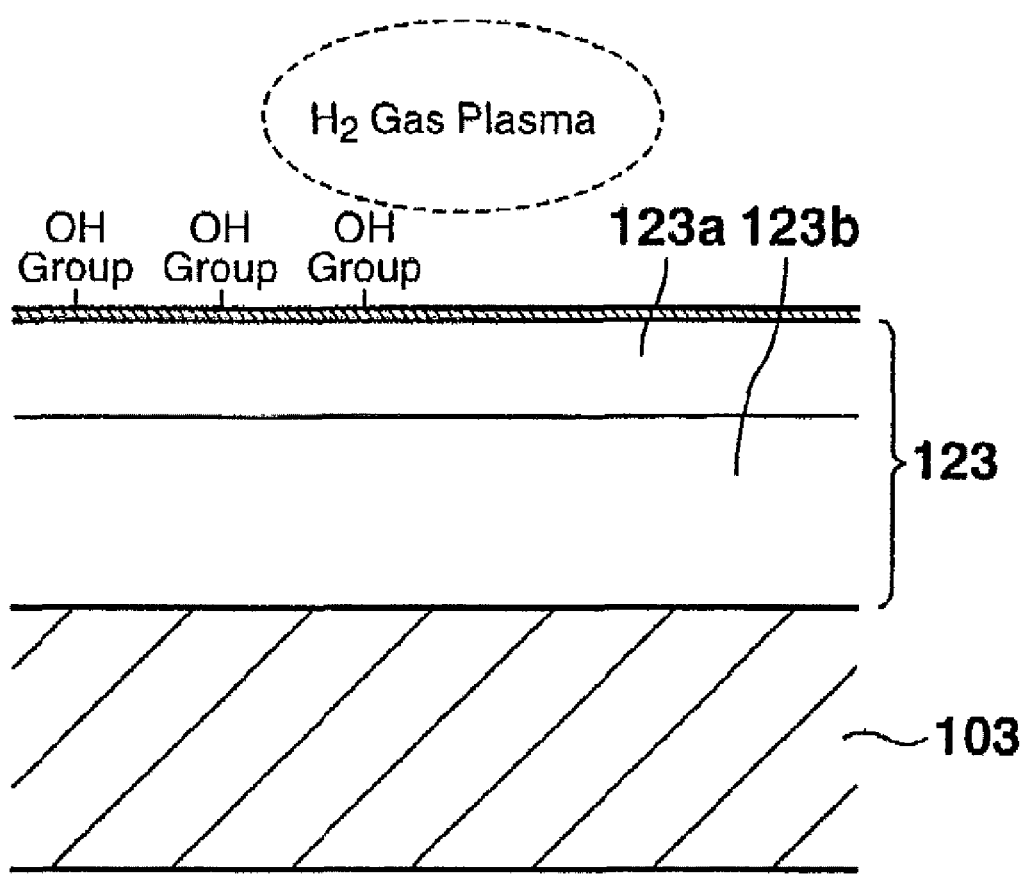
FIG. 18 is a concept view of a barrier metal film in a treatment for hydroxyl group formation.
Figure 19:
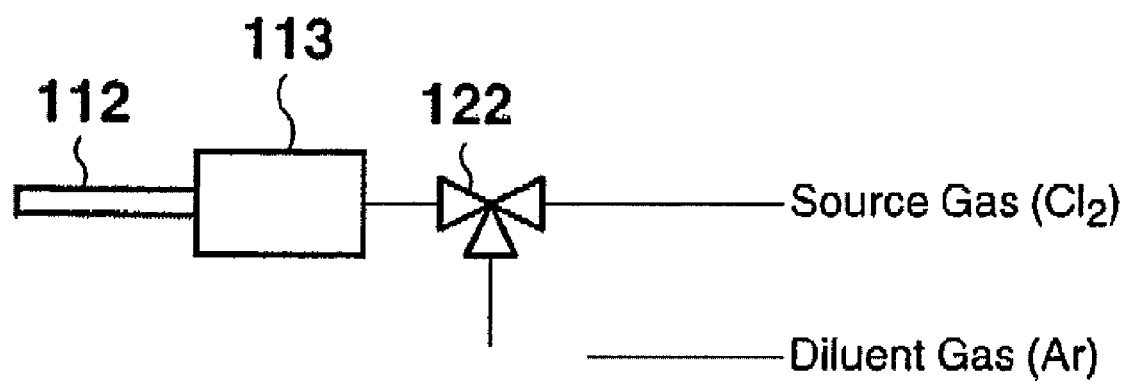
FIG. 19 is a schematic construction drawing showing another example of diluent gas supply means.

The ninth embodiment of the barrier metal film production apparatus and barrier metal film production method of the present invention will be described with reference to FIGS. 12 and 18. FIG. 12 is a schematic side view of the barrier metal film production apparatus according to the ninth embodiment of the present invention. FIG. 13 shows the sectional status of a substrate illustrating a barrier metal film. FIGS. 14 and 15 show the concept status of a barrier metal film in denitrification. FIG. 16 shows the concept status of a barrier metal film in oxide layer formation. FIG. 17 represents the relationship between the contact angle of copper particles and the oxygen concentration of the substrate. FIG. 18 shows the concept status of a barrier metal film in hydroxyl group formation. FIG. 19 schematically shows a construction illustrating another example of diluent gas supply means.

As shown in FIG. 12, a support platform 102 is provided near the bottom of a cylindrical chamber 101 made of, say, a ceramic (an insulating material), and a substrate 103 is placed on the support platform 102. Temperature control means 106, as control means, equipped with a heater 104 and refrigerant flow-through means 105 is provided in the support platform 102 so that the support platform 102 is controlled to a predetermined temperature (for example, a temperature at which the substrate 103 is maintained at 100 to 200° C.) by the temperature control means 106.

An upper surface of the chamber 101 is an opening, which is closed with a metal member 107, as an etched member, made of a metal (e.g., W, Ti, Ta, or TiSi). The interior of the chamber 101 closed with the metal member 107 is maintained at a predetermined pressure by a vacuum device 108. A plasma antenna 109, as a coiled winding antenna of plasma generation means, is provided around a cylindrical portion of the chamber 101. A matching instrument 110 and a power source 111 are connected to the plasma antenna 109 to supply power.

A nozzle 112, as source gas supply means, for supplying a source gas (a $Cl_2$ gas diluted with He or Ar to a chlorine concentration of $\leq 50\%$, preferably about 10%), containing chlorine as a halogen, to the interior of the chamber 101 is connected to the cylindrical portion of the chamber 101 below the metal member 107. The nozzle 112 is fed with the source gas via a flow controller 113. The source gas is supplied from the nozzle 112, and electromagnetic waves are shot from the plasma antenna 109 into the chamber 101, whereby the $Cl_2$ gas is ionized to generate a $Cl_2$ gas plasma (plasma generation means). Fluorine (F), bromine (Br) or iodine (I) can also be applied as the halogen to be incorporated into the source gas.

A nozzle 114, as nitrogen-containing gas supply means, for supplying an ammonia gas ($NH_3$ gas) as a nitrogen-containing gas, to the interior of the chamber 101 is connected to the cylindrical portion of the chamber 101 below the metal member 107. The $NH_3$ gas is supplied from the nozzle 114, and electromagnetic waves are shot from the plasma antenna 109 into the chamber 101, whereby the $NH_3$ gas is ionized to generate an $NH_3$ gas plasma (plasma generation means).

A diluent gas nozzle 121 is provided, as diluent gas supply means, for supplying an Ar gas as a diluent gas, to the interior of the chamber 101 above the surface of the substrate 103. The Ar gas is supplied from the diluent gas nozzle 121, and electromagnetic waves are shot from the plasma antenna 109 into the chamber 101, whereby the Ar gas is ionized to generate an Ar gas plasma (surface treatment plasma generation means).

As described above, the diluent gas supply means applies the Ar gas as the diluent gas for the $Cl_2$ gas. In this case, as shown in FIG. 19, a control valve 122 may be provided at the site of merger between the source gas ($Cl_2$ gas) and the diluent gas (Ar gas) so that the $Cl_2$ gas is stopped during generation of the Ar gas plasma, and only the Ar gas is supplied through the nozzle 112. According to this construction, there is no need for the provision of the diluent gas nozzle 121, presenting advantage in space.

An oxygen gas nozzle 115 is provided, as oxygen gas supply means, for supplying an oxygen gas ($O_2$ gas) to the interior of the chamber 101 above the surface of the substrate 103. The $O_2$ gas is supplied from the oxygen gas nozzle 115, and electromagnetic waves are shot from the plasma antenna 109 into the chamber 101, whereby the $O_2$ gas is ionized to generate an $O_2$ gas plasma (oxygen plasma generation means).

Furthermore, a hydrogen gas nozzle 116 is provided, as hydrogen gas supply means, for supplying a hydrogen gas ($H_2$ gas) to the interior of the chamber 101 above the surface of the substrate 103. The $H_2$ gas is supplied from the hydrogen gas nozzle 116, and electromagnetic waves are shot from the plasma antenna 109 into the chamber 101, whereby the $H_2$ gas is ionized to generate an $H_2$ gas plasma (hydroxyl group plasma generation means).

With the above-described barrier metal film production apparatus, the source gas is supplied through the nozzle 112 to the interior of the chamber 101, and electromagnetic waves are shot from the plasma antenna 109 into the chamber 101. As a result, the $Cl_2$ gas is ionized to generate a $Cl_2$ gas plasma (source gas plasma). The $Cl_2$ gas plasma causes an etching reaction to the metal member 107, forming a precursor ($M_x$-$Cl_y$: M is a metal such as W, Ti, Ta or TiSi) 120. The metal member 107 is maintained by the plasma at a predetermined temperature (e.g., 200 to 400° C.) which is higher than the temperature of the substrate 103.

Also, the $NH_3$ gas is supplied into the chamber 101 through the nozzle 114, and electromagnetic waves are shot from the plasma antenna 109 into the chamber 101. Thus, the $NH_3$ gas is ionized to generate an $NH_3$ gas plasma, which causes a reduction reaction with the precursor 120, forming a metal nitride (MN). The metal nitride (MN) formed within the chamber 101 is transported toward the substrate 103 controlled to a low temperature, whereupon MN is formed into a film on the surface of the substrate 103 to produce a barrier metal film 123 (see FIG. 13).

The reaction for formation of the barrier metal film 123 can be expressed by:

$$2MCl+2NH_3 \rightarrow 2MN\downarrow+HCl\uparrow+2H_2\uparrow$$

The gases and the etching products that have not been involved in the reaction are exhausted through an exhaust port 117.

After the barrier metal film 1123 has been formed, the Ar gas is supplied from the diluent gas nozzle 121, and electromagnetic waves are shot from the plasma antenna 109 into the chamber 101, thereby generating an Ar gas plasma. On the surface of the substrate 103, the barrier metal film 123 of MN has been formed, as shown in FIG. 14. Thus, upon generation of the Ar gas plasma, Ar$^+$ etches the barrier metal film 123 on the surface of the substrate 103, thereby performing a treatment for removing the nitrogen atoms (N) of the MN in the superficial layer to decrease the nitrogen content of the superficial layer relative to the interior of the matrix of the barrier metal film 123 (denitrification).

As shown in FIG. 14, the barrier metal film 123 comprises M and N in an amorphous state. In this state, N of a lower mass is preferentially removed by Ar$^+$, so that the superficial layer of the barrier metal film 123 (for example, up to a half, preferably about a third, of the entire film thickness) is denitrified. As a result, there emerges the barrier metal film 123 of a two-layer structure, a metal layer 123a substantially composed of M, and an MN layer 123b, as shown in FIG. 15. On this occasion, the entire film thickness of the barrier metal film 123 remains the film thickness having the single layer.

Immediately before formation of the most superficial layer of the barrier metal film 123 is completed, a trace amount of O$_2$ gas is supplied through the oxygen gas nozzle 115 into the chamber 101. At the same time, electromagnetic waves are shot from the plasma antenna 109 into the chamber 101 to generate an O$_2$ gas plasma. As a result, an oxide layer 124 is formed on the surface of the metal layer 123a composed substantially of M, as shown in FIG. 16. Since the oxide layer 124 has been formed, if a metal (e.g., copper) is deposited (formed as a film) on the surface of the barrier metal film 123, wetting with the metal is satisfactory, thus increasing adhesion.

In detail, it has been confirmed, as shown in FIG. 17, that the higher the oxygen concentration of the substrate 103, the smaller the contact angle θ of a copper particle (the angle that takes minimal surface energy in the presence of a balanced surface tension when the substrate is considered to be a solid and copper is deemed to be a liquid). That is, as the oxygen concentration of the substrate 103 increases, the copper particle adheres in a collapsed state (a state of high wetting) to the surface of the substrate 103. Hence, the O$_2$ gas plasma is generated to form the oxide layer 124 on the surface of the metal layer 123a. By so doing, the oxygen concentration of the substrate 103 can be increased, leading to satisfactory wetting with the metal (copper) to be formed as a film.

After formation of the oxide layer 124 on the surface of the metal layer 123a, the H$_2$ gas is supplied from the hydrogen gas nozzle 116 into the chamber 101, and electromagnetic waves are shot from the plasma antenna 109 into the chamber 101, thereby generating an H$_2$ gas plasma. As a result, hydroxyl groups (OH groups) are formed on the surface of the oxide layer 124, as shown in FIG. 18. These hydroxyl groups increase hydrophilicity, and can further enhance the adhesion of the metal (copper) to be formed as a film.

With the above-described barrier metal film production apparatus, the metal is formed by the plasma to produce the barrier metal film 123. Thus, the barrier metal film 123 can be formed uniformly to a small thickness. Consequently, the barrier metal film 123 can be formed highly accurately at a high speed with excellent burial properties in a very small thickness even to the interior of a tiny depression, for example several hundred nanometers wide, which has been provided in the substrate 103.

Moreover, denitrification of the barrier metal film 123 is carried out by removing the nitrogen atoms with the Ar gas plasma. Thus, the barrier metal film 123 can be granted the two-layer structure, the metal layer 123a substantially composed of M, and the MN layer 123b. In addition, the entire film thickness can remain the film thickness constructed from the single layer. Thus, the barrier metal film 123 can be formed in a two-layer structure without being thickened. Of the two layers, the metal layer 123a can retain adhesion to a metal to be formed as a film on the surface thereof, while the MN layer (123b) can prevent diffusion of the metal. Hence, it becomes possible to produce the barrier metal film which can be formed with good adhesion to the metal to be formed as a film, with diffusion of the metal being eliminated.

Besides, the O$_2$ gas plasma is generated to form the oxide layer 124 on the surface of the metal layer 123a. Thus, when a metal is formed as a film on the surface of the barrier metal film 123, wetting with the metal is satisfactory, and adhesion of the metal can be increased. Additionally, the H$_2$ gas plasma is generated to form hydroxyl groups (OH groups) on the surface of the oxide layer 124. Thus, the hydrophilicity improves, and can further increase the adhesion of the metal to be formed as a film.

It is permissible to omit the step of generating the H$_2$ gas plasma to form hydroxyl groups (OH groups) on the surface of the oxide layer 124. It is also allowable to omit the step of generating the O$_2$ gas plasma to form the oxide layer 124 on the surface of the metal layer 123a.

Figure 20:
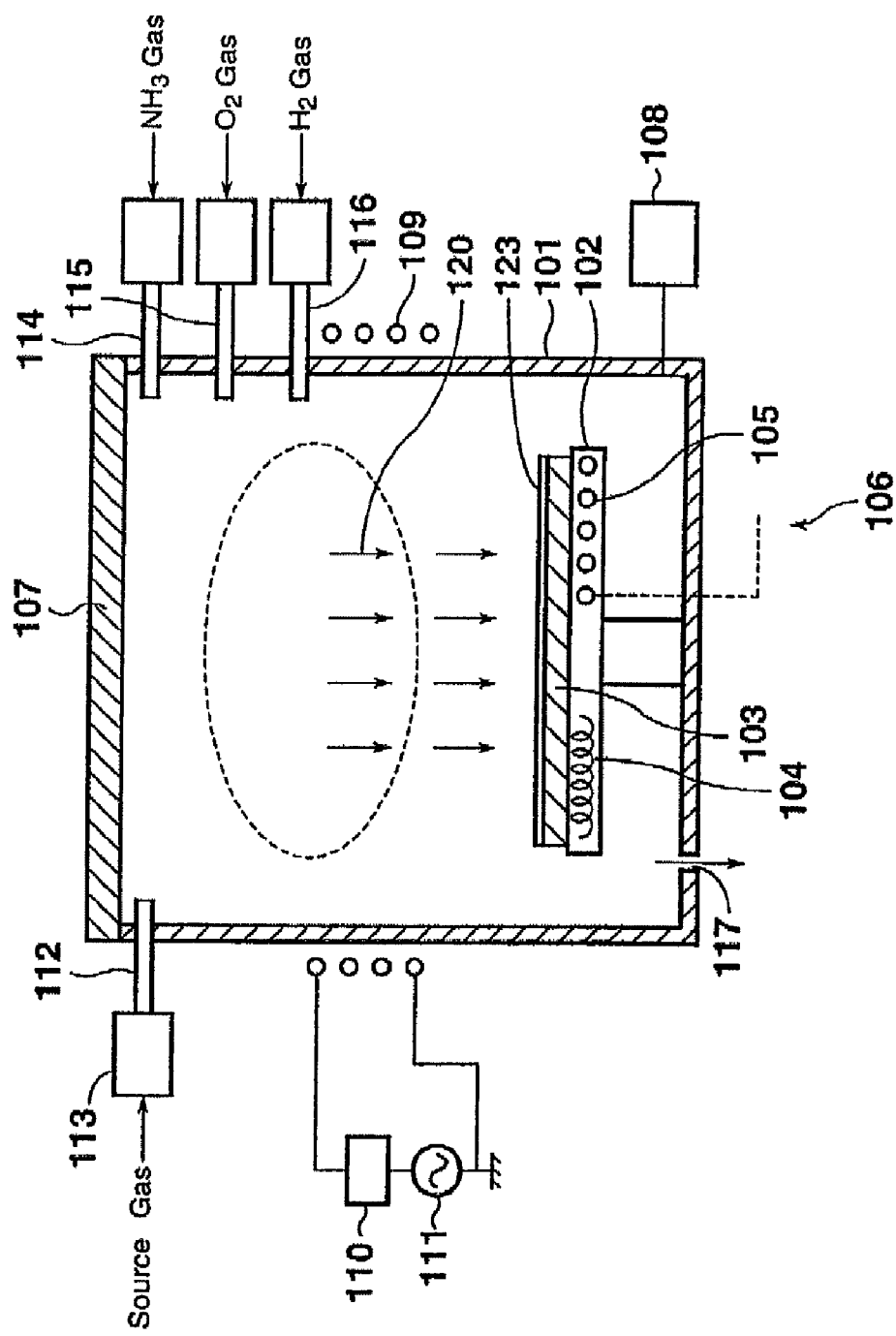
FIG. 20 is a schematic construction drawing of a barrier metal film production apparatus according to a tenth embodiment of the present invention.
Figure 21:
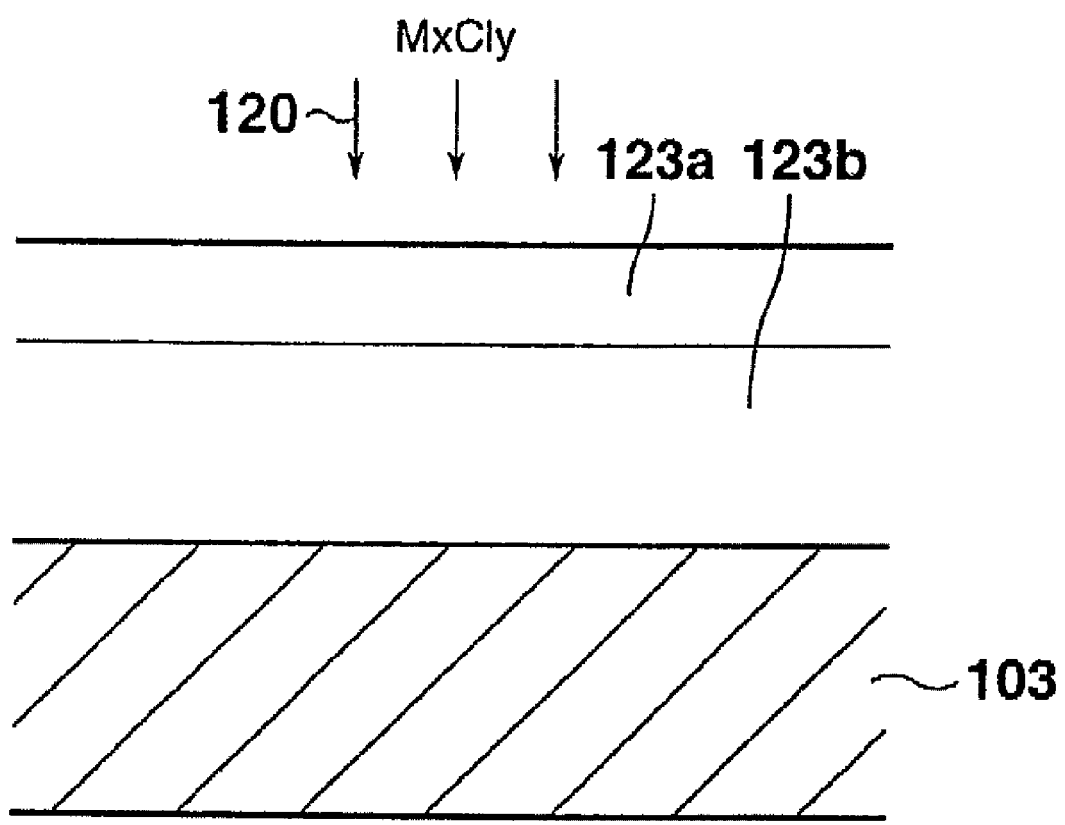
FIG. 21 is a concept view of an example of production of a barrier metal film by the barrier metal film production apparatus according to the tenth embodiment of the present invention.

The barrier metal film production apparatus and barrier metal film production method according to the tenth embodiment of the present invention will be described with reference to FIG. 20. FIG. 20 schematically shows the construction of the barrier metal film production apparatus according to the tenth embodiment of the present invention. The same members as the members shown in FIG. 12 are assigned the same numerals, and duplicate explanations are omitted. FIG. 21 shows the concept status of an example of production of a barrier metal film by the barrier metal film production apparatus according to the tenth embodiment of the present invention.

Compared with the barrier metal film production apparatus of the ninth embodiment shown in FIG. 12, the barrier metal film production apparatus of the tenth embodiment shown in FIG. 20 lacks the diluent gas nozzle 121. In the ninth embodiment, the Ar gas is supplied from the diluent gas nozzle 121 to generate an Ar gas plasma. Using the Ar gas plasma, Ar$^+$ etches the barrier metal film 123 on the surface of the substrate 103, thereby performing a treatment for removing the nitrogen atoms (N) of the MN in the superficial layer to decrease the nitrogen content of the superficial layer relative to the interior of the matrix of the barrier metal film 123 (denitrification). In the present tenth embodiment, on the other hand, when denitrification is to be performed, the O$_2$ gas is supplied from the oxygen gas nozzle 115 to generate an O$_2$ gas plasma. O$_2^+$ etches the barrier metal film 123 on the surface of the substrate 103, performing denitrification. After denitrification, the amount of the O$_2$ gas is decreased to form the oxide layer 124 (see FIG. 16). Other constructions and actions are the same as in the ninth embodiment.

The tenth embodiment can decrease the number of the nozzles for supplying the gases, thus bringing advantage in space.

In the barrier metal film production apparatus of the tenth embodiment, the $O_2$ gas plasma can be used only for the formation of the oxide layer 124 (see FIG. 16) without being used for etching. In this case, the barrier metal film 123 is only the single layer, MN layer 123b. If the metal to be formed as a film over the substrate 103 is a metal unproblematic in terms of adhesion (such as Al), for example, the treatment for forming the metal layer 123a by etching can be omitted.

In the barrier metal film production apparatus of the tenth embodiment, moreover, the $O_2$ gas plasma can be used similarly only for the formation of the oxide layer 124 (see FIG. 16) without being used for etching. In this case, however, after the MN layer 123b is formed, the supply of the $NH_3$ gas from the nozzle 114 is cut off to terminate the reaction of the precursor 120 with an $NH_3$ gas plasma. Then, as shown in FIG. 21, the metal component of the precursor 120 is superposed on the MN layer 123b, whereby the meta layer 123a can be formed.

The reaction for formation of the metal layer 123a from the metal component of the precursor 120 can be expressed by:

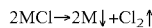

Figure 22:
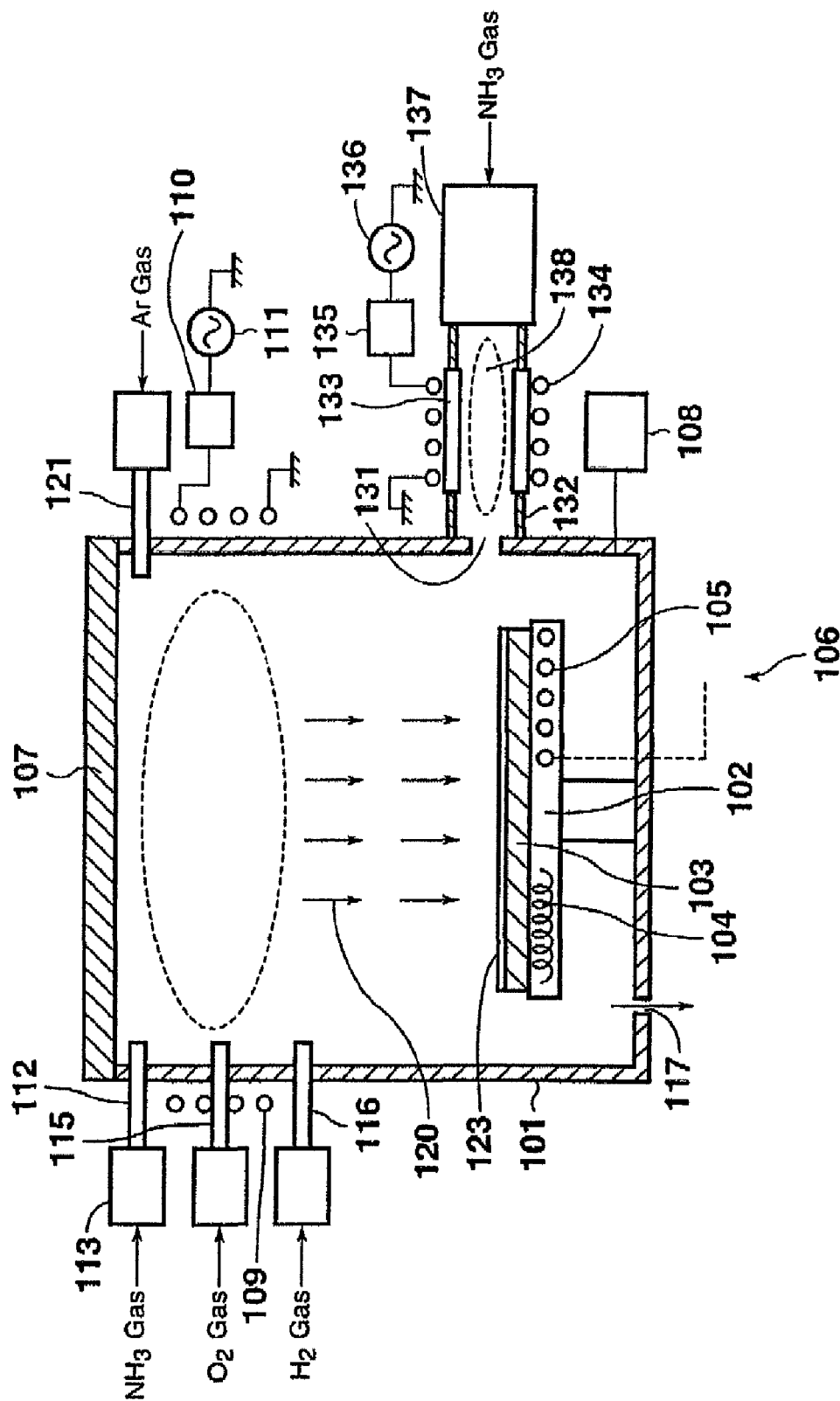
FIG. 22 is a schematic side view of a barrier metal film production apparatus according to an eleventh embodiment of the present invention.

The barrier metal film production apparatus and barrier metal film production method according to the eleventh embodiment of the present invention will be described with reference to FIG. 22. FIG. 22 schematically shows the construction of the barrier metal film production apparatus according to the eleventh embodiment of the present invention. The same members as in the barrier metal film production apparatus shown in FIG. 12 are assigned the same numerals, and duplicate explanations are omitted.

As shown in FIG. 22, a support platform 102 is provided near the bottom of a chamber 101, and a substrate 103 is placed on the support platform 102. Temperature control means 106, as control means, equipped with a heater 104 and refrigerant flow-through means 105 is provided in the support platform 102 so that the support platform 102 is controlled to a predetermined temperature (for example, a temperature at which the substrate 103 is maintained at 100 to 200° C.) by the temperature control means 106. An upper surface of the chamber 101 is an opening, which is closed with a metal member 107 (e.g., W, Ti, Ta, or TiSi). The interior of the chamber 101 closed with the metal member 107 is maintained at a predetermined pressure by a vacuum device 108. A plasma antenna 109 is provided around a cylindrical portion of the chamber 101. A matching instrument 110 and a power source 111 are connected to the plasma antenna 109 to supply power.

A nozzle 112 for supplying a source gas is connected to the cylindrical portion of the chamber 101 below the metal member 107. The source gas is supplied from the nozzle 112, and electromagnetic waves are shot from the plasma antenna 109 into the chamber 101, whereby the $Cl_2$ gas is ionized to generate a $Cl_2$ gas plasma (plasma generation means).

A diluent gas nozzle 121 is provided for supplying an Ar gas to the interior of the chamber 101. Also, electromagnetic waves are shot from the plasma antenna 109 into the chamber 101. Thus, the Ar gas is ionized to generate an Ar gas plasma (surface treatment plasma generation means). If an Ar gas is applied as the diluent gas for the $Cl_2$ gas, diluent gas supply means may be constructed, similar to the ninth embodiment, such that only the Ar gas is supplied from the nozzle 112.

An oxygen gas nozzle 115 is provided for supplying an oxygen gas ($O_2$ gas) to the interior of the chamber 101. Also, electromagnetic waves are shot from the plasma antenna 109 into the chamber 101. Thus, the $O_2$ gas is ionized to generate an $O_2$ gas plasma (oxygen plasma generation means). Moreover, a hydrogen gas nozzle 116 is provided for supplying a hydrogen gas ($H_2$ gas) to the interior of the chamber 101. Also, electromagnetic waves are shot from the plasma antenna 109 into the chamber 101. Thus, the $H_2$ gas is ionized to generate an $H_2$ gas plasma (hydroxyl group plasma generation means).

Slit-shaped opening portions 131 are formed at a plurality of locations (for example, four locations; only one of the locations is shown in the drawing) in the periphery of a lower part of the cylindrical portion of the chamber 101, and one end of a tubular passage 132 is fixed to the opening portion 131. A tubular excitation chamber 33 made of an insulator is provided halfway through the passage 132, and a coiled plasma antenna 134 is provided around the excitation chamber 133. The plasma antenna 134 is connected to a matching instrument 135 and a power source 136 to receive power. The plasma antenna 134, the matching instrument 135 and the power source 136 constitute excitation means. A flow controller 137 is connected to the other end of the passage 132, and an ammonia gas ($NH_3$ gas) as a nitrogen-containing gas is supplied into the passage 132 via the flow controller 137.

Separately, the $NH_3$ gas is supplied into the passage 132 via the flow controller 137 and fed into the excitation chamber 133. By shooting electromagnetic waves from the plasma antenna 134 into the excitation chamber 133, the $NH_3$ gas is ionized to generate an $NH_3$ gas plasma 138. Since a predetermined differential pressure has been established between the pressure inside the chamber 101 and the pressure inside the excitation chamber 133 by the vacuum device 108, the excited ammonia of the $NH_3$ gas plasma 138 in the excitation chamber 133 is fed to the precursor ($M_xCl_y$) 120 inside the chamber 101 through the opening portion 131.

That is, excitation means for exciting the nitrogen-containing gas in the excitation chamber 133 isolated from the chamber 101 is constructed. Because of this construction, the metal component of the precursor ($M_xCl_y$) 120 and ammonia react to form a metal nitride (MN) (formation means). At this time, the metal member 107 and the excitation chamber 133 are maintained by the plasmas at predetermined temperatures (e.g., 200 to 400° C.) which are higher than the temperature of the substrate 103.

With the above-described barrier metal film production apparatus, the source gas is supplied through the nozzle 112 to the interior of the chamber 101, and electromagnetic waves are shot from the plasma antenna 109 into the chamber 101. As a result, a $Cl_2$ gas plasma (source gas plasma) occurs. The $Cl_2$ gas plasma causes an etching reaction to the metal member 107, forming a precursor ($M_xCl_y$) 120. The metal member 107 is maintained by the plasma at a predetermined temperature (e.g., 200 to 400° C.) which is higher than the temperature of the substrate 103.

The excited ammonia of the $NH_3$ gas plasma 138 in the excitation chamber 133 is fed to the precursor ($M_xCl_y$) 120 inside the chamber 101 through the opening portion 131. Thus, a metal nitride (MN) is formed inside the chamber 101. The resulting metal nitride (MN) is transported toward the substrate 103 controlled to a low temperature, whereby a barrier metal film 23 is formed on the surface of the substrate 103. The gases and the etching products, which have not been involved in the reaction, are exhausted through an exhaust port 117.

After the barrier metal film 123 is formed, the Ar gas is supplied from the diluent gas nozzle 121, and electromagnetic waves are shot from the plasma antenna 109 into the chamber 101 to generate an Ar gas plasma. Using the Ar gas plasma, $Ar^+$ etches the barrier metal film 123 on the surface of the substrate 103, thereby performing a treatment for removing the nitrogen atoms (N) of the MN in the superficial layer to decrease the nitrogen content of the superficial layer relative to the interior of the matrix of the barrier metal film 123 (denitrification). As a result, there emerges the barrier metal film 123 of a two-layer structure, a metal layer 123a substantially composed of M, and an MN layer 123b (see FIG. 15).

Immediately before formation of the most superficial layer of the barrier metal film 123 is completed, a trace amount of $O_2$ gas is supplied through the oxygen gas nozzle 115 into the chamber 101. At the same time, electromagnetic waves are shot from the plasma antenna 109 into the chamber 101 to generate an $O_2$ gas plasma. As a result, an oxide layer 124 is formed on the surface of the metal layer 123a composed substantially of M (see FIG. 16). Since the oxide layer 124 has been formed, if a metal (e.g., copper) is deposited (formed as a film) on the surface of the barrier metal film 123, wetting with the metal is satisfactory, thus increasing adhesion.

After formation of the oxide layer 124 on the surface of the metal layer 123a, the $H_2$ gas is supplied from the hydrogen gas nozzle 116 into the chamber 101, and electromagnetic waves are shot from the plasma antenna 109 into the chamber 101, thereby generating an $H_2$ gas plasma. As a result, hydroxyl groups (OH groups) are formed on the surface of the oxide layer 124 (see FIG. 18). These hydroxyl groups increase hydrophilicity, and can further enhance the adhesion of the metal (copper) to be formed as a film.

With the above-described barrier metal film production apparatus, the barrier metal film 123 can be formed at a high speed with excellent burial properties in a very small thickness, as in the ninth embodiment. In addition, the entire film thickness can remain the film thickness constructed from the single layer. In this state, it becomes possible to produce the barrier metal film which can be formed with good adhesion to the metal to be formed as a film, with diffusion of the metal being eliminated.

Besides, when a metal is formed as a film on the surface of the barrier metal film 123, wetting with the metal is satisfactory, and adhesion of the metal can be increased. Additionally, the hydrophilicity improves, and can further increase the adhesion of the metal to be formed as a film.

Further, the $NH_3$ gas plasma 138 is generated in the excitation chamber 133 isolated from the chamber 101. Thus, the influence of the $NH_3$ gas plasma 138 is not exerted on the surface of the substrate 103.

It is permissible to omit the step of generating the $H_2$ gas plasma to form hydroxyl groups (OH groups) on the surface of the oxide layer 124. It is also allowable to omit the step of generating the $O_2$ gas plasma to form the oxide layer 124 on the surface of the metal layer 123a.

The barrier metal film production apparatus according to the eleventh embodiment shown in FIG. 22 may have a construction in which the diluent gas nozzle 121 is not provided. In the eleventh embodiment, the Ar gas is supplied from the diluent gas nozzle 121 to generate an Ar gas plasma. $Ar^+$ etches the barrier metal film 123 on the surface of the substrate 103, thereby removing the nitrogen atoms (N) of the MN in the superficial layer to decrease the nitrogen content of the superficial layer relative to the interior of the matrix of the barrier metal film 123 (denitrification). When denitrification is to be performed, the $O_2$ gas is supplied from the oxygen gas nozzle 115 to generate an $O_2$ gas plasma, and $O_2^+$ etches the barrier metal film 123 on the surface of the substrate 103, thereby carrying out denitrification. After denitrification, the amount of the $O_2$ gas is decreased to form the oxide layer 124 (see FIG. 16).

In this case, the number of the nozzles for supplying the gases can be decreased, thus bringing advantage in space.

The $O_2$ gas plasma can be used only for the formation of the oxide layer 124 (see FIG. 16) without being used for etching. In this case, the barrier metal film 123 is only the single layer, MN layer 123b. If the metal to be formed as a film over the substrate 103 is a metal unproblematic in terms of adhesion (such as Al), for example, the treatment for forming the metal layer 123a by etching can be omitted.

Moreover, the $O_2$ gas plasma can be used similarly only for the formation of the oxide layer 124 (see FIG. 16) without being used for etching. After the MN layer 123b is formed, the supply of the $NH_3$ gas and the supply of power to the power source 136 may be cut off. As a result, the precursor ($M_xCl_y$) 120 is transported toward the substrate 103 controlled to a lower temperature than the temperature of the metal member 107. The precursor ($M_xCl_y$) 120 transported toward the substrate 103 is converted into only metal (M) ions by a reduction reaction, and directed at the substrate 3. Thus, the metal layer 123a is superposed on the MN layer 123b of the substrate 103. In this manner, the metal layer 123a can be formed (see FIG. 21).

Figure 23:
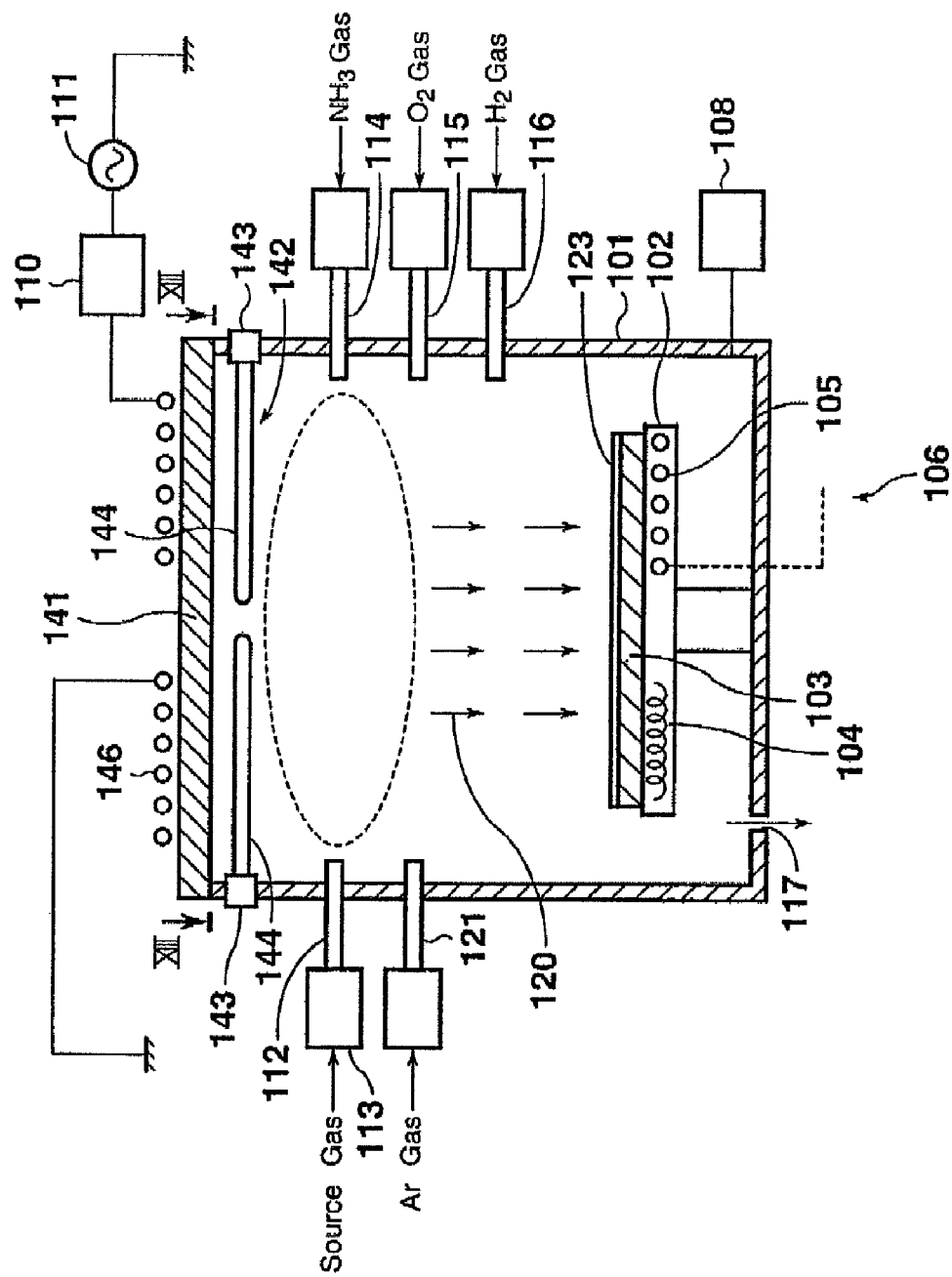
FIG. 23 is a schematic side view of a barrier metal film production apparatus according to a twelfth embodiment of the present invention.
Figure 24:
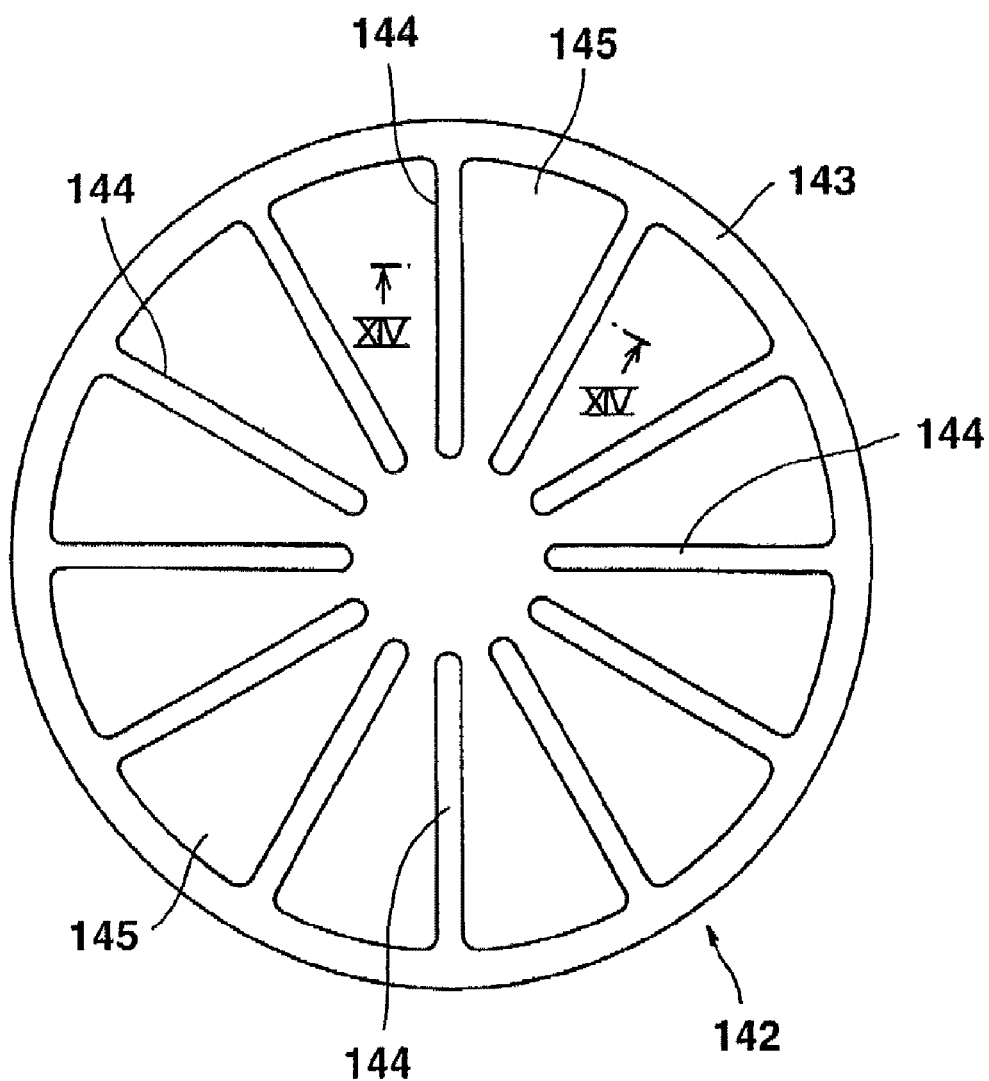
FIG. 24 is a view taken along the arrowed line XIII-XIII of FIG. 23.
Figure 25:
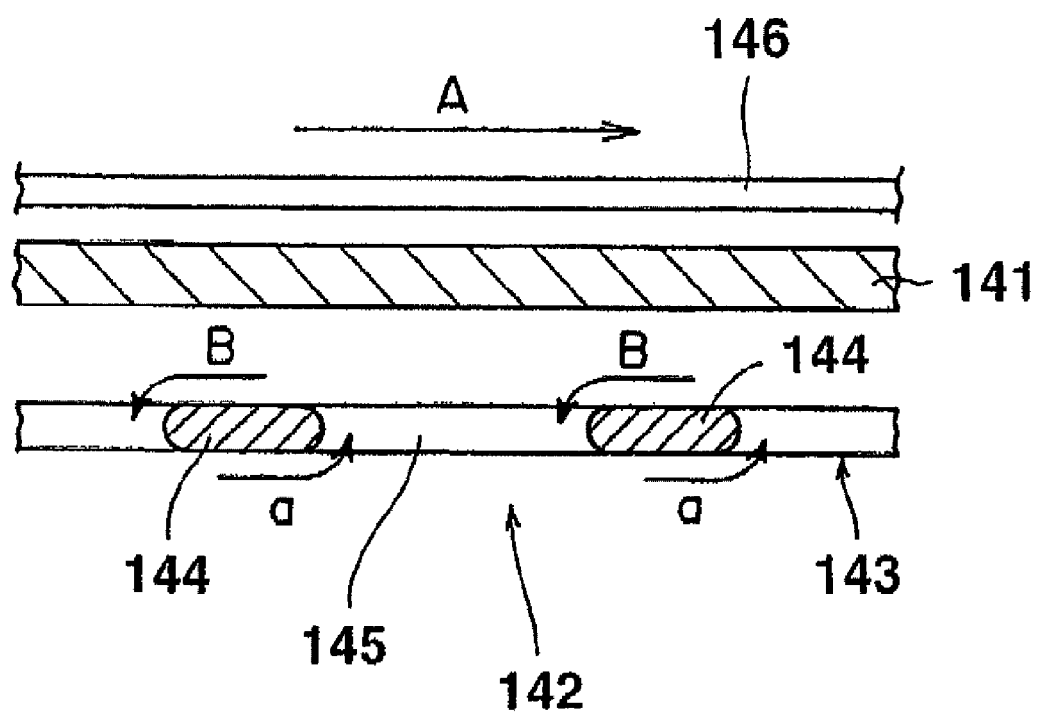
FIG. 25 is a view taken along the arrowed line XIV-XIV of FIG. 24.

A barrier metal film production apparatus and a barrier metal film production method according to a twelfth embodiment of the present invention will be described with reference to FIGS. 23 to 25. FIG. 23 is a schematic side view of the barrier metal film production apparatus according to the twelfth embodiment of the present invention. FIG. 24 is a view taken along the arrowed line XIII-XIII of FIG. 23. FIG. 25 is a view taken along the arrowed line XIV-XIV of FIG. 24. The same members as the members illustrated in FIGS. 12 to 22 are assigned the same numerals, and duplicate explanations are omitted.

An upper surface of the chamber 101 is an opening, which is closed with a disk-shaped ceiling board 141 made of an insulating material (for example, a ceramic). An etched member 142 made of a metal (e.g., W, Ti, Ta or TiSi) is interposed between the opening at the upper surface of the chamber 101 and the ceiling board 141. The etched member 142 is provided with a ring portion 143 fitted to the opening at the upper surface of the chamber 101. A plurality of (12 in the illustrated embodiment) protrusions 144, which extend close to the center in the diametrical direction of the chamber 101 and have the same width, are provided in the circumferential direction on the inner periphery of the ring portion 143.

The protrusions 144 are integrally or removably attached to the ring portion 143. Notches (spaces) 145 formed between the protrusions 144 are present between the ceiling board 141 and the interior of the chamber 101. The ring portion 143 is earthed, and the plural protrusions 144 are electrically connected together and maintained at the same potential. Temperature control means (not shown), such as a heater, is provided in the etched member 142 to control the temperature of the etched member 142 to 200 to 400° C., for example.

Second protrusions shorter in the diametrical direction than the protrusions 144 can be arranged between the protrusions 144. Moreover, short protrusions can be arranged between the protrusion 144 and the second protrusion. By so doing, the area of the etched member, an object to be etched, can be secured, with an induced current being suppressed.

A planar winding-shaped plasma antenna 146, for converting the atmosphere inside the chamber 101 into a plasma, is provided above the ceiling board 141. The plasma antenna 146 is formed in a planar ring shape parallel to the surface of the ceiling board 141. A matching instrument 110 and a power source 111 are connected to the plasma antenna 146 to supply power. The etched member 142 has the plurality of protrusions 144 provided in the circumferential direction on the inner periphery of the ring portion 143, and includes the notches (spaces) 145 formed between the protrusions 144. Thus, the protrusions 144 are arranged between the substrate 103 and the ceiling board 141 in a discontinuous state relative to the flowing direction of electricity in the plasma antenna 146.

At a cylindrical portion of the chamber 101, there are provided a nozzle 112 for supplying a source gas into the chamber 101, a nozzle 114 for supplying an $NH_3$ gas into the chamber 101, a diluent gas nozzle 121 for supplying an Ar gas into the chamber 101, an oxygen gas nozzle 115 for supplying an $O_2$ gas into the chamber 101, and a hydrogen gas nozzle 116 for supplying an $H_2$ gas into the chamber 101.

With the above-described barrier metal film production apparatus, the source gas is supplied through the nozzles 112 to the interior of the chamber 101, and electromagnetic waves are shot from the plasma antenna 146 into the chamber 101. As a result, the $Cl_2$ gas is ionized to generate a $Cl_2$ gas plasma (source gas plasma). The etched member 142, an electric conductor, is present below the plasma antenna 146. However, the $Cl_2$ gas plasma occurs stably between the etched member 142 and the substrate 103, namely, below the etched member 142, under the following action:

The action by which the $Cl_2$ gas plasma is generated below the etched member 142 will be described. As shown in FIG. 25, a flow A of electricity in the plasma antenna 146 of the planar ring shape crosses the protrusions 144. At this time, an induced current B occurs on the surface of the protrusion 144 opposed to the plasma antenna 146. Since the notches (spaces) 145 are present in the etched member 142, the induced current B flows onto the lower surface of each protrusion 144, forming a flow a in the same direction as the flow A of electricity in the plasma antenna 146 (Faraday shield).

When the etched member 142 is viewed from the substrate 103, therefore, there is no flow in a direction in which the flow A of electricity in the plasma antenna 146 is canceled out. Furthermore, the ring portion 143 is earthed, and the protrusions 144 are maintained at the same potential. Thus, even though the etched member 142, an electric conductor, exists, the electromagnetic wave is reliably thrown from the plasma antenna 146 into the chamber 101. Consequently, the $Cl_2$ gas plasma is stably generated below the etched member 142.

The $Cl_2$ gas plasma causes an etching reaction to the etched member 142, forming a precursor ($M_xCl_y$: M is a metal such as W, Ti, Ta or TiSi) 120.

Separately, the $NH_3$ gas is supplied into the chamber 101 through the nozzle 114, and electromagnetic waves are shot from the plasma antenna 146 into the chamber 101. Thus, the $NH_3$ gas is ionized to generate an $NH_3$ gas plasma, which causes a reduction reaction with the precursor 120, forming a metal nitride (MN). The metal nitride (MN) formed within the chamber 101 is transported toward the substrate 103 controlled to a low temperature, whereupon MN is formed into a film on the surface of the substrate 103 to produce a barrier metal film 123 (see FIG. 13).

After the barrier metal film 123 has been formed, the Ar gas is supplied from the diluent gas nozzle 121, and electromagnetic waves are shot from the plasma antenna 146 into the chamber 101, thereby generating an Ar gas plasma. Generation of the Ar gas plasma results in the etching of the barrier metal film 123 on the surface of the substrate 103, thereby performing denitrification, a treatment for removing the nitrogen atoms (N) of the MN in the superficial layer of the barrier metal film 123 to decrease the nitrogen content of the superficial layer relative to the interior of the matrix of the barrier metal film 123.

Immediately before formation of the most superficial layer of the barrier metal film 123 is completed, a trace amount of $O_2$ gas is supplied through the oxygen gas nozzle 115 into the chamber 101. At the same time, electromagnetic waves are shot from the plasma antenna 146 into the chamber 101 to generate an $O_2$ gas plasma. As a result, an oxide layer 124 (see FIG. 16) is formed on the surface of the metal layer 123a composed substantially of M (see FIG. 16). Since the oxide layer 124 has been formed, if a metal (e.g., copper) is deposited (formed as a film) on the surface of the barrier metal film 123, wetting with the metal is satisfactory, thus increasing adhesion.

After formation of the oxide layer 124 (see FIG. 16) on the surface of the metal layer 123a (FIG. 16), the $H_2$ gas is supplied from the hydrogen gas nozzle 116 into the chamber 101, and electromagnetic waves are shot from the plasma antenna 146 into the chamber 101, thereby generating an $H_2$ gas plasma. As a result, hydroxyl groups (OH groups) are formed on the surface of the oxide layer 124 (see FIG. 18). These hydroxyl groups increase hydrophilicity, and can further enhance the adhesion of the metal (copper) to be formed as a film.

It is permissible to omit the step of generating the $H_2$ gas plasma to form hydroxyl groups (OH groups) on the surface of the oxide layer 124 (see FIG. 18). It is also allowable to omit the step of generating the $O_2$ gas plasma to form the oxide layer 124 (FIG. 16) on the surface of the metal layer 123a (FIG. 16). Furthermore, it is possible to superpose the metal layer 123a, forming the barrier metal film 123. It is also possible to form the barrier metal film 123 free from the metal layer 123a.

Beside, the same nozzle construction as in the tenth embodiment (see FIG. 20) omitting the diluent gas nozzle 121 may be adopted in a configuration for formation of the precursor 120 with the exception of the etched member 142 and the plasma antenna 146. Moreover, the same construction as in the eleventh embodiment (see FIG. 22) having the excitation chamber 133, etc. instead of the nozzle 114 may be adopted in a configuration excepting the etched member 142 and the plasma antenna 146.

With the above-described barrier metal film production apparatus, the barrier metal film 123 can be formed uniformly to a small thickness. Consequently, the barrier metal film 123 can be formed highly accurately at a high speed with excellent burial properties in a very small thickness even to the interior of a tiny depression, for example several hundred nanometers wide, which has been provided in the substrate 103.

In addition, the etched member 142 has the plurality of protrusions 144 provided in the circumferential direction on the inner periphery of the ring portion 143, and includes the notches (spaces) 145 formed between the protrusions 144. Thus, the induced currents generated in the etched member 142 flow in the same direction as the flowing direction of electricity in the plasma antenna 146, when viewed from the substrate 103. Therefore, even though the etched member 142, an electric conductor, exists below the plasma antenna 146, the electromagnetic waves are reliably thrown from the plasma antenna 146 into the chamber 101. Consequently, the $Cl_2$ gas plasma can be stably generated below the etched member 142.

Figure 26:
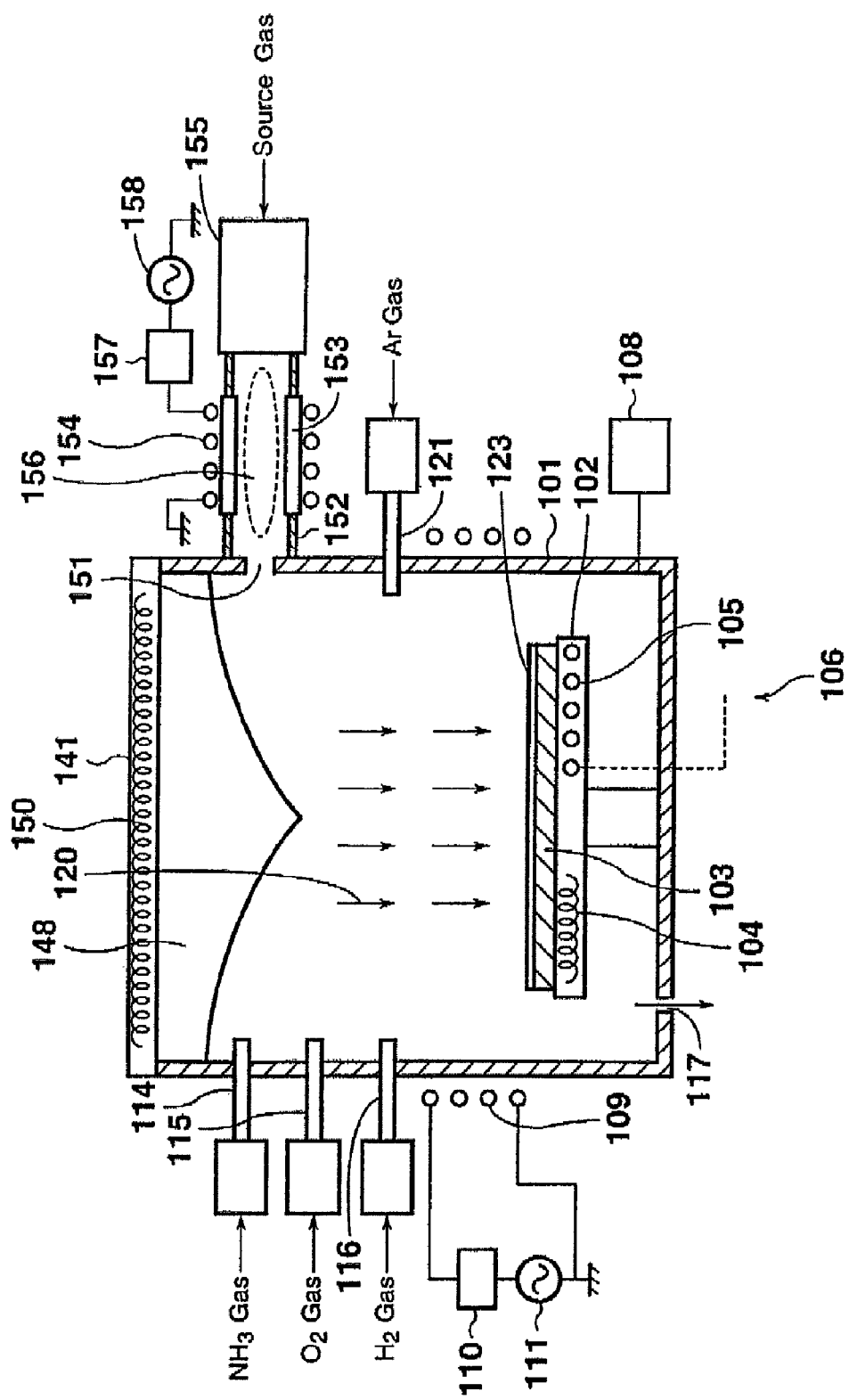
FIG. 26 is a schematic side view of a barrier metal film production apparatus according to a thirteenth embodiment of the present invention.

A barrier metal film production apparatus and a barrier metal film production method according to the thirteenth embodiment of the present invention will be described with reference to FIG. 26. FIG. 26 is a schematic side view of a barrier metal film production apparatus according to the third embodiment of the present invention. The same members as the members illustrated in FIGS. 12 to 25 are assigned the same numerals, and duplicate explanations are omitted.

The opening of an upper portion of a chamber 101 is closed with a ceiling board 141. An etched member 148 made of a metal (e.g., W, Ti, Ta or TiSi) is provided on a lower surface of the ceiling board 141, and the etched member 148 is of a quadrangular pyramidal shape. Slit-shaped opening portions 151 are formed at a plurality of locations (for example, four locations; one of the locations is shown in the drawing) in the periphery of an upper part of the cylindrical portion of the chamber 101, and one end of a tubular passage 152 is fixed to the opening portion 151. A tubular excitation chamber 153 made of an insulator is provided halfway through the passage 152, and a coiled plasma antenna 154 is provided around the excitation chamber 153. The plasma antenna 154 is connected to a matching instrument 157 and a power source 158 to receive power.

A flow controller 155 is connected to the other end of the passage 152, and a chlorine-containing source gas (a $Cl_2$ gas diluted with He or Ar to a chlorine concentration of $\leqq 50\%$, preferably about 10%) is supplied into the passage 152 via the flow controller 155. By shooting electromagnetic waves from the plasma antenna 154 into the excitation chamber 153, the $Cl_2$ gas is ionized to generate a $Cl_2$ gas plasma (source gas plasma) 156. Because of the generation of the $Cl_2$ gas plasma 156, excited chlorine is fed into the chamber 101 through the opening portion 151, whereupon the etched member 148 is etched with excited chlorine.

At a cylindrical portion of the chamber 101, there are provided a nozzle 114 for supplying an $NH_3$ gas into the chamber 101, a diluent gas nozzle 121 for supplying an Ar gas into the chamber 101, an oxygen gas nozzle 115 for supplying an $O_2$ gas into the chamber 101, and a hydrogen gas nozzle 116 for supplying an $H_2$ gas into the chamber 101. Around the chamber 101, a plasma antenna 109, a matching instrument 110 and a power source 111 are provided to generate an $NH_3$ gas plasma, an Ar gas plasma, an $O_2$ gas plasma, and an $H_2$ gas plasma.

With the above-described barrier metal film production apparatus, the source gas is supplied into the passage 152 via the flow controller 155 and fed into the excitation chamber 153. By shooting electromagnetic waves from the plasma antenna 154 into the excitation chamber 153, the $Cl_2$ gas is ionized to generate a $Cl_2$ gas plasma (source gas plasma) 156. Since a predetermined differential pressure has been established between the pressure inside the chamber 101 and the pressure inside the excitation chamber 153 by the vacuum device 108, the excited chlorine of the $Cl_2$ gas plasma 156 in the excitation chamber 153 is fed to the etched member 148 inside the chamber 101 through the opening portion 151. The excited chlorine causes an etching reaction to the etched member 148, forming a precursor 120 inside the chamber 101. At this time, the etched member 148 is maintained at a predetermined temperature (e.g., 200 to 400° C.), which is higher than the temperature of the substrate 103, by a heater 150 provided in the ceiling board 141.

Separately, the $NH_3$ gas is supplied into the chamber 101 through the nozzle 114, and electromagnetic waves were shot from the plasma antenna 109 into the chamber 101. Thus, the $NH_3$ gas is ionized to generate an $NH_3$ gas plasma, which causes a reduction reaction with the precursor 120, forming a metal nitride (MN). The metal nitride (MN) formed within the chamber 101 is transported toward the substrate 103 controlled to a low temperature, whereupon MN is formed into a film on the surface of the substrate 103 to produce a barrier metal film 123 (see FIG. 13).

After the barrier metal film 123 has been formed, the Ar gas is supplied from the diluent gas nozzle 121, and electromagnetic waves are shot from the plasma antenna 109 into the chamber 101, thereby generating an Ar gas plasma. Generation of the Ar gas plasma results in the etching of the barrier metal film 123 on the surface of the substrate 103, thereby performing denitrification, a treatment for removing the nitrogen atoms (N) of the MN in the superficial layer of the barrier metal film 123 to decrease the nitrogen content of the superficial layer relative to the interior of the matrix of the barrier metal film 123.

Immediately before formation of the most superficial layer of the barrier metal film 123 is completed, a trace amount of $O_2$ gas is supplied through the oxygen gas nozzle 115 into the chamber 101. At the same time, electromagnetic waves are shot from the plasma antenna 109 into the chamber 101 to generate an $O_2$ gas plasma. As a result, an oxide layer 124 (see FIG. 16) is formed on the surface of the metal layer 123a composed substantially of M (see FIG. 16). Since the oxide layer 124 has been formed, if a metal (e.g., copper) is deposited (formed as a film) on the surface of the barrier metal film 123, wetting with the metal is satisfactory, thus increasing adhesion.

After formation of the oxide layer 124 (see FIG. 16) on the surface of the metal layer 123a (FIG. 16), the $H_2$ gas is supplied from the hydrogen gas nozzle 116 into the chamber 101, and electromagnetic waves are shot from the plasma antenna 109 into the chamber 101, thereby generating an $H_2$ gas plasma. As a result, hydroxyl groups (OH groups) are formed on the surface of the oxide layer 124 (see FIG. 18). These hydroxyl groups increase hydrophilicity, and can further enhance the adhesion of the metal (copper) to be formed as a film.

It is permissible to omit the step of generating the $H_2$ gas plasma to form hydroxyl groups. (OH groups) on the surface of the oxide layer 124 (see FIG. 18). It is also allowable to omit the step of generating the $O_2$ gas plasma to form the oxide layer 124 (FIG. 16) on the surface of the metal layer 123a (FIG. 16). Furthermore, it is possible to superpose the metal layer 123a, forming the barrier metal film 123. It is also possible to form the barrier metal film 123 free from the metal layer 123a.

Beside, the same nozzle construction as in the tenth embodiment (see FIG. 20) omitting the diluent gas nozzle 121 may be adopted in a configuration for formation of the precursor 120 with the exception of the etched member 148, opening portion 151, passage 152, excitation chamber 153, plasma antenna 154, flow controller 155, matching instrument 157, and power source 158. Moreover, the same construction as in the eleventh embodiment (see FIG. 22) having the excitation chamber 133, etc. instead of the nozzle 114 may be adopted in other configuration for formation of the precursor 120.

With the above-described barrier metal film production apparatus, the barrier metal film 123 can be formed uniformly to a small thickness. Consequently, the barrier metal film 123 can be formed highly accurately at a high speed with excellent burial properties in a very small thickness even to the interior of a tiny depression, for example several hundred nanometers wide, which has been provided in the substrate 103.

Furthermore, the $Cl_2$ gas plasma 156 is generated in the excitation chamber 153 isolated from the chamber 101. Thus, the substrate 103 is not exposed to the Cl$_2$ gas plasma 156 any more, and the substrate 103 becomes free from damage from the Cl$_2$ gas plasma 156.

As the means for generating the Cl$_2$ gas plasma 156 in the excitation chamber 153, namely, the means for exciting the source gas to convert it into an excited source gas, it is possible to use microwaves, laser, electron rays, or synchrotron radiation. It is also permissible to form the precursor by heating the metal filament to a high temperature. The construction for isolating the Cl$_2$ gas plasma 156 from the substrate 103 may be the provision of the excitation chamber 153 in the passage 152, or may be other construction, for example, the isolation of the chamber 101.

Figure 27:
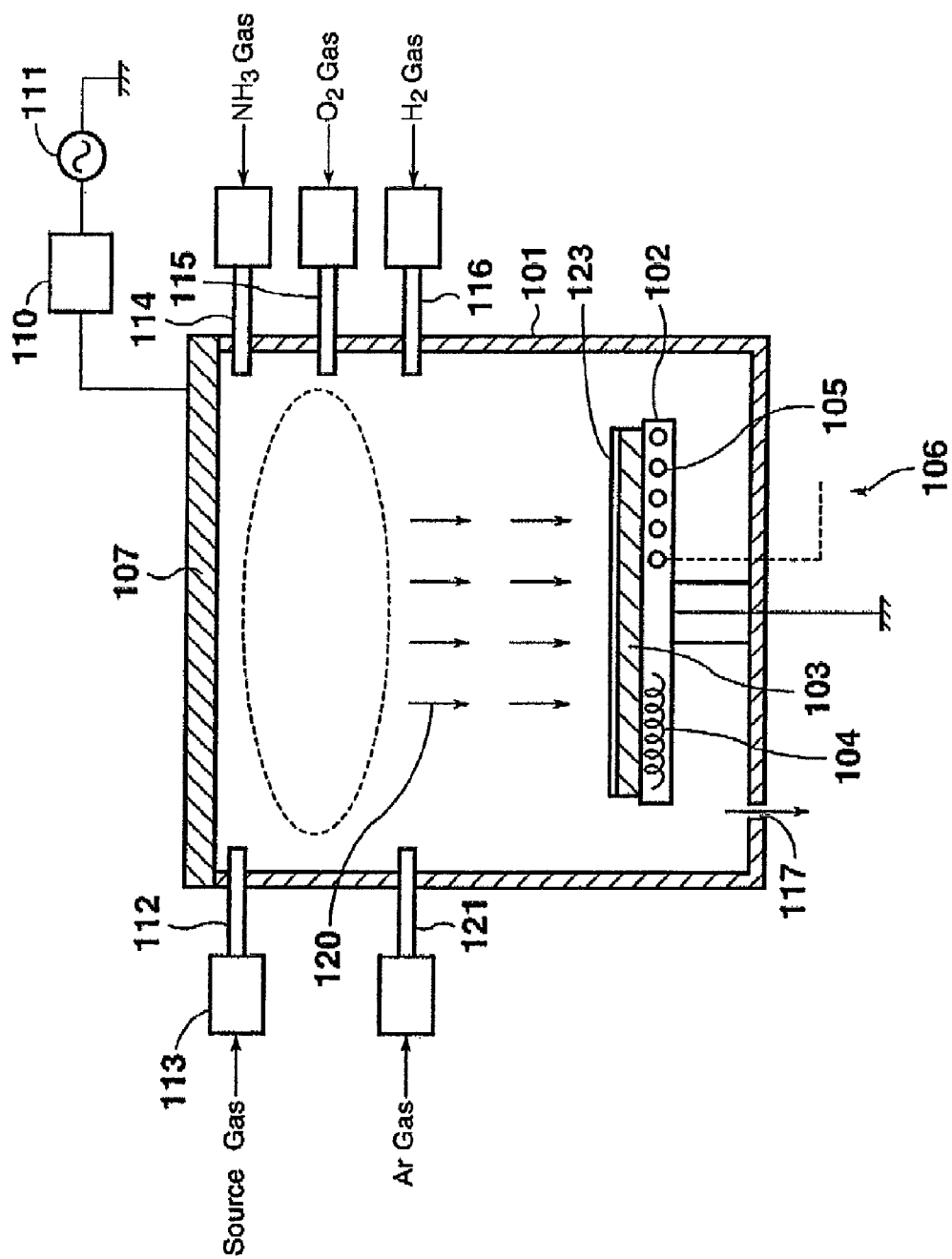
FIG. 27 is a schematic side view of a barrier metal film production apparatus according to a fourteenth embodiment of the present invention.

A barrier metal film production apparatus and a barrier metal film production method according to the fourteenth embodiment of the present invention will be described with reference to FIG. 27. FIG. 27 is a schematic side view of the barrier metal film production apparatus according to the fourteenth embodiment of the present invention. The same members as the members illustrated in FIGS. 12 to 26 are assigned the same numerals, and duplicate explanations are omitted.

In the barrier metal film production apparatus according to the fourteenth embodiment, unlike the barrier metal film production apparatus according to the ninth embodiment shown in FIG. 12, the plasma antenna 9 is not provided around the cylindrical portion of the chamber 101, but a metal member 107 is connected to a matching instrument 110 and a power source 111 to receive power.

At the cylindrical portion of the chamber 101, there are provided a nozzle 114 for supplying an NH$_3$ gas into the chamber 101, a diluent gas nozzle 121 for supplying an. Ar gas into the chamber 101, an oxygen gas nozzle 115 for supplying an O$_2$ gas into the chamber 101, and a hydrogen gas nozzle 116 for supplying an H$_2$ gas into the chamber 101. By supplying power to the metal member 107, an NH$_3$ gas plasma, an Ar gas plasma, an O$_2$ gas plasma, and an H$_2$ gas plasma are generated. To generate the NH$_3$ gas plasma, Ar gas plasma, O$_2$ gas plasma, and H$_2$ gas plasma, a coiled plasma antenna may be provided separately on the cylindrical portion of the chamber 101, and the plasma antenna may be connected to a power source via a matching instrument.

With the above-described barrier metal film production apparatus, the source gas is supplied from the nozzle 112 into the chamber 101, and electromagnetic waves are shot from the metal member 107 into the chamber 101, whereby the Cl$_2$ gas is ionized to generate a Cl$_2$ gas plasma (source gas plasma). The Cl$_2$ gas plasma causes an etching reaction to the metal member 107, producing a precursor (M$_x$Cl$_y$) 120. At this time, the metal member 107 is maintained at a predetermined temperature (e.g., 200 to 400° C.), which is higher than the temperature of the substrate 103, by temperature control means (not shown).

Separately, the NH$_3$ gas is supplied into the chamber 101 through the nozzle 114, and electromagnetic waves are shot from the metal member 107 into the chamber 101. Thus, the NH$_3$ gas is ionized to generate an NH$_3$ gas plasma, which causes a reduction reaction with the precursor 120, forming a metal nitride (MN). The metal nitride (MN) formed within the chamber 101 is transported toward the substrate 103 controlled to a low temperature, whereupon MN is formed into a film on the surface of the substrate 103 to produce a barrier metal film 123 (see FIG. 13).

After the barrier metal film 123 has been formed, the Ar gas is supplied from the diluent gas nozzle 121, and electromagnetic waves are shot from the metal member 107 into the chamber 101, thereby generating an Ar gas plasma. Generation of the Ar gas plasma results in the etching of the barrier metal film 123 on the surface of the substrate 103, thereby performing denitrification, a treatment for removing the nitrogen atoms (N) of the MN in the superficial layer of the barrier metal film 123 to decrease the nitrogen content of the superficial layer relative to the interior of the matrix of the barrier metal film 123.

Immediately before formation of the most superficial layer of the barrier metal film 123 is completed, a trace amount of O$_2$ gas is supplied through the oxygen gas nozzle 115 into the chamber 101. At the same time, electromagnetic waves are shot from the metal member 107 into the chamber 101 to generate an O$_2$ gas plasma. As a result, an oxide layer 124 (see FIG. 16) is formed on the surface of a metal layer 123a composed substantially of M (see FIG. 16). Since the oxide layer 124 has been formed, if a metal (e.g., copper) is deposited (formed as a film) on the surface of the barrier metal film 123, wetting with the metal is satisfactory, thus increasing adhesion.

After formation of the oxide layer 124 (see FIG. 16) on the surface of the metal layer 123a (FIG. 16), the H$_2$ gas is supplied from the hydrogen gas nozzle 116 into the chamber 101, and electromagnetic waves are shot from the metal member 107 into the chamber 101, thereby generating an H$_2$ gas plasma. As a result, hydroxyl groups (OH groups) are formed on the surface of the oxide layer 124 (see FIG. 18). These hydroxyl groups increase hydrophilicity, and can further enhance the adhesion of the metal (copper) to be formed as a film.

It is permissible to omit the step of generating the H$_2$ gas plasma to form hydroxyl groups (OH groups) on the surface of the oxide layer 124 (see FIG. 18). It is also allowable to omit the step of generating the O$_2$ gas plasma to form the oxide layer 124 (FIG. 16) on the surface of the metal layer 123a (FIG. 16). Furthermore, it is possible to superpose the metal layer 123a, forming the barrier metal film 123. It is also possible to form the barrier metal film 123 free from the metal layer 123a.

Beside, the same nozzle construction as in the tenth embodiment (see FIG. 20) omitting the diluent gas nozzle 121 may be adopted in the configuration for formation of the precursor 120 with the exception of the metal member 107, matching instrument 110, and power source 111. Moreover, the same construction as in the eleventh embodiment (see FIG. 22) having the excitation chamber 133, etc. instead of the nozzle 114 may be adopted in other configuration for formation of the precursor 120.

With the above-described barrier metal film production apparatus, the barrier metal film 123 can be formed uniformly to a small thickness. Consequently, the barrier metal film 123 can be formed highly accurately at a high speed with excellent burial properties in a very small thickness even to the interior of a tiny depression, for example several hundred nanometers wide, which has been provided in the substrate 103.

Furthermore, the metal member 107 itself is applied as an electrode for plasma generation. Thus, there is no need for a plasma antenna around the cylindrical portion of the chamber 101, and the degree of freedom of the surrounding construction can be increased.

A metal film production method and a metal film production apparatus according to the present invention will be described with reference to the accompanying drawings. The metal film production method of the present invention involves a treatment for enhancing adhesion to a barrier metal layer of, for example, tantalum nitride (TaN) formed on the surface of a substrate in order to prevent diffusion into the substrate.

According to a first aspect of the present invention, the barrier metal film of TaN is flattened by etching its surface with a diluent gas (e.g., argon: Ar) plasma. Further, the nitrogen atoms in the superficial layer of the barrier metal film are removed using Ar⁺, thereby decreasing the nitrogen content of the superficial layer relative to the interior of the matrix of the barrier metal film (this surface treatment will be referred to hereinafter as denitrification). The denitrification brings a state in which a film of a metal (Ta) is substantially formed in the superficial layer of the single-layer barrier metal film. In this manner, a barrier metal film is produced highly efficiently and reliably in a thin film condition, by use of an inexpensive gas having a high mass number, with the diffusion of the metal being prevented and the adhesion to the metal being maintained.

Depending on the material for the barrier metal film, it is possible to perform only the treatment for flattening the surface by etching it with the diluent gas (e.g., argon: Ar) plasma while controlling the power of the plasma and the energization time. By so doing, adhesion can be improved. As the barrier metal film, not only TaN, but tungsten nitride or titanium nitride can be applied. As the diluent gas, not only Ar, but helium, krypton, or neon can be applied.

The concrete construction of the apparatus according to the first aspect may be as follows: A source gas containing a halogen (e.g., a chlorine-containing gas) is supplied to the interior of a chamber between a substrate and an etched member made of Ta, and an atmosphere within the chamber is converted into a plasma to generate a chlorine gas plasma. The etched member is etched with the chlorine gas plasma to form a precursor comprising the Ta component contained in the etched member and the chlorine gas. Also, a nitrogen-containing gas is excited, and TaN, a metal nitride, is formed upon reaction between the excited nitrogen and the precursor. The resulting TaN is formed as a film on the substrate kept at a low temperature to form a barrier metal film. This process is performed using a barrier metal film production apparatus. After the barrier metal film is produced in this manner, an Ar gas plasma is generated within the chamber to carry out etching and denitrification.

Alternatively, the concrete apparatus construction of the first aspect may be as follows: A chlorine gas is supplied into a chamber, and an atmosphere within the chamber is converted into a plasma to generate a chlorine gas plasma. An etched member made of copper (Cu) is etched with the chlorine gas plasma to form a precursor comprising the Cu component contained in the etched member and chlorine inside the chamber. The temperature of the substrate is rendered lower than the temperature of the etched member to form a film of the Cu component of the precursor on the substrate. This process is performed by use of a metal film production apparatus. Before the substrate having the barrier metal film of TaN formed thereon is housed in the chamber and the Cu component is formed as a film thereon, the Ar gas plasma is generated to carry out etching and denitrification.

Figure 28:
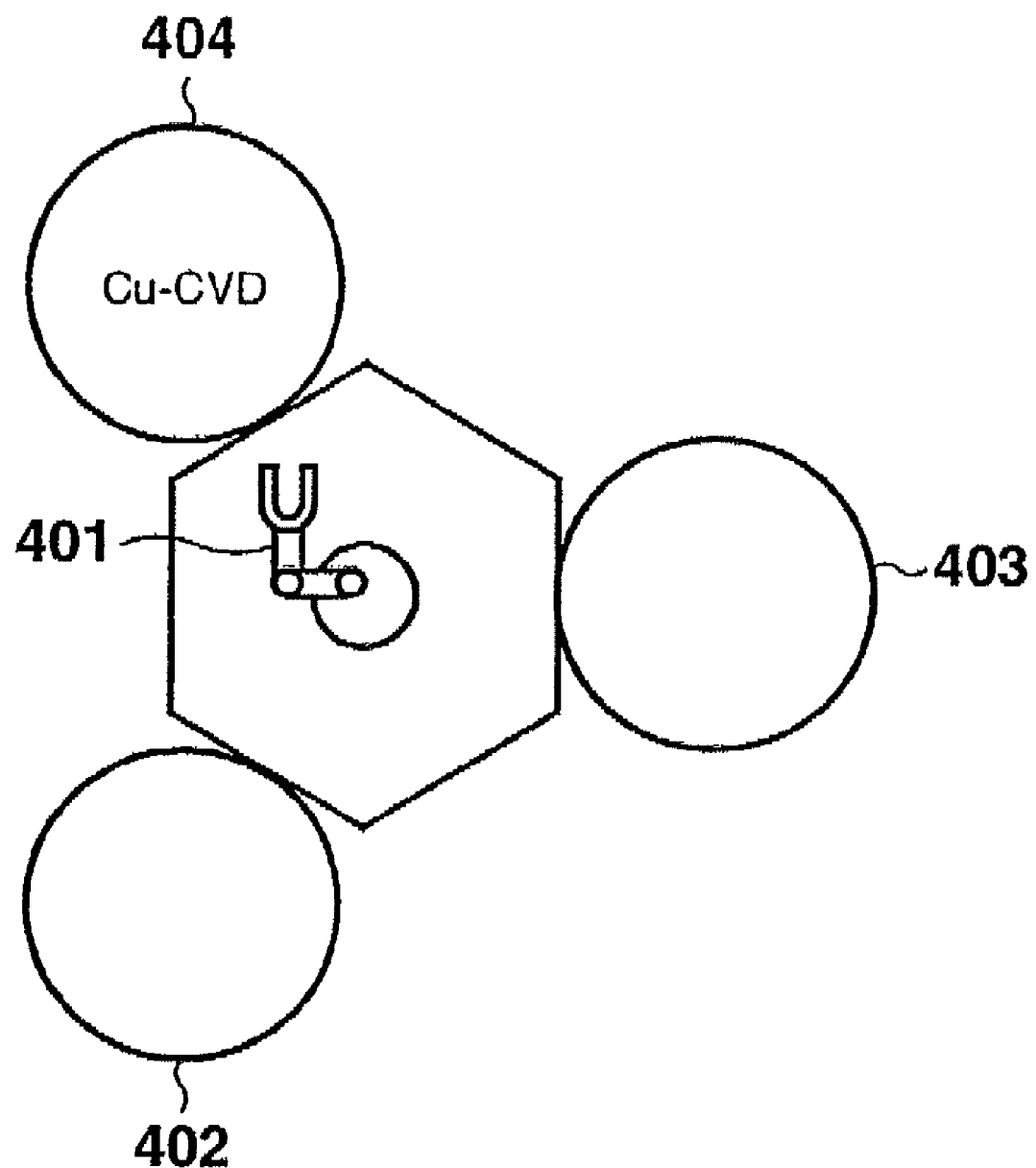
FIG. 28 is an outline drawing of an apparatus for a film formation process.

FIG. 28 shows an outline of an apparatus for a film formation process for forming a Cu film. As shown, for example, in FIG. 28, a handling robot 401 for transporting a substrate is installed at a central site. Around the robot 401, there are provided an accommodation device 402 for accommodating the substrate, a barrier metal CVD 403 for forming a barrier metal film on the substrate, and a Cu-CVD 404 for forming a Cu film. The robot 401 transports the substrate from the accommodation device 402 to the barrier metal CVD 403, from the barrier metal CVD 403 to the Cu-CVD 404, and from the Cu-CVD 404 to the accommodation device 402. With such an apparatus for the film formation process, the metal film production apparatus according to the first aspect is provided in the Cu-CVD 404.

The metal film production apparatus in the first aspect may be provided in the barrier metal CVD 403, or a dedicated metal film production apparatus according to the first aspect may be provided around the robot 401.

Embodiments of the metal film production method and metal film production apparatus according to the first aspect will be described with reference to the accompanying drawings, with the provision of the apparatus in the Cu-CVD 404 being taken as an example.

Figure 29:
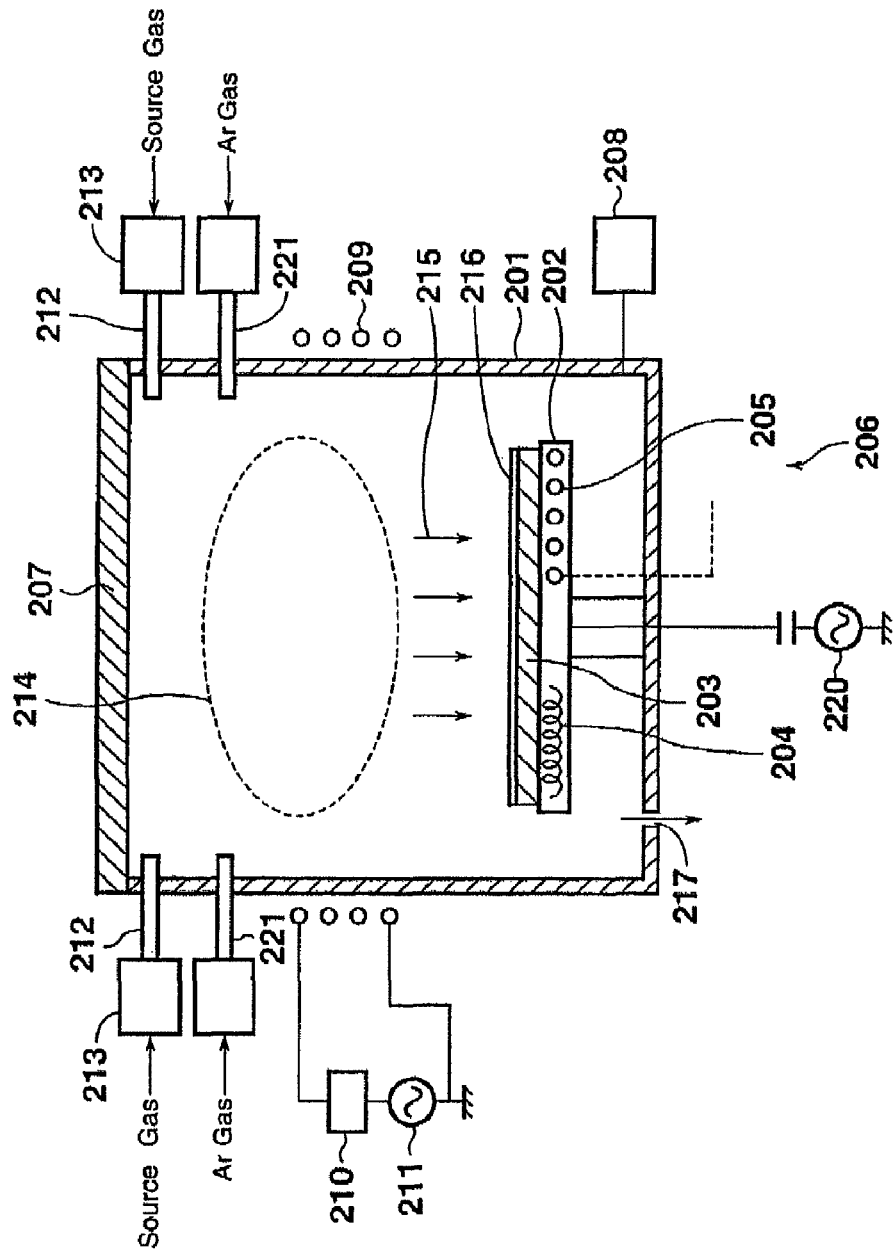
FIG. 29 is a schematic side view of a metal film production apparatus according to a fifteenth embodiment of the present invention.
Figure 30:
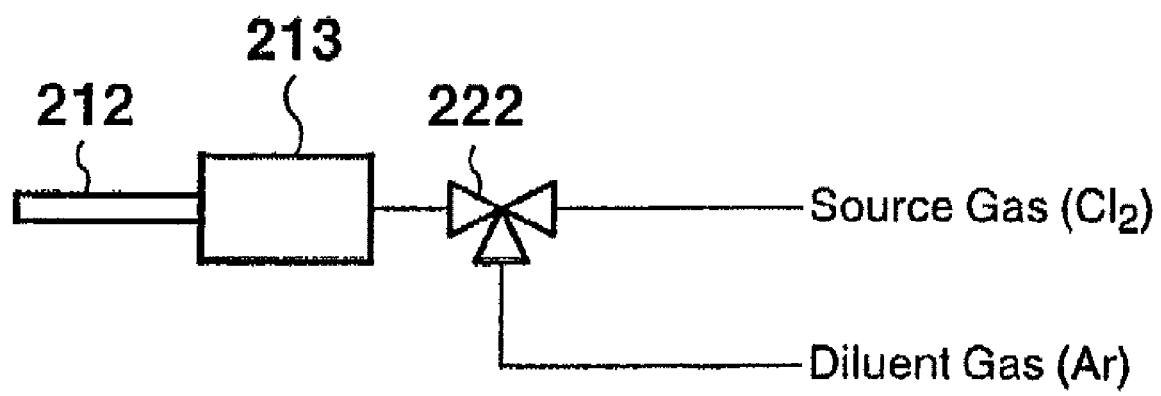
FIG. 30 is a schematic construction drawing showing another example of diluent gas supply means.
Figure 32:
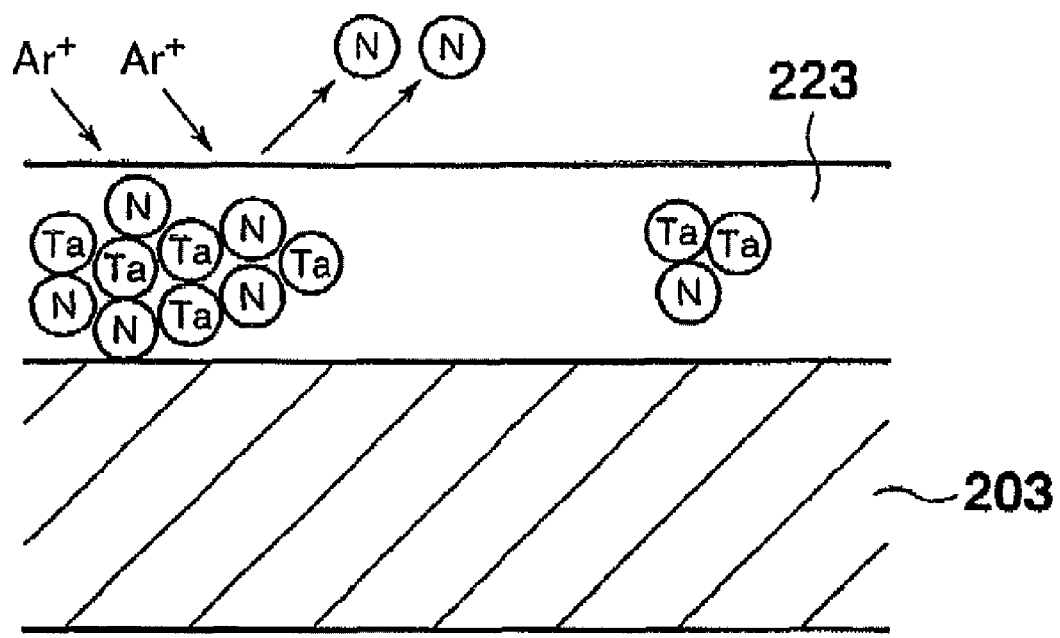
FIG. 32 is a concept view of a barrier metal film in a treatment for denitrification.
Figure 33:
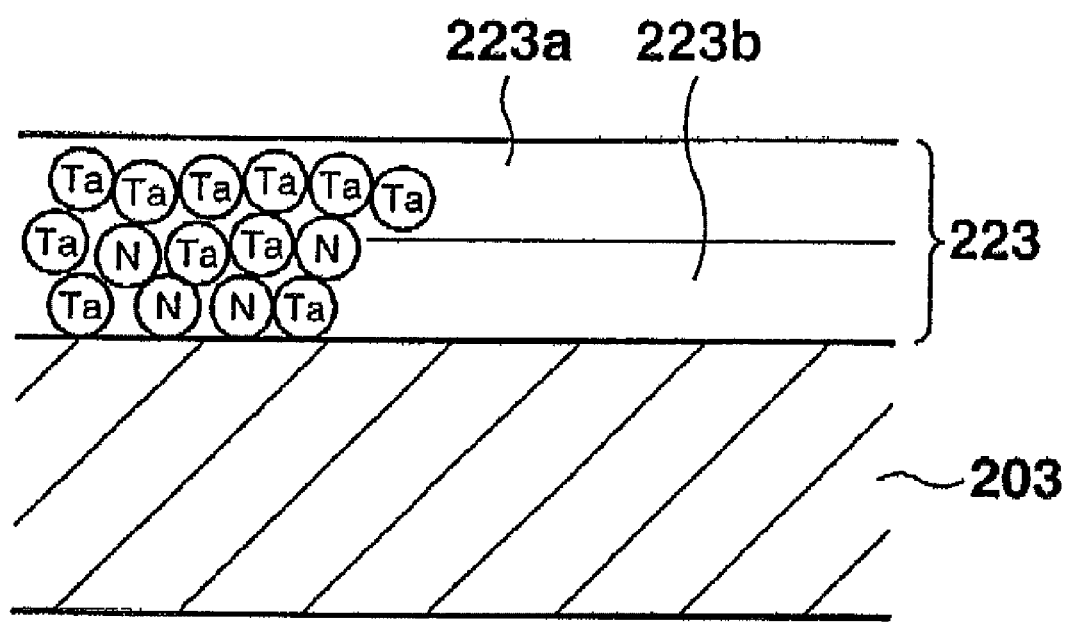
FIG. 33 is a concept view of the barrier metal film in the treatment for denitrification.

FIG. 29 is a schematic side view of a metal film production apparatus according to the fifteenth embodiment of the present invention. FIG. 30 is a schematic construction drawing showing another example of diluent gas supply means. FIG. 31 shows the sectional status of a substrate illustrating a barrier metal film. FIGS. 32 and 33 show the concept status of a barrier metal film in denitrification. The illustrated metal film production apparatus corresponds to the Cu-CVD 404 shown in FIG. 1

As shown in FIG. 29, a support platform 202 is provided near the bottom of a cylindrical chamber 201 made of, say, a ceramic (an insulating material), and a substrate 203 is placed on the support platform 202. Temperature control means 206, as control means, equipped with a heater 204 and refrigerant flow-through means 205 is provided in the support platform 202 so that the support platform 202 is controlled to a predetermined temperature (for example, a temperature at which the substrate 203 is maintained at 100 to 200° C.) by the temperature control means 206.

An upper surface of the chamber 201 is an opening, which is closed with a copper plate member 207, as an etched member, made of a metal. The interior of the chamber 201 closed with the copper plate member 207 is maintained at a predetermined pressure by a vacuum device 208. A coiled plasma antenna 209 is provided around a cylindrical portion of the chamber 201. A matching instrument 210 and a power source 211 are connected to the plasma antenna 209 to supply power. Plasma generation means is constituted by the plasma antenna 209, matching instrument 210 and power source 211.

Nozzles 212 for supplying a source gas (a $Cl_2$ gas diluted with He or Ar to a chlorine concentration of $\leq 50\%$, preferably about 10%), containing chlorine as a halogen, to the interior of the chamber 201 are connected to the cylindrical portion of the chamber 201 above the support platform 202. The nozzle 212 is fed with the source gas via a flow controller 213. Within the chamber 201, the source gas is fed toward the copper plate member 207 (source gas supply means). Fluorine (F), bromine (Br) or iodine (I) can also be applied as the halogen to be incorporated into the source gas.

With the above-described metal film production apparatus, the source gas is supplied from the nozzles 212 into the chamber 201, and electromagnetic waves are shot from the plasma antenna 209 into the chamber 201, whereby the $Cl_2$ gas is ionized to generate a $Cl_2$ gas plasma (source gas plasma) 214. The pressure inside the chamber 201, set by the vacuum device 208, is such a high pressure that the plasma density of the $Cl_2$ gas plasma 214 will be higher toward the wall surface within the chamber 201. As means for increasing the plasma density of the $Cl_2$ gas plasma 214 on the wall surface side, the frequency of the power source 211 may be increased.

The $Cl_2$ gas plasma 214 causes an etching reaction to the copper plate member 207, forming a precursor ($Cu_xCl_y$) 215. At this time, the copper plate member 207 is maintained by the $Cl_2$ gas plasma 214 at a predetermined temperature (e.g., 200 to 400° C.) which is higher than the temperature of the substrate 203.

The precursor ($Cu_xCl_y$) 215 formed within the chamber 201 is transported toward the substrate 203 controlled to a lower temperature than the temperature of the copper plate member 207. The precursor ($Cu_xCl_y$) 215 transported toward the substrate 203 is converted into only Cu ions by a reduction reaction, and directed at the substrate 203 to form a thin Cu film 216 on the surface of the substrate 203.

The reactions involved can be expressed by:

$$2Cu+Cl_2 \rightarrow 2CuCl \rightarrow 2Cu\downarrow +Cl_2\uparrow$$

The gases and the etching products that have not been involved in the reaction are exhausted through an exhaust port 217.

The source gas has been described, with the $Cl_2$ gas diluted with, say, He or Ar taken as an example. However, the $Cl_2$ gas can be used alone, or an HCl gas can also be applied. If the HCl gas is applied, an HCl gas plasma is generated as the source gas plasma. However, the precursor formed by etching of the copper plate member 207 is $Cu_xCl_y$. Thus, the source gas may be any gas containing chlorine, and a gas mixture of an HCl gas and a $Cl_2$ gas is also usable. The material for the copper plate member 207 is not limited to copper (Cu), but it is possible to use a halide forming metal, preferably a chloride forming metal, such as Ag, Au, Pt, Ta, Ti or W. In this case, the resulting precursor is a halide (chloride) of Ag, Au, Pt, Ta, Ti or W, and the thin film formed on the surface of the substrate 203 is that of Ag, Au, Pt, Ta, Ti or W.

Since the metal film production apparatus constructed as above uses the $Cl_2$ gas plasma (source gas plasma) 214, the reaction efficiency is markedly increased, and the speed of film formation is fast. Since the $Cl_2$ gas is used as the source gas, moreover, the cost can be markedly decreased. Furthermore, the substrate 203 is controlled to a lower temperature than the temperature of the copper plate member 207 by use of the temperature control means 206. Thus, the amounts of impurities, such as chlorine, remaining in the thin Cu film 216 can be decreased, so that a high quality thin Cu film 216 can be produced.

Furthermore, the plasma density of the $Cl_2$ gas plasma 214 is higher on the wall surface side. Thus, a high density $Cl_2$ gas plasma 214 can be generated, thus making the film formation speed remarkably high. Even when a large chamber 201 is used, namely, even for a large substrate 203, a thin Cu film 216 can be formed.

Diluent gas nozzles 221 are provided, as diluent gas supply means, for supplying an Ar gas, as a diluent gas, to the interior of the chamber 201 above the surface of the substrate 203. The Ar gas is supplied from the diluent gas nozzle 221, and electromagnetic waves are shot from the plasma antenna 209 into the chamber 201, whereby the Ar gas is ionized to generate an Ar gas plasma (surface treatment plasma generation means). A bias power source 220 is connected to the support platform 202, and a bias voltage is applied thereto for supporting the substrate 203 on the support platform 202.

In connection with the diluent gas supply means, when the Ar gas is applied as a diluent gas for the $Cl_2$ gas, a control valve 222 may be provided at the site of merger between the source gas ($Cl_2$ gas) and the diluent gas (Ar gas), as shown in FIG. 30. By so doing, the $Cl_2$ gas may be stopped during generation of the Ar gas plasma, and only the Ar gas may be supplied through the nozzle 212. According to this construction, there is no need for the provision of the diluent gas nozzle 221, presenting advantage in space.

On the surface of the substrate 203 carried into the above-described metal film production apparatus, the barrier metal film 223 of TaN has been formed, as shown in FIG. 31. By generating the Ar gas plasma, the barrier metal film 223 on the surface of the substrate 203 is etched with $Ar^+$ to flatten the barrier metal film 223. Also, denitrification is performed in which the nitrogen atoms (N) of the TaN in the superficial layer of the barrier metal film 223 are removed to decrease the nitrogen content of the superficial layer relative to the interior of the matrix of the barrier metal film 223. As the barrier metal film 223, WN or TiN can also be applied.

The flattening of the barrier metal film 223 and its denitrification upon generation of the Ar gas plasma are carried out before formation of the aforementioned thin Cu film 216. That is, when the substrate 203 having the barrier metal film 223 of TaN formed thereon is received onto the support platform 202, the Ar gas is supplied from the diluent gas nozzles 221 prior to the formation of the thin Cu film 216. At the same time, electromagnetic waves are shot from the plasma antenna 209 into the chamber 201 to generate an Ar gas plasma.

Upon generation of the Ar gas plasma, the surface of the barrier metal film 223 is etched with $Ar^+$ for flattening. As shown in FIG. 32, the barrier metal film 223 comprises Ta and N in an amorphous state. In this state, N of a lower mass is preferentially removed by $Ar^+$, so that the superficial layer of the barrier metal film 223 (for example, up to a half, preferably about a third, of the entire film thickness) is denitrified. As a result, there emerges the barrier metal film 223 of a two-layer structure, a metal layer 223a substantially composed of Ta, and a TaN layer 223b, as shown in FIG. 33. On this occasion, the entire film thickness of the barrier metal film 223 remains the film thickness having the single layer.

To increase the amount of $Ar^+$ generated, control is exercised for increasing the voltage applied to the plasma antenna 209, or for increasing the flow rate of the Ar gas. To draw in $Ar^+$ toward the substrate 203, the bias power source 220 is controlled to lower the potential of the substrate 203 to the negative side. For this purpose, schedule control is easy to effect according to a preset schedule. While denitrification is taking place, the depth distribution of the metal layer 223a is measured. Control over the voltage of the plasma antenna 209 or the flow rate of the Ar gas, or control of the bias power source 220 can be exercised based on the results of the measurement.

After denitrification is performed, the sites of N removed become voids, creating irregularities on the atomic level. Thus, it is preferred to densify the remaining Ta atoms. To make the Ta atoms dense, the present embodiment uses a heater 204 to heat the substrate 203 for heat treatment, thereby densifying the Ta atoms (densification means). The heat treatment is performed to such a degree that the atoms do not take a crystal structure (the atoms maintain an amorphous state). The densification means may be plasma heating for heating the substrate 203.

With the foregoing metal film production apparatus, the Ar gas plasma is generated within the chamber 201 accommodating the substrate 203 having the barrier metal film 223 formed thereon. The Ar gas plasma etches the barrier metal film 223 to flatten it. The Ar gas plasma also removes the nitrogen atoms to denitrify the barrier metal film 223. Thus, there appears the barrier metal film 223 with a two-layer structure, i.e., the metal layer 223a composed substantially of Ta and the TaN layer 223b. Moreover, the entire film thickness can remain the single-layer film thickness. Hence, the barrier metal film 223 can be in a two-layer structure state without becoming thick, and yet the metal layer 223a can retain adhesion to the thin Cu film 216, while the TaN layer 223*b* can prevent diffusion of Cu. Consequently, the thin Cu film 216 can be formed, with satisfactory adhesion, without diffusion into the substrate 203, so that the Cu wiring process can be stabilized.

Figure 34:
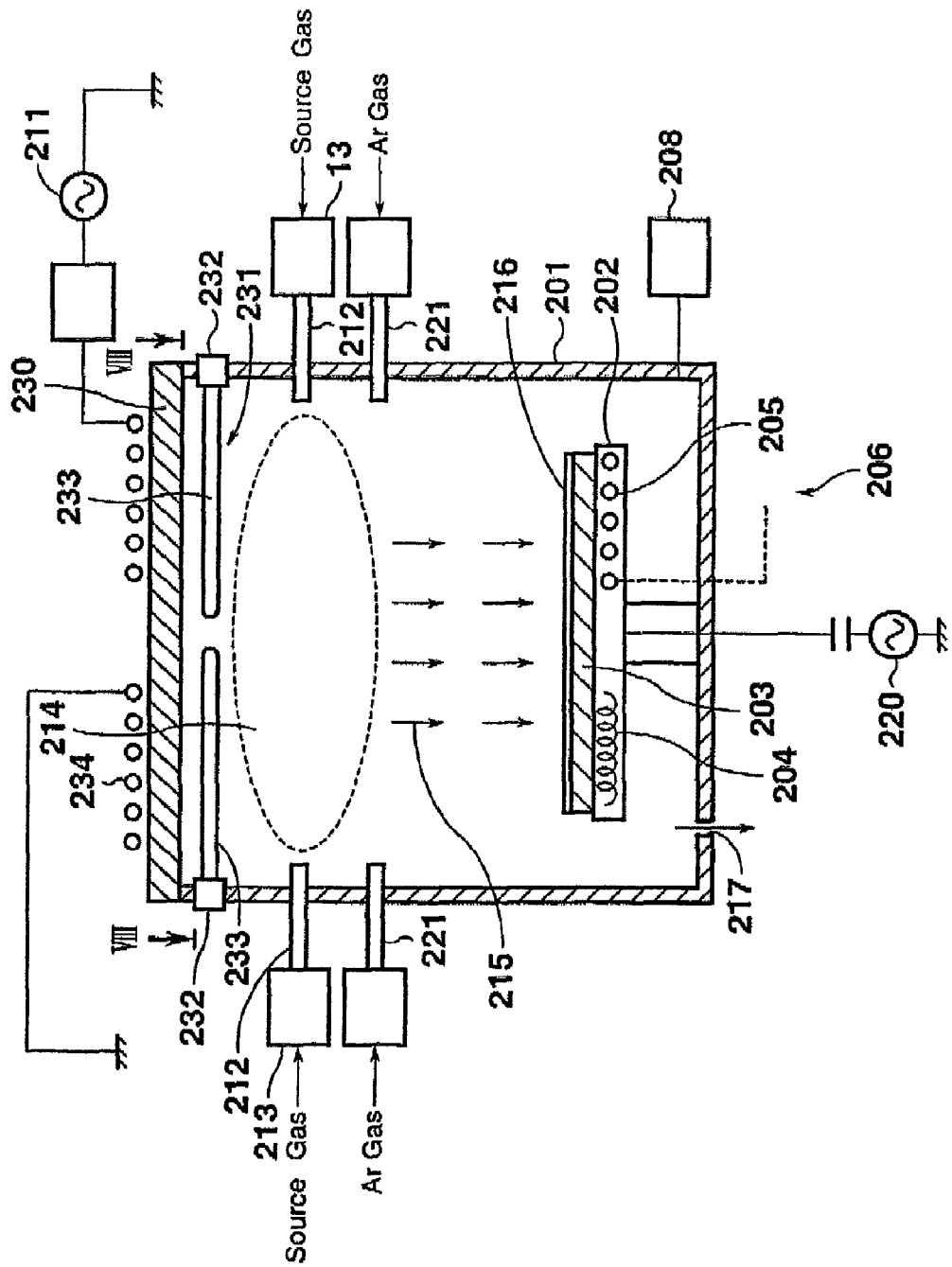
FIG. 34 is a schematic side view of a metal film production apparatus according to a sixteenth embodiment of the present invention.
Figure 35:
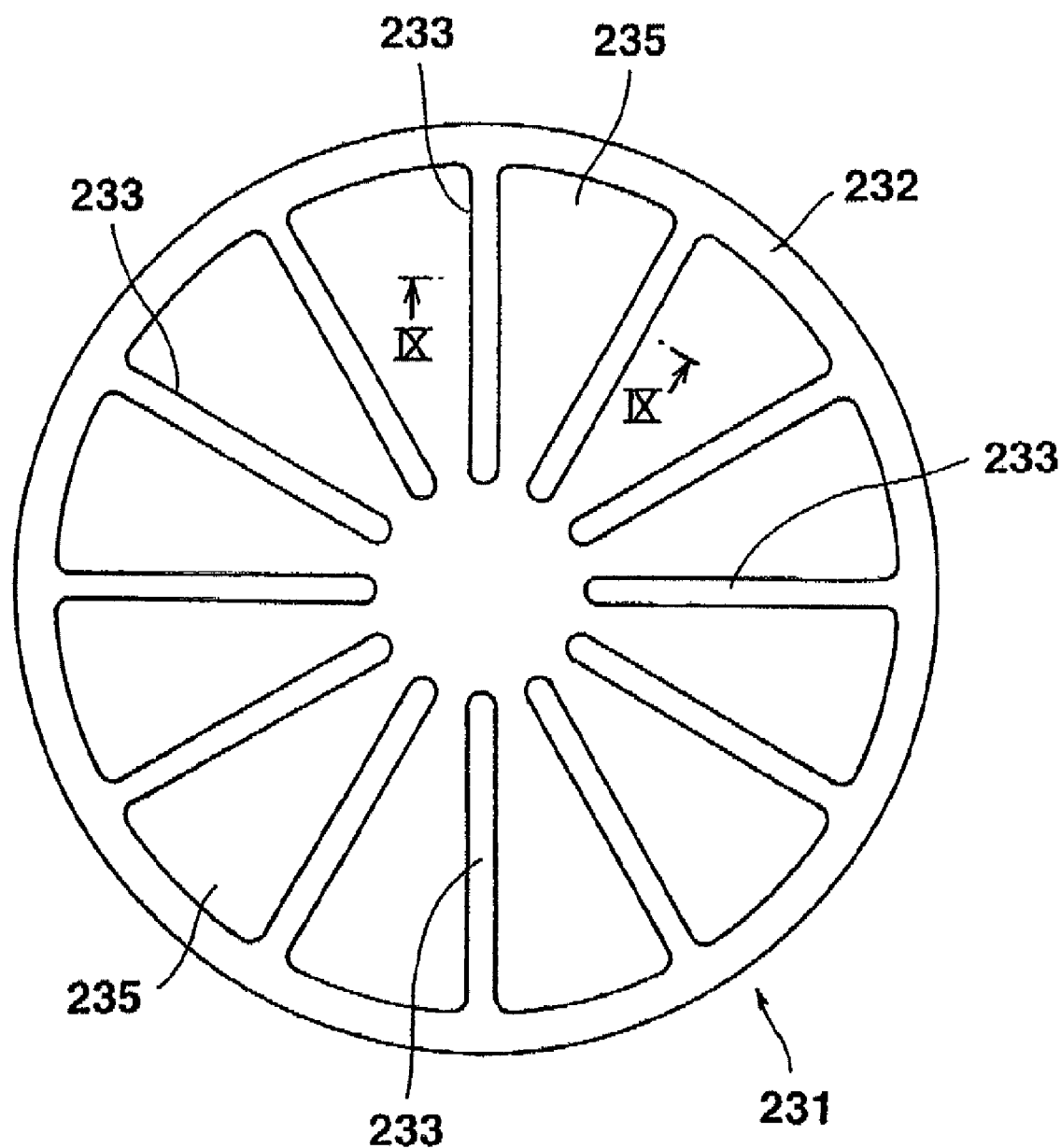
FIG. 35 is a view taken along the arrowed line VIII-VIII of FIG. 34.
Figure 36:
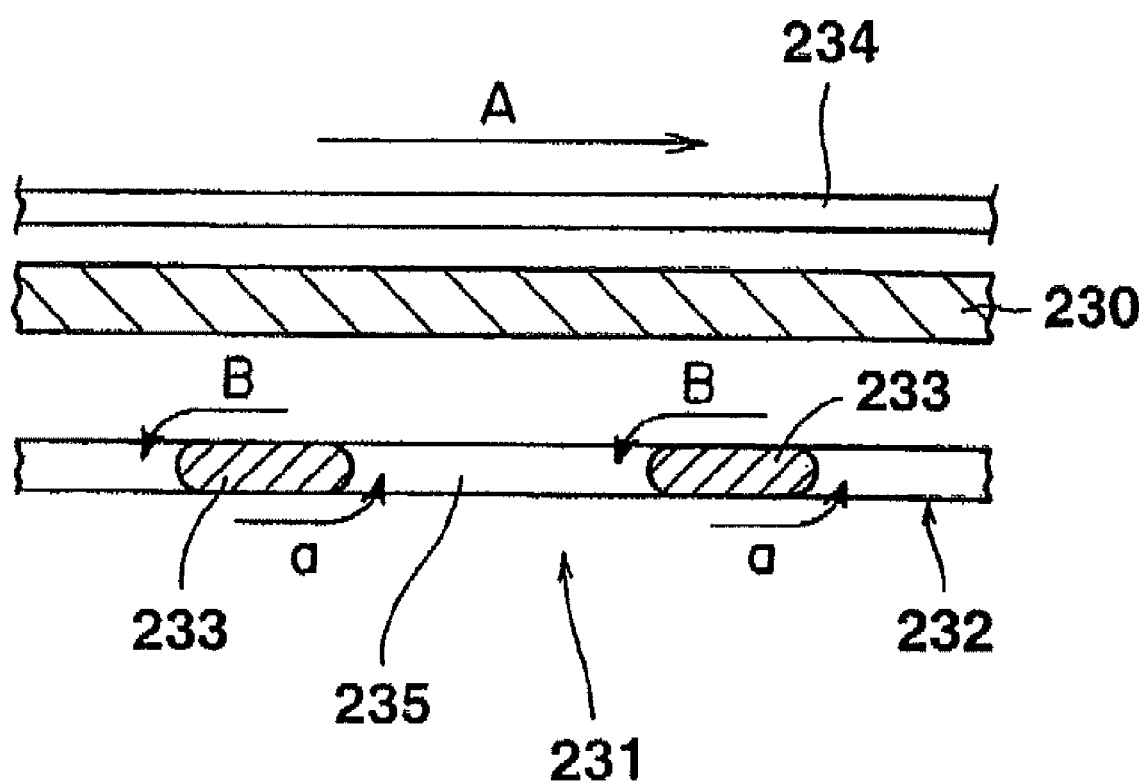
FIG. 36 is a view taken along the arrowed line IX-IX of FIG. 35.

A barrier metal film production method and a barrier metal film production apparatus according to the sixteenth embodiment of the present invention will be described with reference to FIGS. 34 to 36. FIG. 34 is a schematic side view of the metal film production apparatus according to the sixteenth embodiment of the present invention. FIG. 35 is a view taken along the arrowed line VIII-VIII of FIG. 34. FIG. 36 is a view taken along the arrowed line IX-IX of FIG. 35. The same members as the members illustrated in FIG. 29 are assigned the same numerals, and duplicate explanations are omitted.

An upper surface of the chamber 201 is an opening, which is closed with a disk-shaped ceiling board 230 made of an insulating material (for example, a ceramic). An etched member 231 made of a metal (copper, Cu) is interposed between the opening at the upper surface of the chamber 201 and the ceiling board 230. The etched member 231 is provided with a ring portion 232 fitted to the opening at the upper surface of the chamber 201. A plurality of (12 in the illustrated embodiment) protrusions 233, which extend close to the center in the diametrical direction of the chamber 201 and have the same width, are provided in the circumferential direction on the inner periphery of the ring portion 232.

The protrusions 233 are integrally or removably attached to the ring portion 232. Notches (spaces) 235 formed between the protrusions 233 are present between the ceiling board 230 and the interior of the chamber 201. The ring portion 232 is earthed, and the plural protrusions 233 are electrically connected together and maintained at the same potential. Temperature control means (not shown), such as a heater, is provided in the etched member 231 to control the temperature of the etched member 231 to 200 to 400° C., for example.

Second protrusions shorter in the diametrical direction than the protrusions 233 can be arranged between the protrusions 233. Moreover, short protrusions can be arranged between the protrusion 233 and the second protrusion. By so doing, the area of copper, an object to be etched, can be secured, with an induced current being suppressed.

A planar winding-shaped plasma antenna 234, for converting the atmosphere inside the chamber 201 into a plasma, is provided above the ceiling board 230. The plasma antenna 234 is formed in a planar ring shape parallel to the surface of the ceiling board 230. A matching instrument 210 and a power source 211 are connected to the plasma antenna 234 to supply power. The etched member 231 has the plurality of protrusions 233 provided in the circumferential direction on the inner periphery of the ring portion 232, and includes the notches (spaces) 235 formed between the protrusions 233. Thus, the protrusions 233 are arranged between the substrate 203 and the ceiling board 230 in a discontinuous state relative to the flowing direction of electricity in the plasma antenna 234.

With the above-described metal film production apparatus, the source gas is supplied through the nozzles 212 to the interior of the chamber 201, and electromagnetic waves are shot from the plasma antenna 234 into the chamber 201. As a result, the $Cl_2$ gas is ionized to generate a $Cl_2$ gas plasma (source gas plasma) 214. The etched member 231, an electric conductor, is present below the plasma antenna 234. However, the $Cl_2$ gas plasma 214 occurs stably between the etched member 231 and the substrate 203, namely, below the etched member 231, under the following action:

The action by which the $Cl_2$ gas plasma 214 is generated below the etched member 231 will be described. As shown in FIG. 36, a flow A of electricity in the plasma antenna 234 of the planar ring shape crosses the protrusions 233. At this time, an induced current B occurs on the surface of the protrusion 233 opposed to the plasma antenna 234. Since the notches (spaces) 235 are present in the etched member 231, the induced current B flows onto the lower surface of each protrusion 233, forming a flow a in the same direction as the flow A of electricity in the plasma antenna 234 (Faraday shield).

When the etched member 231 is viewed from the substrate 203, therefore, there is no flow in a direction in which the flow A of electricity in the plasma antenna 234 is canceled out. Furthermore, the ring portion 232 is earthed, and the protrusions 233 are maintained at the same potential. Thus, even though the etched member 231, an electric conductor, exists, the electromagnetic wave is reliably thrown from the plasma antenna 234 into the chamber 201. Consequently, the $Cl_2$ gas plasma 214 is stably generated below the etched member 231.

The $Cl_2$ gas plasma 214 causes an etching reaction to the etched member 231 made of copper, forming a precursor $(Cu_xCl_y)$ 215. At this time, the etched member 231 is maintained by the $Cl_2$ gas plasma 214 at a predetermined temperature (e.g., 200 to 400° C.) which is higher than the temperature of the substrate 203. The precursor $(Cu_xCl_y)$ 215 formed within the chamber 201 is transported toward the substrate 203 controlled to a lower temperature than the temperature of the etched member 231. The precursor $(Cu_xCl_y)$ 215 transported toward the substrate 203 is converted into only Cu ions by a reduction reaction, and directed at the substrate 203 to form a thin Cu film 216 on the surface of the substrate 203.

The reactions involved are the same as in the aforementioned fifteenth embodiment. The gases and the etching products, which have not been involved in the reactions, are exhausted through an exhaust port 217.

Since the metal film production apparatus constructed as above uses the $Cl_2$ gas plasma (source gas plasma) 214, the reaction efficiency is markedly increased, and the speed of film formation is fast. Since the $Cl_2$ gas is used as the source gas, moreover, the cost can be markedly decreased. Furthermore, the substrate 203 is controlled to a lower temperature than the temperature of the etched member 231 by use of the temperature control means 206. Thus, the amounts of impurities, such as chlorine, remaining in the thin Cu film 216 can be decreased, so that a high quality thin Cu film 216 can be produced.

In addition, the etched member 231 has the plurality of protrusions 233 provided in the circumferential direction on the inner periphery of the ring portion 232, and includes the notches (spaces) 235 formed between the protrusions 233. Thus, the induced currents generated in the etched member 231 flow in the same direction as the flowing direction of electricity in the plasma antenna 234, when viewed from the substrate 203. Therefore, even though the etched member 231, an electric conductor, exists below the plasma antenna 234, the electromagnetic waves are reliably thrown from the plasma antenna 234 into the chamber 201. Consequently, the $Cl_2$ gas plasma 214 can be stably generated below the etched member 231.

Diluent gas nozzles 221 are provided, as diluent gas supply means, for supplying an Ar gas, as a diluent gas, to the interior of the chamber 201 above the surface of the substrate 203. The Ar gas is supplied from the diluent gas nozzle 221, and electromagnetic waves are shot from the plasma antenna 234 into the chamber 201, whereby the Ar gas is ionized to generate an Ar gas plasma (surface treatment plasma generation means). A bias power source 220 is connected to the support platform 202, and a bias voltage is applied thereto for supporting the substrate 203 on the support platform 202.

On the surface of the substrate 203 admitted into the above-described, metal film production apparatus, the barrier metal film 223 of TaN has been formed, as shown in FIG. 31. By generating the Ar gas plasma, the barrier metal film 223 on the surface of the substrate 203 is etched with Ar$^+$ to flatten the barrier metal film 223. Also, denitrification is performed in which the nitrogen atoms (N) of the TaN in the superficial layer of the barrier metal film 223 are removed to decrease the nitrogen content of the superficial layer relative to the interior of the matrix of the barrier metal film 223. As the barrier metal film 223, WN or TiN can also be applied.

The flattening of the barrier metal film 223 and its denitrification upon generation of the Ar gas plasma are carried out before formation of the aforementioned thin Cu film 216. The details of the flattening of the barrier metal film 223, and the details of the denitrification of this film are the same as in the fifteenth embodiment, and relevant explanations are omitted.

With the foregoing metal film production apparatus, as in the fifteenth embodiment, the barrier metal film 223 can be in a two-layer structure state without becoming thick, and yet the metal layer 223a can retain adhesion to the thin Cu film 216, while the TaN layer 223b can prevent diffusion of Cu. Consequently, the thin Cu film 216 can be formed, with satisfactory adhesion, without diffusion into the substrate 203, so that the Cu wiring process can be stabilized.

Figure 37:
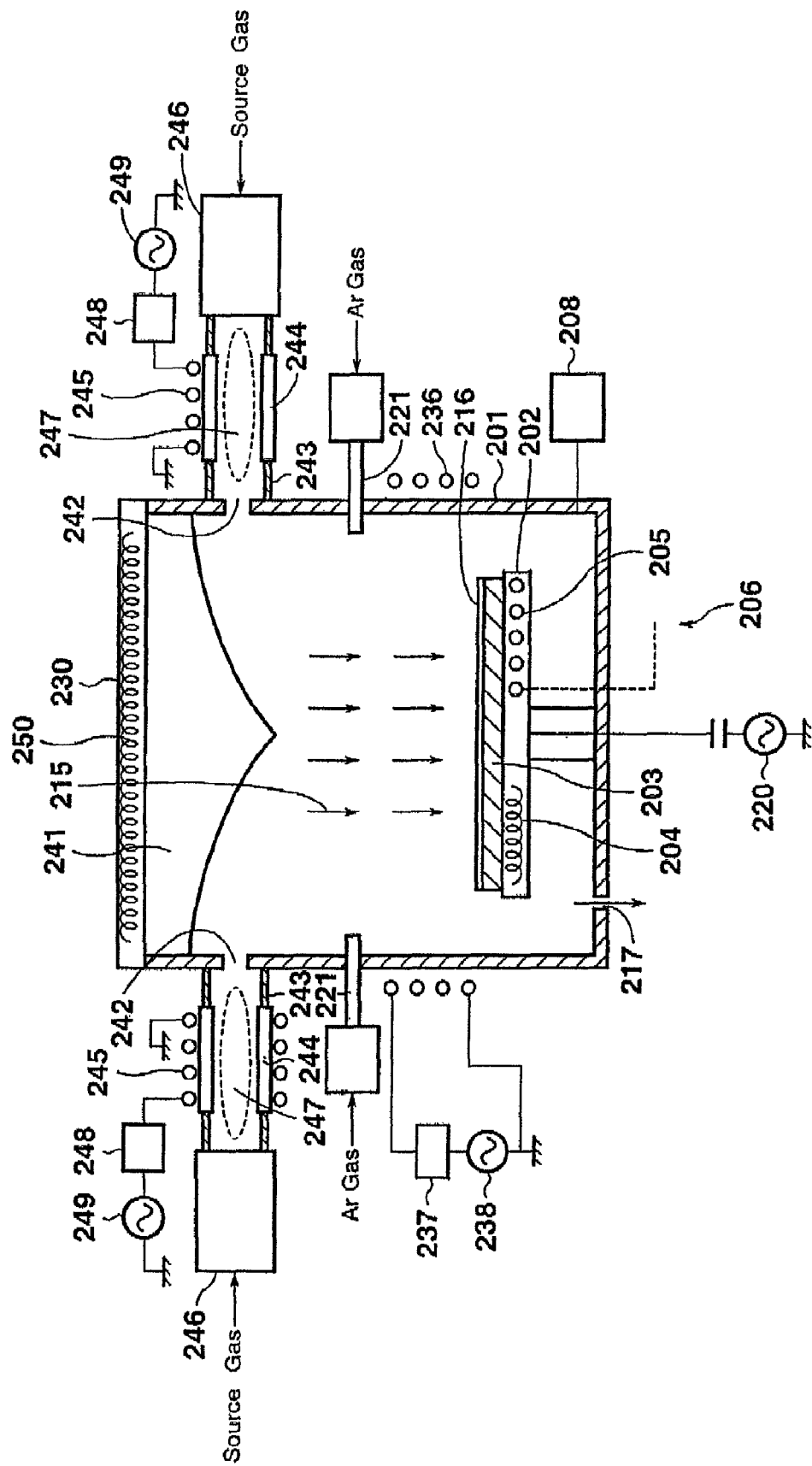
FIG. 37 is a schematic side view of a metal film production apparatus according to a seventeenth embodiment of the present invention.

A metal film production method and a metal film production apparatus according to the seventeenth embodiment of the present invention will be described with reference to FIG. 37. FIG. 37 is a schematic side view of the metal film production apparatus according to the seventeenth embodiment of the present invention. The same members as the members illustrated in FIGS. 2 and 7 are assigned the same numerals, and duplicate explanations are omitted.

The opening of an upper portion of a chamber 201 is closed with a ceiling board 230, for example, made of a ceramic (an insulating material). An etched member 241 made of a metal (copper, Cu) is provided on a lower surface of the ceiling board 230, and the etched member 241 is of a quadrangular pyramidal shape. Slit-shaped opening portions 242 are formed at a plurality of locations (for example, four locations) in the periphery of an upper part of the cylindrical portion of the chamber 201, and one end of a tubular passage 243 is fixed to each of the opening portions 242. A tubular excitation chamber 244 made of an insulator is provided halfway through the passage 243, and a coiled plasma antenna 245 is provided around the excitation chamber 244. The plasma antenna 245 is connected to a matching instrument 248 and a power source 249 to receive power. The plasma antenna 245, the matching instrument 248 and the power source 249 constitute plasma generation means.

A flow controller 246 is connected to the other end of the passage 243, and a chlorine-containing source gas (a Cl$_2$ gas diluted with He or Ar to a chlorine concentration of ≦50%, preferably about 10%) is supplied into the passage 243 via the flow controller 246. By shooting electromagnetic waves from the plasma antenna 245 into the excitation chamber 244, the Cl$_2$ gas is ionized to generate a Cl$_2$ gas plasma (source gas plasma) 247. Because of the generation of the Cl$_2$ gas plasma 247, excited chlorine is fed into the chamber 201 through the opening portion 42, whereupon the etched member 241 is etched with excited chlorine.

With the above-described metal film production apparatus, the source gas is supplied into the passage 243 via the flow controller 246 and fed into the excitation chamber 244. By shooting electromagnetic waves from the plasma antenna 245 into the excitation chamber 244, the Cl$_2$ gas is ionized to generate a Cl$_2$ gas plasma (source gas plasma) 247. Since a predetermined differential pressure has been established between the pressure inside the chamber 201 and the pressure inside the excitation chamber 244 by the vacuum device 208, the excited chlorine of the Cl$_2$ gas plasma 247 in the excitation chamber 244 is fed to the etched member 241 inside the chamber 201 through the opening portion 242. The excited chlorine causes an etching reaction to the etched member 241, forming a precursor (M$_x$Cl$_y$) 215 inside the chamber 201.

At this time, the etched member 241 is maintained at a predetermined temperature (e.g., 200 to 400° C.), which is higher than the temperature of the substrate 203, by a heater 250. The precursor (Cu$_x$Cl$_y$) 215 formed inside the chamber 201 is transported toward the substrate 203 controlled to a lower temperature than the temperature of the etched member 241. The precursor (Cu$_x$Cl$_y$) 215 transported toward the substrate 203 is converted into only Cu ions by a reduction reaction, and directed at the substrate 203 to form a thin Cu film 216 on the surface of the substrate 203.

The reactions on this occasion are the same as in the aforementioned fifteenth embodiment, and the gases and etching products that have not been involved in the reactions are exhausted through an exhaust port 217.

With the above-described metal film production apparatus, the Cl$_2$ gas plasma 247 is generated in the excitation chamber 244 isolated from the chamber 201. Thus, the substrate 203 is not exposed to the plasma any more, and the substrate 203 becomes free from damage from the plasma. As the means for generating the Cl$_2$ gas plasma 247 in the excitation chamber 244, it is possible to use microwaves, laser, electron rays, or synchrotron radiation. It is also permissible to form the precursor by heating a metal filament to a high temperature. The construction for isolating the Cl$_2$ gas plasma 247 from the substrate 203 may be the provision of the excitation chamber 244 in the passage 243, or may be other construction, for example, the isolation of the chamber 201.

The above-described metal film production apparatus is provided with diluent gas nozzles 221, as diluent gas supply means, for supplying an Ar gas, as a diluent gas, to the interior of the chamber 201 above the surface of the substrate 203. A coil-shaped surface treatment plasma antenna 236 is provided on a trunk portion of the chamber 201. A matching instrument 237 and a power source 238 are connected to the surface treatment plasma antenna 236 to supply power. The Ar gas is supplied from the diluent gas nozzles 221, and electromagnetic waves are shot from the plasma antenna 236 into the chamber 201, whereby the Ar gas is ionized to generate an Ar gas plasma (surface treatment plasma generation means). A bias power source 220 is connected to the support platform 202, and a bias voltage is applied thereto for supporting the substrate 203 on the support platform 202.

On the surface of the substrate 203 admitted into the above-described metal film production apparatus, a barrier metal film 223 of TaN has been formed, as shown in FIG. 31. By generating the Ar gas plasma, the barrier metal film 223 on the surface of the substrate 203 is etched with Ar$^+$ to flatten the barrier metal film 223. Also, denitrification is performed in which the nitrogen atoms (N) of the TaN in the superficial layer of the barrier metal film 223 are removed to decrease the nitrogen content of the superficial layer relative to the interior of the matrix of the barrier metal film 223. As the barrier metal film 223, WN or TiN can also be applied.

The flattening of the barrier metal film 223 and its denitrification upon generation of the Ar gas plasma are carried out before formation of the aforementioned thin Cu film 216. The details of the flattening of the barrier metal film 223 and the denitrification of this film are the same as in the fifteenth embodiment, and relevant explanations are omitted.

With the foregoing metal film production apparatus, the barrier metal film 223 can be in a two-layer structure state without becoming thick, and yet the metal layer 223a (see FIG. 33) can retain adhesion to the thin Cu film 216, while the TaN layer 223b (see FIG. 33) can prevent diffusion of Cu. Consequently, the thin Cu film 216 can be formed, with satisfactory adhesion, without diffusion into the substrate 203, so that the Cu wiring process can be stabilized.

Figure 38:
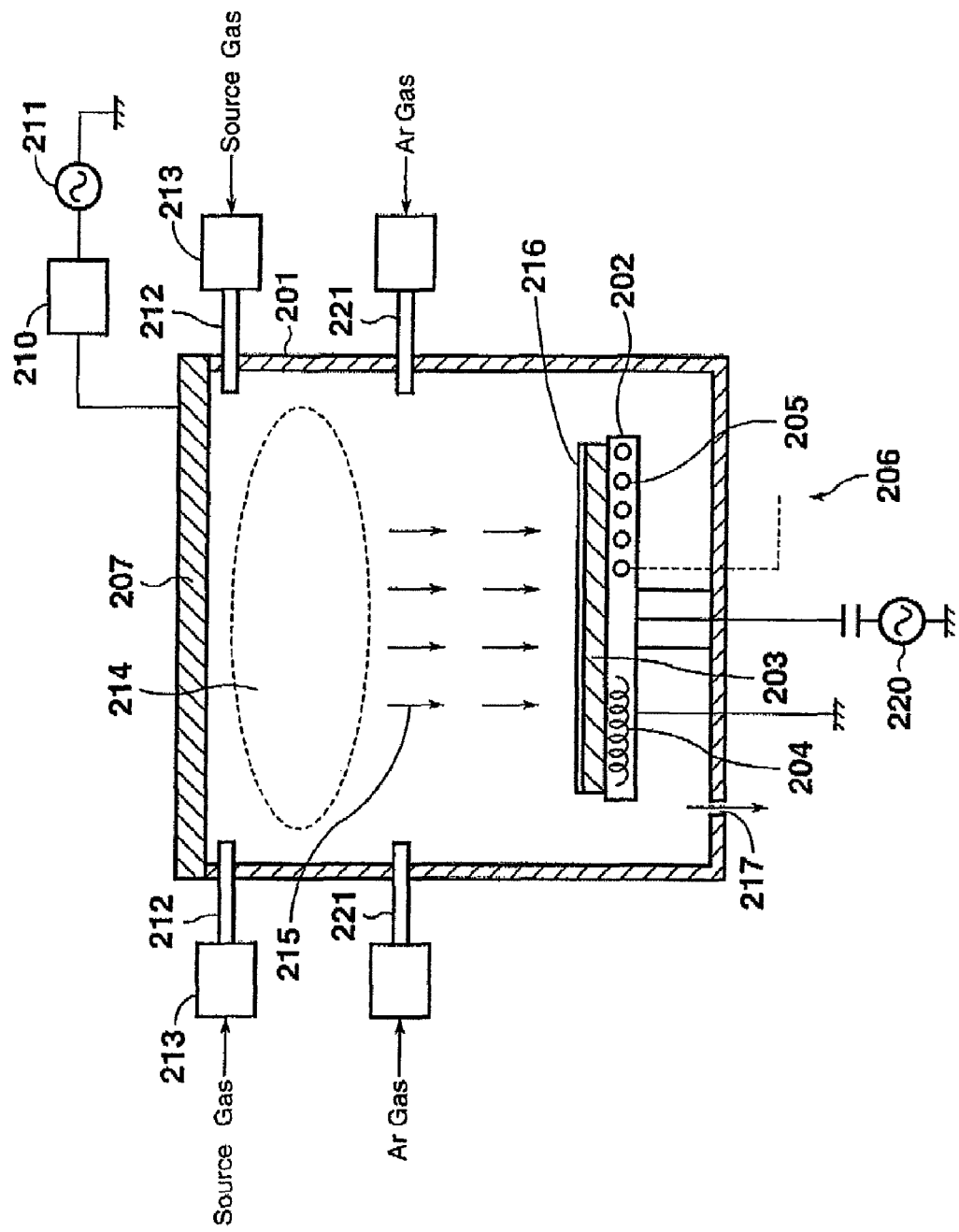
FIG. 38 is a schematic side view of a metal film production apparatus according to an eighteenth embodiment of the present invention.

A barrier metal film production method and a barrier metal film production apparatus according to the eighteenth embodiment of the present invention will be described with reference to FIG. 38. FIG. 38 is a schematic side view of the metal film production apparatus according to the eighteenth embodiment of the present invention. The same members as the members illustrated in FIGS. 29, 34 and 37 are assigned the same numerals, and duplicate explanations are omitted.

Compared with the metal film production apparatus of the fifteenth embodiment shown in FIG. 29, the plasma antenna 209 is not provided around the cylindrical portion of the chamber 201, and the matching instrument 210 and power source 211 are connected to the copper plate member 207 for supply of power to the copper plate member 207. With the above-described metal film production apparatus, the source gas is supplied from the nozzles 212 into the chamber 201, and electromagnetic waves are shot from the copper plate member 207 into the chamber 201, the $Cl_2$ gas is ionized to generate a $Cl_2$ gas plasma (source gas plasma) 214. The $Cl_2$ gas plasma 214 causes an etching reaction to the copper plate member 207, forming a precursor ($Cu_xCl_y$) 215. At this time, the copper plate member 207 is maintained at a predetermined temperature (e.g., 200 to 400° C.), which is higher than the temperature of the substrate 203, by the $Cl_2$ gas plasma 214.

The precursor ($Cu_xCl_y$) 215 formed inside the chamber 201 is transported toward the substrate 203 controlled to a lower temperature than the temperature of the copper plate member 207. The precursor ($Cu_xCl_y$) 215 transported toward the substrate 203 is converted into only Cu ions by a reduction reaction, and directed at the substrate 203 to form a thin Cu film 216 on the surface of the substrate 203. The reactions on this occasion are the same as in the aforementioned fifteenth embodiment, and the gases and etching products that have not been involved in the reactions are exhausted through an exhaust port 217.

With the above-described metal film production apparatus, the copper plate member 207 itself is applied as an electrode for plasma generation. Thus, the plasma antenna 209 intended to prepare the thin Cu film 216 need not be provided around the cylindrical portion of the chamber 201.

The above-described metal film production apparatus is provided with diluent gas nozzles 221, as diluent gas supply means, for supplying an Ar gas, as a diluent gas, to the interior of the chamber 201 above the surface of the substrate 203. Supply of the source gas through the nozzles 212 is cut off, the Ar gas is supplied from the diluent gas nozzles 221, and electromagnetic waves are shot from the copper plate member 207 into the chamber 201. By so doing, the Ar gas is ionized to generate an. Ar gas plasma (surface treatment plasma generation means). A bias power source 220 is connected to the support platform 202, and a bias voltage is applied thereto for supporting the substrate 203 on the support platform 202.

On the surface of the substrate 203 admitted into the above-described metal film production apparatus, a barrier metal film 223 of TaN has been formed, as shown in FIG. 31. By generating the Ar gas plasma, the barrier metal film 223 on the surface of the substrate 203 is etched with $Ar^+$ to flatten the barrier metal film 223. Also, denitrification is performed in which the nitrogen atoms (N) of the TaN in the superficial layer of the barrier metal film 223 are removed to decrease the nitrogen content of the superficial layer relative to the interior of the matrix of the barrier metal film 223. As the barrier metal film 223, WN or TiN can also be applied. As the surface treatment plasma generation means, it is permissible to provide a coiled surface treatment plasma antenna on the trunk portion of the chamber 201, and supply power via a matching instrument and a power source, thereby generating an Ar gas plasma.

The flattening of the barrier metal film 223 and its denitrification upon generation of the Ar gas plasma are carried out before formation of the aforementioned thin Cu film 216. The details of the flattening of the barrier metal film 223 and the denitrification of this film are the same as in the fifteenth embodiment, and relevant explanations are omitted.

With the foregoing metal film production apparatus, as in the fifteenth embodiment, the barrier metal film 223 can be in a two-layer structure state without becoming thick, and the metal layer 223a (see FIG. 33) can retain adhesion to the thin Cu film 216, while the TaN layer 223b (see FIG. 33) can prevent diffusion of Cu. Consequently, the thin Cu film 216 can be formed, with satisfactory adhesion, without diffusion into the substrate 203, so that the Cu wiring process can be stabilized.

Figure 39:
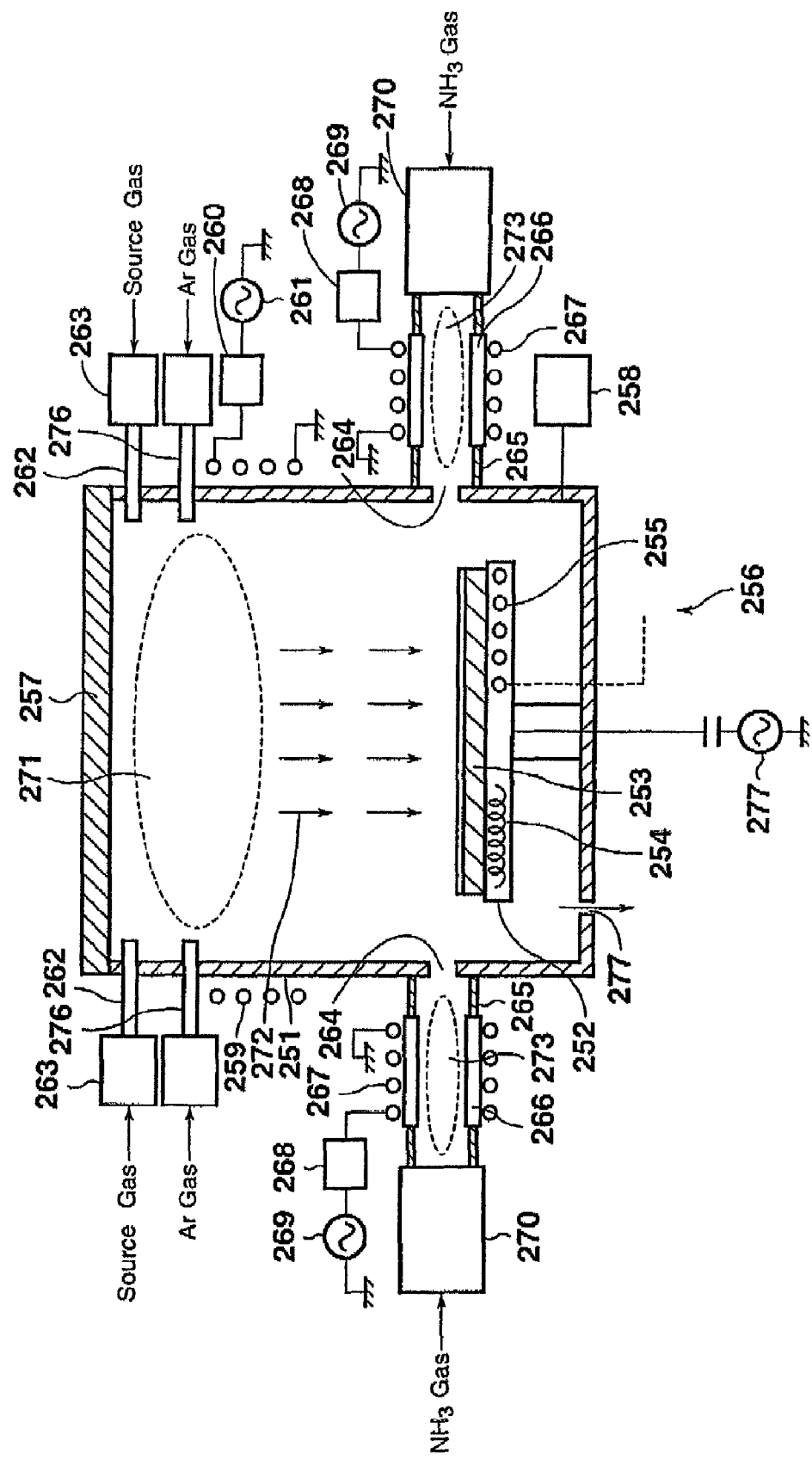
FIG. 39 is a schematic side view of a metal film production apparatus according to a nineteenth embodiment of the present invention.

Next, an example in which embodiments of the metal film production method and metal film production apparatus according to the first aspect are provided in the barrier metal CVD 403 will be described with reference to FIG. 39. FIG. 39 schematically shows a side view of the metal film production apparatus according to the nineteenth embodiment of the present invention.

As shown in the drawing, a support platform 252 is provided near the bottom of a cylindrical chamber 251 made of, say, a ceramic (an insulating material), and a substrate 253 is placed on the support platform 252. Temperature control means 256 equipped with a heater 254 and refrigerant flow-through means 255 is provided in the support platform 252 so that the support platform 252 is controlled to a predetermined temperature (for example, a temperature at which the substrate 253 is maintained at 100 to 200° C.) by the temperature control means 256.

An upper surface of the chamber 251 is an opening, which is closed with a metal member 257, as an etched member, made of a metal (e.g., W, Ti, Ta, or TiSi). The interior of the chamber 251 closed with the metal member 257 is maintained at a predetermined pressure by a vacuum device 258. A plasma antenna 259, as a coiled winding antenna of plasma generation means, is provided around a cylindrical portion of the chamber 251. A matching instrument 260 and a power source 261 are connected to the plasma antenna 259 to supply power.

Nozzles 262 for supplying a source gas (a $Cl_2$ gas diluted with He or Ar to a chlorine concentration of $\leq 50\%$, preferably about 10%), containing chlorine as a halogen, to the interior of the chamber 251 are connected to the cylindrical portion of the chamber 251 below the metal member 257. The nozzle 262 is open toward the horizontal, and is fed with the source gas via a flow controller 263 (halogen gas supply means). Fluorine (F), bromine (Br) or iodine (I) can also be applied as the halogen to be incorporated into the source gas.

Slit-shaped opening portions 264 are formed at a plurality of locations (for example, four locations) in the periphery of a lower part of the cylindrical portion of the chamber 251, and one end of a tubular passage 265 is fixed to each of the opening portions 264. A tubular excitation chamber 266 made of an insulator is provided halfway through the passage 265, and a coiled plasma antenna 267 is provided around the excitation chamber 266. The plasma antenna 267 is connected to a matching instrument 268 and a power source 269 to receive power. The plasma antenna 267, the matching instrument 268 and the power source 269 constitute excitation means. A flow controller 270 is connected to the other end of the passage 265, and an ammonia gas ($NH_3$ gas) as a nitrogen-containing gas is supplied into the passage 265 via the flow controller 270.

With the above-described metal film production apparatus, the source gas is supplied through the nozzles 262 to the interior of the chamber 251, and electromagnetic waves are shot from the plasma antenna 259 into the chamber 251. As a result, the $Cl_2$ gas is ionized to generate a $Cl_2$ gas plasma (source gas plasma) 271. The $Cl_2$ gas plasma 271 causes an etching reaction to the metal member 257, forming a precursor ($M_xCl_y$: M is a metal such as W, Ti, Ta or TiSi) 272.

Separately, the $NH_3$ gas is supplied into the passage 265 via the flow controller 270 and fed into the excitation chamber 266. By shooting electromagnetic waves from the plasma antenna 267 into the excitation chamber 266, the $NH_3$ gas is ionized to generate an $NH_3$ gas plasma 263. Since a predetermined differential pressure has been established between the pressure inside the chamber 251 and the pressure inside the excitation chamber 266 by the vacuum device 258, the excited ammonia of the $NH_3$ gas plasma 273 in the excitation chamber 266 is fed to the precursor ($M_xCl_y$) 272 inside the chamber 251 through the opening portion 264.

That is, excitation means for exciting the nitrogen-containing gas in the excitation chamber 266 isolated from the chamber 251 is constructed. Because of this construction, the metal component of the precursor ($M_xCl_y$) 272 and ammonia react to form a metal nitride (MN) (formation means). At this time, the metal member 257 and the excitation chamber 266 are maintained by the plasmas at predetermined temperatures (e.g., 200 to 400° C.) which are higher than the temperature of the substrate 253.

The metal nitride (MN) formed within the chamber 251 is transported toward the substrate 253 controlled to a low temperature, whereby a thin MN film 274 (a TaN film if the metal member 257 of Ta is applied) is formed on the surface of the substrate 253.

The reaction for formation of the thin MN film 274 can be expressed by:

2MCl+2NH$_3$→2MN↓+HCl↑+2H$_2$↑

The gases and the etching products that have not been involved in the reactions are exhausted through an exhaust port 277.

The source gas has been described, with the $Cl_2$ gas diluted with, say, He or Ar taken as an example. However, the $Cl_2$ gas can be used alone, or an HCl gas can also be applied. When the HCl gas is applied, an HCl gas plasma is generated as the source gas plasma. Thus, the source gas may be any gas containing chlorine, and a gas mixture of an HCl gas and a $Cl_2$ gas is also usable. As the material for the metal member 257, it is possible to use an industrially applicable metal such as Ag, Au, Pt or Si. Further, the $NH_3$ gas is supplied into the passage 265 and fed into the excitation chamber 266. At the same time, electromagnetic waves are shot from the plasma antenna 267 into the excitation chamber 266 to generate the $NH_3$ gas plasma 263. However, an $NH_3$ gas plasma can be generated within the chamber 251 by supplying an $NH_3$ gas into the chamber 251 and supplying power to the plasma antenna 259. In this case, the chamber 265, excitation chamber 266, plasma antenna 267, matching instrument 268 and power source 269 can be omitted.

With the above-described metal film production apparatus, the metal is formed by plasmas to produce the thin MN film 274 as the barrier metal film. Thus, the barrier metal film can be formed uniformly to a small thickness. Consequently, the barrier metal film can be formed highly accurately at a high speed with excellent burial properties in a very small thickness even to the interior of a tiny depression, for example, several hundred nanometers wide, which has been provided in the substrate 253.

The above-described metal film production apparatus is provided with diluent gas nozzles 276, as diluent gas supply means, for supplying an Ar gas, as a diluent gas, to the interior of the chamber 251 above the surface of the substrate 253. The Ar gas is supplied from the diluent gas nozzles 276, and electromagnetic waves are shot from the plasma antenna 259 into the chamber 251, whereby the Ar gas is ionized to generate an Ar gas plasma (surface treatment plasma generation means). A bias power source 277 is connected to the support platform 252, and a bias voltage is applied thereto for supporting the substrate 253 on the support platform 252.

With the above-described metal film production apparatus, the thin MN film 274 as a barrier metal film is formed, whereafter an Ar gas plasma is generated. By generating the Ar gas plasma, the barrier metal film on the surface of the substrate 253 is etched with Ar$^+$ to flatten the barrier metal film. Also, denitrification is performed in which the nitrogen atoms (N) of the TaN in the superficial layer of the barrier metal film are removed. After flattening of the barrier metal film and the removal of the nitrogen atoms (N) of the TaN in the superficial layer for denitrification, a thin copper (Cu) film or a thin aluminum (Al) film is formed on the barrier metal film by a film forming device. The details of the flattening of the barrier metal film and the denitrification of this film upon generation of the Ar gas plasma are the same as in the fifteenth embodiment. Thus, relevant explanations are omitted.

With the foregoing metal film production apparatus, as in the fifteenth embodiment, the barrier metal film can be in a two-layer structure state without becoming thick, and the resulting metal layer can retain adhesion to a thin metal film formed by film formation in the subsequent step. Whereas the TaN layer can prevent diffusion of metal during film formation in the subsequent step. Consequently, the thin metal film (thin Cu film) during film formation in the subsequent step can be formed, with satisfactory adhesion, without diffusion into the substrate 253, so that the Cu wiring process can be stabilized.

The construction of the metal film production apparatus for producing the barrier metal film may employ a device of the type generating a capacitive coupling plasma, or a device of the remote type which generates a plasma in a manner isolated from a film formation chamber.

Next, the second aspect of the present invention will be described. According to the second aspect, the barrier metal film of TaN is subjected to a surface treatment in which this film is reacted in a reducing gas (e.g. hydrogen gas) atmosphere (a hydrogen gas plasma) to remove the nitrogen atoms in the superficial layer of the barrier metal film, thereby decreasing the nitrogen content of the superficial layer relative to the interior of the matrix of the barrier metal film (this treatment will be referred to hereinafter as denitrification). The denitrification brings a state in which a film of the metal (Ta) is substantially formed in the superficial layer of the single-layer barrier metal film. In this manner, a barrier metal film is produced highly efficiently and reliably in a thin film condition, with the diffusion of the metal being prevented and the adhesion to the metal being maintained.

As the reducing gas, a nitrogen gas as well as the hydrogen gas can be applied, or a carbon monoxide gas can also be applied. If the carbon monoxide gas is used, denitrification can be carried out in a carbon monoxide gas atmosphere, without generation of plasma.

The concrete construction of the apparatus according to the second aspect of the invention may be as follows: A source gas containing a halogen (e.g., a chlorine-containing gas) is supplied to the interior of a chamber between a substrate and an etched member of Ta, and an atmosphere within the chamber is converted into a plasma to generate a chlorine gas plasma. The etched member is etched with the chlorine gas plasma to form a precursor comprising the Ta component contained in the etched member and the chlorine gas. Also, a nitrogen-containing gas is excited, and TaN, a metal nitride, is formed upon reaction between the excited nitrogen and the precursor. The resulting TaN is formed as a film on the substrate kept at a low temperature to form a barrier metal film. This process is performed using a barrier metal film production apparatus. After the barrier metal film is produced in this manner, a hydrogen gas plasma (or a nitrogen gas plasma) is generated within the chamber to react radical hydrogen with nitrogen, performing denitrification. That is, the barrier metal film production apparatus shown in FIG. 39 can be applied.

Alternatively, the concrete construction of the apparatus of the second aspect may be as follows: A chlorine gas is supplied into the chamber, and an atmosphere within the chamber is converted into a plasma to generate a chlorine gas plasma. An etched member made of copper (Cu) is etched with the chlorine gas plasma to form a precursor comprising the Cu component contained in the etched member and chlorine inside the chamber. The temperature of the substrate is rendered lower than the temperature of the etched member to form a film of the Cu component of the precursor on the substrate. This process is performed using a metal film forming device. Before the substrate having a barrier metal film of TaN formed thereon is housed in the chamber and the Cu component is formed as a film thereon, a hydrogen gas plasma (or a nitrogen gas plasma) is generated within the chamber to react radical hydrogen with nitrogen, performing denitrification. That is, the metal film production apparatus shown, for example, in FIGS. 29, 34, 37 and 38 can be applied.

Embodiments of the metal film production method and metal film production apparatus according to the second aspect will be described, with the provision of the apparatus in the Cu-CVD 404 (see FIG. 28) being taken as an example.

Figure 40:
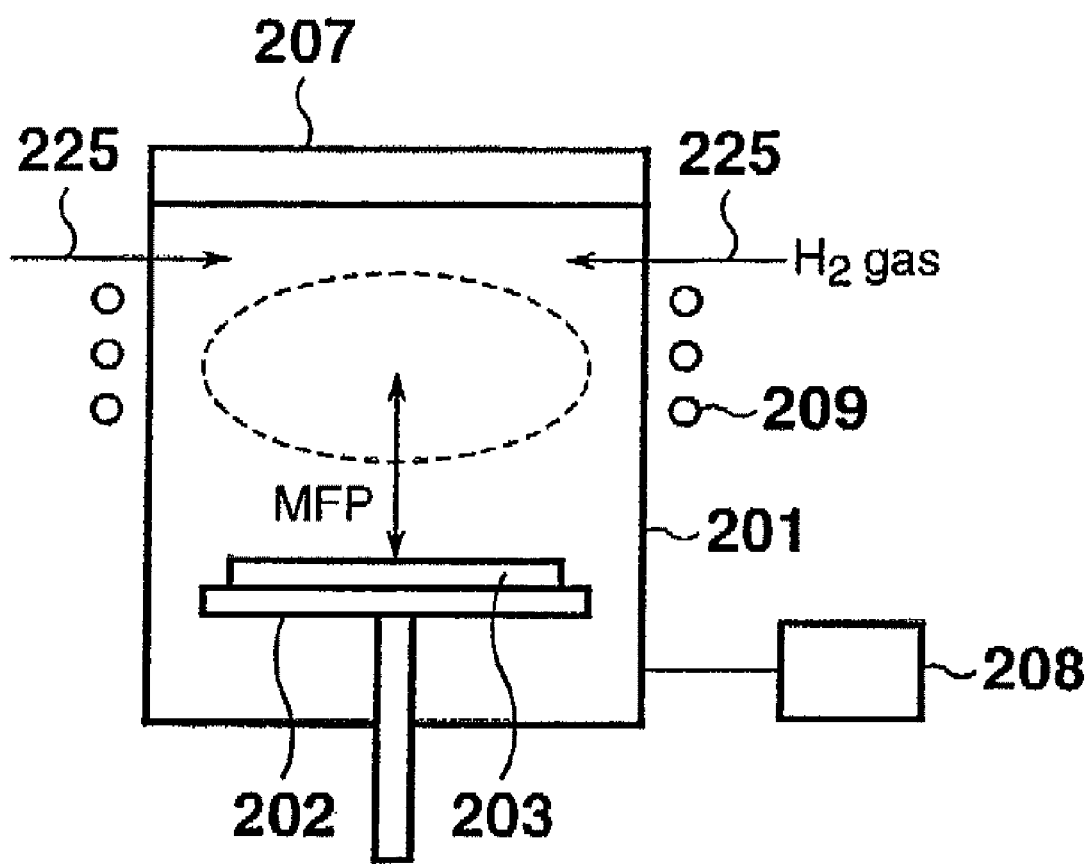
FIG. 40 is a conceptual construction drawing of a metal film production apparatus according to a twentieth embodiment of the present invention.
Figure 41:
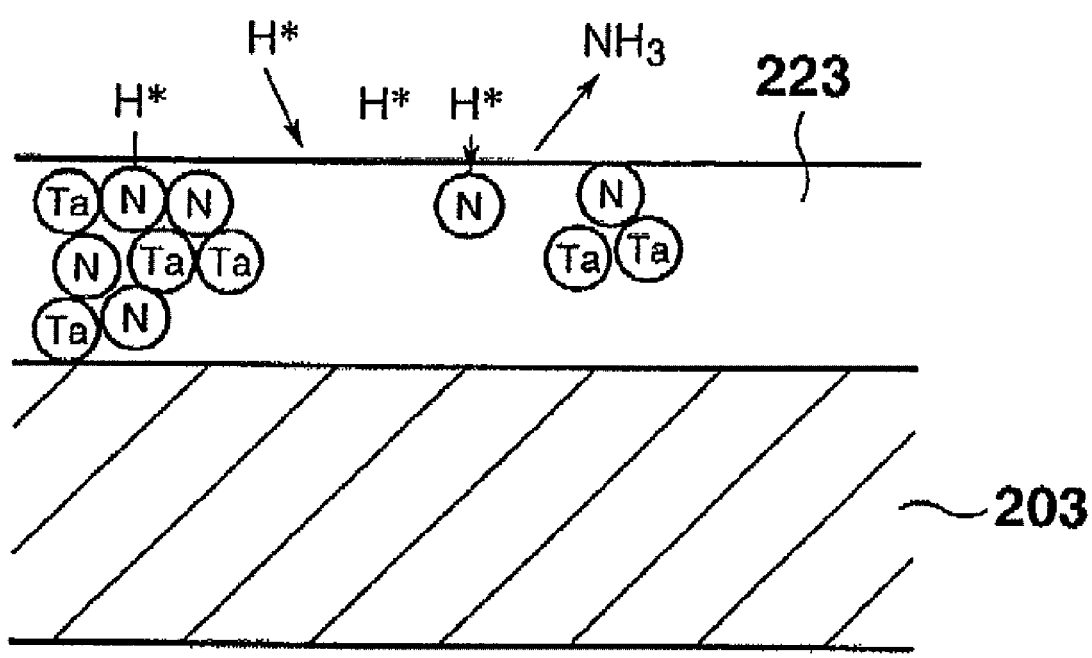
FIG. 41 is a concept view of a barrier metal film in a treatment for denitrification.

FIG. 40 shows the conceptual construction of a metal film production apparatus according to the twentieth embodiment of the present invention. FIG. 41 shows the concept status of the barrier metal film in denitrification. The illustrated metal film production apparatus has the conceptual construction of the metal film production apparatus according to the fifteenth embodiment shown in FIG. 29, in which the gas supplied through the nozzle 21 is different. Thus, the formation of the thin Cu film in the metal film production apparatus is the same, and its explanation is omitted hereinbelow.

As shown in FIG. 40, reducing gas nozzles 225 are provided, as reducing gas supply means, for supplying a hydrogen gas ($H_2$ gas) as a reducing gas, to the interior of a chamber 201 above the surface of a substrate 203. The $H_2$ gas is supplied from the reducing gas nozzles 225, and electromagnetic waves are shot from a plasma antenna 209 into the chamber 201, whereby the $H_2$ gas is ionized to generate an $H_2$ gas plasma (surface treatment means). On the surface of the substrate 203 admitted into the illustrated metal film production apparatus, a barrier metal film 223 of TaN (see FIG. 31) has been formed. Upon generation of the $H_2$ gas plasma, hydrogen radicals H* react with the nitrogen atoms (N) of the TaN in the superficial layer of the substrate 203, forming ammonia $NH_3$, which is exhausted. Thus, the nitrogen atoms (N) in the superficial layer are removed to decrease the nitrogen content of the superficial layer relative to the interior of the matrix of the barrier metal film 223 (denitrification).

The denitrification of the barrier metal film 223 (see FIG. 31) caused by generation of the $H_2$ gas plasma is performed before formation of the thin Cu film 216 explained in the fifteenth embodiment of FIG. 29. That is, when the substrate 203 having the barrier metal film 223 of TaN (see FIG. 31) formed thereon is admitted onto a support platform 202, the $H_2$ gas is supplied from the reducing gas nozzles 225 prior to the formation of the thin Cu film 216 (see FIG. 29). At the same time, electromagnetic waves are shot from the plasma antenna 209 into the chamber 201, whereby the $H_2$ gas plasma is generated.

Upon generation of the $H_2$ gas plasma, hydrogen radicals H* react with the nitrogen atoms (N) of the TaN in the superficial layer of the substrate 203, forming ammonia $NH_3$, which is exhausted. The hydrogen radicals H* do not affect the metal, but react with only the nitrogen atoms (N), thereby forming ammonia $NH_3$.

That is, the reaction

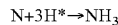

$$N+3H^* \rightarrow NH_3$$

forms ammonia $NH_3$, which is exhausted.

As shown in FIG. 41, the barrier metal film 223 comprises Ta and N in an amorphous state. In this state, hydrogen radicals H* react with N, forming ammonia $NH_3$, which is exhausted. In this manner, the superficial layer of the barrier metal film 223 (for example, up to a half, preferably about a third, of the entire film thickness) is denitrified. As a result, there emerges the barrier metal film 223 of a two-layer structure, a metal layer 223*a* substantially composed of Ta, and a TaN layer 223*b*, as shown in FIG. 33. On this occasion, the entire film thickness of the barrier metal film 223 remains the film thickness constructed by the single layer.

Hydrogen radicals H* have a short life and penetrate narrow sites. Thus, the pressure inside the chamber 201 is lowered to decrease the density, or the temperature of the substrate 203 is controlled, thereby making it possible to increase hydrogen radicals H* (prevent them from colliding with each other), or to control the depth of the metal layer 223*a* composed substantially of Ta (see FIG. 33). Setting of the pressure can be performed by increasing the mean free path (MFP) which is the value of the distance traveled by a hydrogen radical H* before collision. Normally, the distance from the center of the plasma to the substrate 203 depends on the apparatus. To increase the mean free path, control is exercised, with the pressure inside the chamber 201 being lowered. If the apparatus has the support platform 202 movable upward and downward, the support platform 202 is raised, without a fall in the pressure, to bring the substrate 203 close to the center of the plasma, whereby the mean free path can be increased relatively.

With the foregoing metal film production apparatus, the hydrogen gas plasma is generated within the chamber 201 accommodating the substrate 203 having the barrier metal film 223 formed thereon. The hydrogen radicals H* take part in denitrification in which they react with the nitrogen atoms (N), forming ammonia $NH_3$, which is exhausted. Thus, there can appear the barrier metal film 223 with a two-layer structure, i.e., the metal layer 223*a* composed substantially of Ta (see FIG. 33) and the TaN layer 223b (see FIG. 33). Moreover, the entire film thickness can remain the single-layer film thickness. Hence, the barrier metal film 223 can be in a two-layer structure state without becoming thick, and yet the metal layer 223a (see FIG. 33) can retain adhesion to the thin Cu film 216 (see FIG. 29), while the TaN layer 223b (see FIG. 33) can prevent diffusion of Cu. Consequently, the thin Cu film 216 (see FIG. 29) can be formed, with satisfactory adhesion, without diffusion into the substrate 203, so that the Cu wiring process can be stabilized. In addition, denitrification can be carried out with high efficiency.

The hydrogen gas has been taken as an example of the reducing gas for the purpose of explanation. In the case of the metal film production apparatus in which a hydrogen atmosphere is not usable, a nitrogen gas can be used as the reducing gas. In this case, a nitrogen gas plasma is generated, whereupon N* reacts with the nitrogen atoms (N) of the barrier metal film 223. As a result, N+N*→$N_2$, which is exhausted. The use of the nitrogen gas enables denitrification to take place easily, even if a limitation is imposed on the use of the reducing gas.

Alternatively, a carbon monoxide gas can be used as the reducing gas. In this case, no plasma is generated, and in the unchanged atmosphere, CO reacts with the nitrogen atoms (N) of the barrier metal film 223, as in 2N+2CO→2CN+$O_2$, which are exhausted. The use of the carbon monoxide gas enables denitrification to take place, simply by temperature control of the substrate 203 without generation of a plasma. Thus, consumption of power can be decreased.

The twentieth embodiment described above can be applied to the metal film production apparatuses of the sixteenth to eighteenth embodiments shown in FIGS. 34, 37 and 38. It is also applicable to the barrier metal film production apparatus of the nineteenth embodiment shown in FIG. 39. It is also possible to combine the flattening of the surface with $Ar^+$ upon generation of the Ar gas plasma in the fifteenth to nineteenth embodiments with denitrification using the reducing gas plasma. In this case, an Ar gas and a reducing gas may be mixed and supplied into the chamber 1, or an Ar gas and a reducing gas may be supplied sequentially.

Next, the third aspect of the present invention will be described. According to the third aspect, a barrier metal film of TaN is subjected to a treatment for etching the surface and forming nuclei of silicon atoms by use of a plasma of a silicon-containing gas (for example, silane, $SiH_4$, a hydride of silicon). Silicon, which is not a foreign matter, has good adhesion to a metal, and the formation of nuclei of silicon atoms on the surface can increase adhesion between the metal of a barrier metal film and a metal to be formed as a film thereon. By this method, a barrier metal film preventing diffusion of a metal and retaining adhesion to the metal is produced with good efficiency and without deterioration of performance.

As the silicon-containing gas, a disilane ($Si_2H_4$) gas or a trisilane ($Si_2H_8$) can be used in addition to the $SiH_4$ gas. If hydrogen cannot be used, an $SiCl_4$ gas, an $SiH_2Cl_2$ gas or an $SiHCl_3$ gas can be applied. Any such gas may be diluted with a diluent gas and supplied. By controlling the dilution ratio or the flow rate of the gas, or controlling the power of its plasma, it becomes possible to control the depth of etching on the surface or the sizes of the nuclei of silicon atoms.

A concrete apparatus construction according to the third aspect of the invention may be as follows: Using a barrier metal film production apparatus, a source gas containing a halogen (e.g., a chlorine-containing gas) is supplied to the interior of a chamber between a substrate and an etched member of Ta, and an atmosphere within the chamber is converted into a plasma to generate a chlorine gas plasma. The etched member is etched with the chlorine gas plasma to form a precursor comprising the Ta component contained in the etched member and the chlorine gas. Also a nitrogen-containing gas is excited, and TaN, a metal nitride, is formed upon reaction between the excited nitrogen and the precursor. The resulting TaN is formed as a film on the substrate kept at a low temperature to form a barrier metal film. After the barrier metal film is produced in this manner, an $SiH_4$ gas plasma, a gas containing silicon, is generated within the chamber to form crystal grains of Si. That is, a barrier metal film production apparatus shown, for example, in FIG. 39 can be applied.

Alternatively, a concrete apparatus construction according to the third aspect of the invention may be as follows: A chlorine gas is supplied into the chamber, and an atmosphere within the chamber is converted into a plasma to generate a chlorine gas plasma. An etched member made of copper (Cu) is etched with the chlorine gas plasma to form a precursor comprising the Cu component contained in the etched member and chlorine inside the chamber. The temperature of the substrate is rendered lower than the temperature of the etched member to form a film of the Cu component of the precursor on the substrate. This process is performed using a metal film forming device. The substrate having a barrier metal film of TaN formed thereon is housed in the chamber. Before the Cu component is formed as a film thereon, an $SiH_4$ gas plasma, a plasma of a silicon-containing gas, is generated within the chamber to form crystal grains of Si. That is, the metal film production apparatus shown, for example, in FIG. 29, 34, 37 or 38 can be applied.

An embodiment of the metal film production method and metal film production apparatus according to the third aspect will be described, with the provision of the apparatus in the Cu-CVD 404 (see FIG. 28) being taken as an example.

Figure 42:
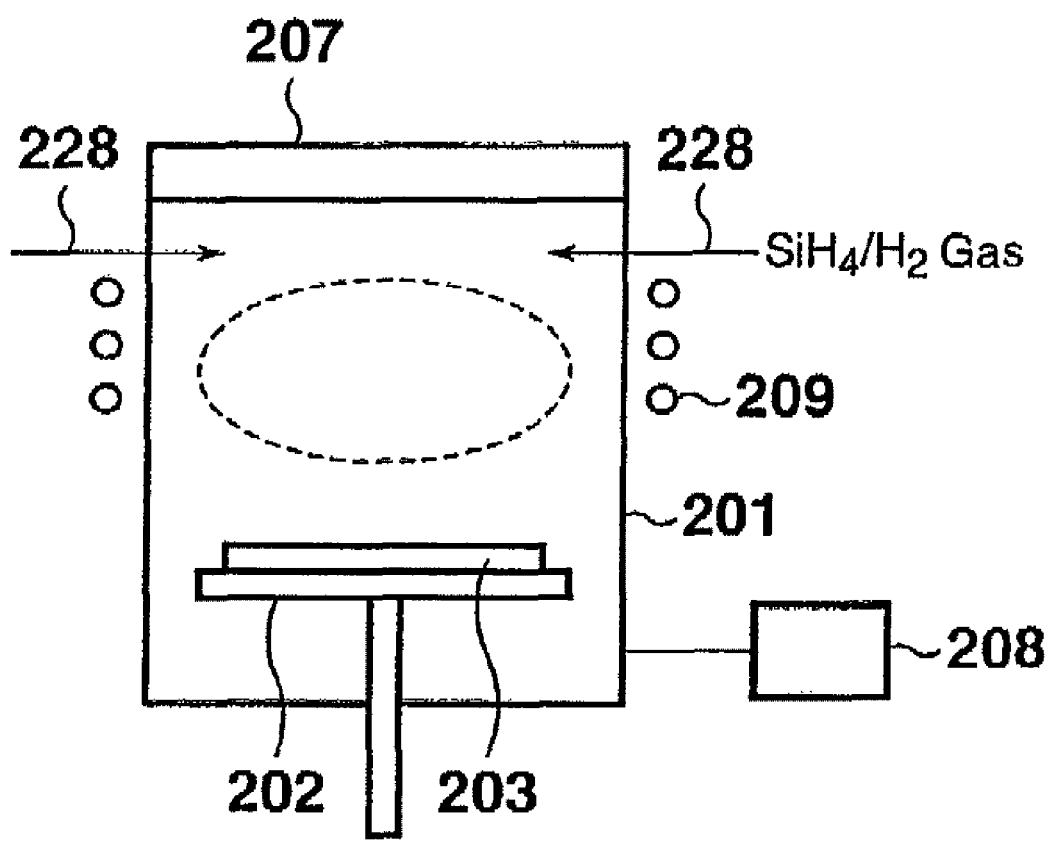
FIG. 42 is a schematic construction drawing of a metal film production apparatus according to a twenty-first embodiment of the present invention.
Figure 43:
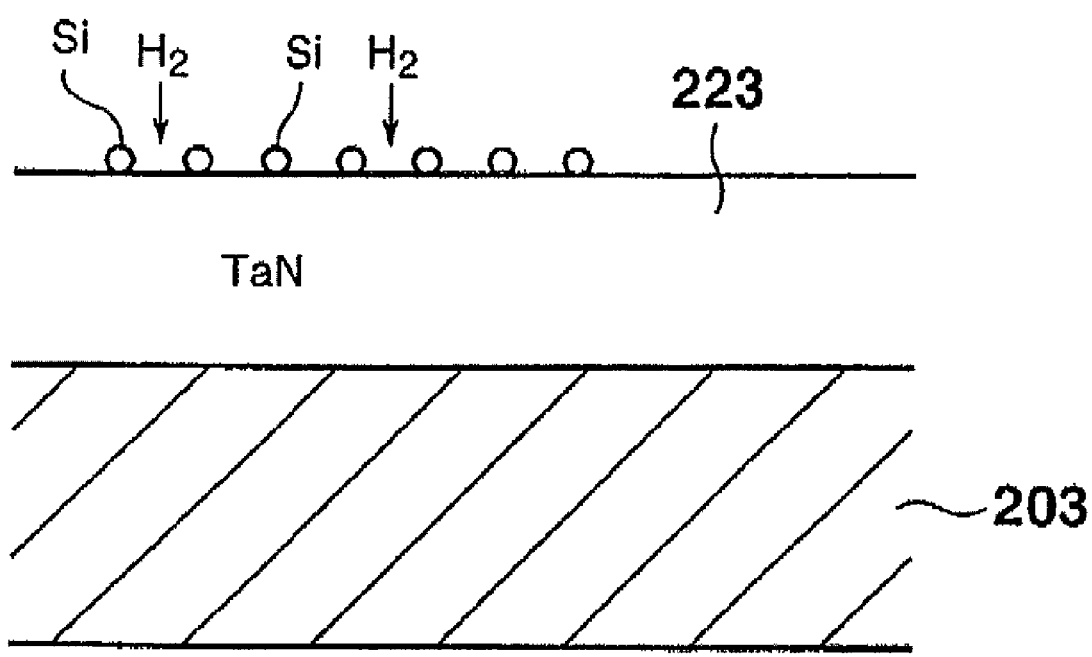
FIG. 43 is a concept view of a barrier metal film in formation of nuclei of Si.

FIG. 42 shows the conceptual construction of a metal film production apparatus according to the twenty-first embodiment of the present invention. FIG. 43 shows the concept status of a barrier metal film in the formation of nuclei of Si. The illustrated metal film production apparatus has the conceptual construction of the metal film production apparatus according to the fifteenth embodiment shown in FIG. 29, in which the gas supplied through the nozzles 21 is made different. Thus, the formation of the thin Cu film in the metal film production apparatus is the same, and its explanation is omitted hereinbelow.

As shown in FIG. 42, silicon-containing gas nozzles 228 are provided, as silicon-containing gas supply means, for supplying a silane gas ($SiH_4$ gas), as a gas containing silicon, to the interior of a chamber 201 above the surface of a substrate 203. An $SiH_4$ gas diluted with hydrogen is supplied through the silicon-containing gas nozzles 228, and electromagnetic waves are shot from a plasma antenna 209 into the chamber 201, whereby the hydrogen-diluted $SiH_4$ gas is ionized to generate an $SiH_4$ gas plasma (surface treatment plasma means). On the surface of the substrate 203 admitted into the illustrated metal film production apparatus, a barrier metal film 223 of TaN (see FIG. 31) has been formed. Generation of the $SiH_4$ gas plasma results in the growth of crystal grains of Si and the appearance of $H_2$. While film formation is proceeding, crystal grains of Si are formed as nuclei on the superficial layer of the substrate 203 by the etching action of $H_2$.

The formation of the nuclei of Si upon generation of the $SiH_4$ gas plasma is performed before formation of the thin Cu film 216 explained in the fifteenth embodiment of FIG. 29. That is, when the substrate 203 having the barrier metal film 223 of TaN (see FIG. 31) formed there on is admitted onto the support platform 202, a hydrogen-diluted SiH$_4$ gas is supplied through the silicon-containing gas nozzles 228 prior to the formation of the thin Cu film 216 (see FIG. 29). Also, electromagnetic waves are shot from the plasma antenna 209 into the chamber 201 to generate an SiH$_4$ gas plasma. The ratio of SiH$_4$ to hydrogen in the hydrogen-diluted SiH$_4$ gas is set, for example, as follows: SiH$_4$/hydrogen≦5/100. As the diluent gas, argon, helium, neon or other diluent gas can be applied in addition to hydrogen.

When the SiH$_4$ gas plasma is generated, the reaction $$SiH_4 \rightarrow Si + H_2$$

proceeds. As a result, while film formation is proceeding, crystal grains of Si are formed as nuclei on the superficial layer of the barrier metal film 223 by the etching action of H$_2$, as shown in FIG. 43. The sizes of the nuclei of Si can be controlled appropriately by controlling the conditions for the plasma, the ratio of hydrogen dilution, the flow rate of the gas, etc. The etching action of H$_2$ removes the nitrogen atoms (N) of the barrier metal film 223, and can bring the state of the barrier metal film 223 having a two-layer structure, a metal layer 223a substantially composed of Ta (see FIG. 33), and a TaN layer 223b (see FIG. 33).

Since the SiH$_4$ gas is diluted with hydrogen, the crystallinity of Si can be improved, and its nuclei are easy to form. Silicon, which is not a foreign matter, has good adhesion to Ta and Cu, and the formation of nuclei of Si on the surface of the barrier metal film 223 can increase adhesion between Ta of the barrier metal film 223 and Cu to be formed as a film thereon. By this method, a barrier metal film 223 preventing diffusion of the metal and retaining adhesion to the metal is produced with good efficiency and without deterioration of performance.

With the above-described metal film production apparatus, the SiH$_4$ gas plasma is generated within the chamber 201 accommodating the substrate 203 having the barrier metal film 223 formed thereon, whereby crystal grains of Si are formed as nuclei on the superficial layer of the barrier metal film 223. Thus, adhesion to Ta and Cu can be improved. Consequently, the barrier metal film 223 can be formed with satisfactory adhesion and anti-diffusion properties without becoming thick, so that the Cu wiring process can be stabilized.

The twenty-first embodiment described above can be applied to the metal film production apparatuses of the sixteenth to eighteenth embodiments shown in FIGS. 34, 37 and 38. It is also applicable to the barrier metal film production apparatus of the nineteenth embodiment shown in FIG. 39. It is also possible to combine the flattening of the surface with Ar$^+$ upon generation of the Ar gas plasma in the fifteenth to nineteenth embodiments with the formation of crystal grains of Si as nuclei on the superficial layer of the barrier metal film 223. In this case, a common nozzle can be used by diluting an SiH$_4$ gas with an Ar gas, and the flattening of the surface and the formation of Si nuclei can be easily switched by controlling the flow rate of the Ar gas.

While the present invention has been described by the foregoing embodiments, it is to be understood that the invention is not limited thereby, but may be varied in many other ways. Such variations are not to be regarded as a departure from the spirit and scope of the invention, and all such modifications as would be obvious to one skilled in the art are intended to be included within the scope of the appended claims.

What is claimed is:

1. A production method for a barrier film, comprising:
accommodating a substrate and a metallic etched member provided at a position opposed to the substrate into a chamber;
exhausting an inner atmosphere of the chamber;
supplying a source gas containing a halogen into the chamber and generating a source gas plasma so that the etched member is etched with the source gas plasma to form a precursor derivated from a metal component contained in the etched member and the source gas;
supplying a gas containing nitrogen into the chamber and generating a nitrogen-containing gas plasma so that a metal nitride is formed upon reaction between nitrogen and the precursor;
maintaining the substrate at a predetermined temperature to deposit the metal nitride as a barrier film on a surface of the substrate; and then
supplying a rare gas to site above the surface of the substrate and generating a rare gas plasma, thereby nitrogen atoms in a superficial layer of the metal nitride film are removed by the rare gas plasma to decrease a nitrogen content of the superficial layer relative to an interior of a matrix of the metal nitride film.

2. The production method of claim 1, further comprising:
supplying an oxygen gas into the chamber immediately before formation of the most superficial layer of the barrier metal film is completed; and
generating an oxygen gas plasma so that an oxide layer is formed on the most superficial layer of the barrier metal film.

3. The production method of claim 1, further comprising:
supplying a hydrogen gas into the chamber;
generating a hydrogen gas plasma so that hydroxyl groups are formed on an oxide layer.

4. The production method of claim 1, wherein the source gas containing the halogen is the source gas containing chlorine.

5. The production method of claim 1, wherein the gas containing nitrogen is a gas containing ammonia.

6. The production method of claim 1, wherein the etched member is made of tantalum, tungsten, titanium or silicon which is a halide-forming metal.

7. A production method for a film, comprising:
accommodating a substrate and a metallic etched member provided at a position opposed to the substrate into a chamber;
exhausting an inner atmosphere of the chamber;
supplying a source gas containing a halogen into the chamber and generating a source gas plasma so that the etched member is etched with the source gas plasma to form a precursor derivated from a metal component contained in the etched member and the source gas;
supplying a gas containing nitrogen into the chamber and generating a nitrogen containing gas plasma so that a metal nitride is formed upon reaction between nitrogen and the precursor;
maintaining the substrate at a predetermined temperature to deposit the metal nitride as a barrier film on a surface of the substrate; and then
supplying a rare gas to a site above the surface of the substrate, generating a rare gas plasma, and exposing the rare gas plasma to a superficial layer of the metal nitride film.

* * * * *